US012777679B2

(12) United States Patent
Kim et al.

(10) Patent No.: US 12,777,679 B2
(45) Date of Patent: Oct. 27, 2026

(54) SEMICONDUCTOR DEVICE

(71) Applicant: Samsung Electronics Co., Ltd., Suwon-si (KR)

(72) Inventors: Jung Taek Kim, Yongin-si (KR); Seok Hoon Kim, Suwon-si (KR); Ryong Ha, Seoul (KR); Pan Kwi Park, Incheon (KR); Dong Suk Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1006 days.

(21) Appl. No.: 17/391,342

(22) Filed: Aug. 2, 2021

(65) Prior Publication Data

US 2022/0181498 A1 Jun. 9, 2022

Related U.S. Application Data

(60) Provisional application No. 63/122,276, filed on Dec. 7, 2020.

(30) Foreign Application Priority Data

Feb. 18, 2021 (KR) ........................ 10-2021-0021748

(51) Int. Cl.
*H10D 30/67* (2025.01)
*H10D 30/00* (2025.01)
(Continued)

(52) U.S. Cl.
CPC ..... *H10D 30/6735* (2025.01); *H10D 30/0191* (2025.01); *H10D 30/031* (2025.01);
(Continued)

(58) Field of Classification Search
CPC .. H10D 62/121; H10D 62/151; H10D 62/235; H10D 62/822; H10D 30/0191;
(Continued)

(56) References Cited

U.S. PATENT DOCUMENTS 10,325,820 B1 6/2019 Seo et al.
10,439,049 B2 10/2019 Basker et al.
(Continued)

FOREIGN PATENT DOCUMENTS

CN 108695256 A 10/2018
CN 108695377 A 10/2018
(Continued)

OTHER PUBLICATIONS

Partial European Search Report, issued from the European Patent Office, in corresponding European Patent Application No. EP21186874, dated Feb. 10, 2022 (7 pages).
(Continued)

*Primary Examiner* — Marcos D. Pizarro
(74) *Attorney, Agent, or Firm* — Muir Patent Law, PLLC

(57) ABSTRACT

There is provided a semiconductor device comprising an active pattern, including a lower pattern extending in a first direction, and a plurality of sheet patterns spaced apart from the lower pattern in a second direction perpendicular to the first direction, a plurality of gate structures on the lower pattern to be spaced apart from each other in the first direction and including a gate electrode and a gate insulating film wrapping the plurality of sheet patterns, a source/drain recess defined between the gate structures adjacent to each other, and a source/drain pattern inside the source/drain recess and including a semiconductor blocking film formed continuously along the source/drain recess, wherein the source/drain recesses include a plurality of width extension regions, and a width of each of the width extension regions in the first direction increases and then decreases, as it goes away from an upper surface of the lower pattern.

16 Claims, 49 Drawing Sheets

(51) Int. Cl.

| | |
|---|---|
| ***H10D 30/01*** | (2025.01) |
| ***H10D 30/43*** | (2025.01) |
| ***H10D 30/62*** | (2025.01) |
| ***H10D 30/69*** | (2025.01) |
| ***H10D 62/10*** | (2025.01) |
| ***H10D 62/13*** | (2025.01) |
| ***H10D 62/17*** | (2025.01) |
| ***H10D 62/822*** | (2025.01) |
| ***H10D 64/23*** | (2025.01) |
| ***H10D 64/27*** | (2025.01) |
| ***H10D 84/01*** | (2026.01) |
| ***H10D 84/03*** | (2025.01) |
| ***H10D 84/83*** | (2025.01) |
| ***H10D 84/85*** | (2025.01) |

(52) U.S. Cl.
CPC ....... *H10D 30/0312* (2025.01); *H10D 30/435* (2025.01); *H10D 30/503* (2025.01); *H10D 30/6219* (2025.01); *H10D 30/6713* (2025.01); *H10D 30/6729* (2025.01); *H10D 30/6757* (2025.01); *H10D 30/797* (2025.01); *H10D 62/121* (2025.01); *H10D 62/151* (2025.01); *H10D 62/235* (2025.01); *H10D 62/822* (2025.01); *H10D 64/2527* (2025.01); *H10D 64/257* (2025.01); *H10D 64/258* (2025.01); *H10D 64/512* (2025.01); *H10D 64/518* (2025.01); *H10D 84/013* (2025.01); *H10D 84/0133* (2025.01); *H10D 84/038* (2025.01); *H10D 84/832* (2025.01); *H10D 84/851* (2025.01); *H10D 62/118* (2025.01)

(58) Field of Classification Search
CPC ............. H10D 30/0312; H10D 30/435; H10D 30/503; H10D 30/6219; H10D 30/6729; H10D 30/6735; H10D 30/797; H10D 64/2527; H10D 64/256; H10D 64/258; H10D 64/512; H10D 64/518; H10D 84/013; H10D 84/0133; H10D 84/038; H10D 84/832; H10D 84/851; H01L 29/0673; H01L 29/0847; H01L 29/1033; H01L 29/165; H01L 29/41766; H01L 29/41775; H01L 29/41791; H01L 29/42392; H01L 29/66439; H01L 29/775; H01L 29/7848; H01L 29/78696; H01L 27/0886
See application file for complete search history.

(56) References Cited

U.S. PATENT DOCUMENTS

| | | | |
|---|---|---|---|
| 10,535,733 B2 | 1/2020 | Cheng et al. | |
| 10,553,679 B2 | 2/2020 | Zhang et al. | |
| 10,714,392 B2 | 7/2020 | Loubet et al. | |
| 10,720,530 B2 | 7/2020 | Ma et al. | |
| 2016/0027875 A1 | 1/2016 | Kim et al. | |
| 2018/0294331 A1 | 10/2018 | Cho et al. | |
| 2019/0221483 A1 | 7/2019 | Mulfinger et al. | |
| 2020/0126798 A1* | 4/2020 | Lin | H01L 29/78618 |
| 2020/0168716 A1* | 5/2020 | Peng | H01L 29/78696 |
| 2020/0219975 A1 | 7/2020 | Bomberger et al. | |
| 2020/0220015 A1 | 7/2020 | Jang et al. | |
| 2020/0220018 A1 | 7/2020 | Jang et al. | |
| 2020/0266060 A1 | 8/2020 | Cheng et al. | |
| 2020/0381546 A1* | 12/2020 | Cho | H01L 29/66439 |
| 2020/0381562 A1 | 12/2020 | Jung et al. | |
| 2020/0381564 A1* | 12/2020 | Kang | H01L 21/823418 |

FOREIGN PATENT DOCUMENTS

| | | |
|---|---|---|
| CN | 109494158 A | 3/2019 |
| CN | 112002757 A | 11/2020 |
| CN | 114220858 A | 3/2022 |
| KR | 10-2017-0101729 A | 9/2017 |
| KR | 10-2020-0136230 A | 12/2020 |
| KR | 20210032845 A | 3/2021 |
| TW | 201914018 A | 4/2019 |

OTHER PUBLICATIONS

Office Action, issued from the European Patent Office, in corresponding European Patent Application No. EP21186874, dated Mar. 4, 2022 (12 pages).

* cited by examiner

SEMICONDUCTOR DEVICE

This application claims priority under 35 U.S.C. § 119 from U.S. Provisional Application No. 63/122,276, filed on Dec. 7, 2020, in the United States Patent and Trademark Office, and from Korean Patent Application No. 10-2021-0021748 filed on Feb. 18, 2021, in the Korean Intellectual Property Office, the entire disclosures of both of which are incorporated by reference herein.

BACKGROUND

1. Field of the Invention

The present invention relates to a semiconductor device, and more specifically, to a semiconductor device including an MBCFET™ (Multi-Bridge Channel Field Effect Transistor).

2. Description of the Related Art

As one scaling technology for increasing the density of semiconductor devices, a multi gate transistor in which a multi-channel active pattern (or a silicon body) having a fin or nanowire shape is formed on a substrate and a gate is formed on a surface of the multi-channel active pattern has been proposed.

Since such a multi-gate transistor utilizes three-dimensional channels, scaling is easily performed. Further, a current control capability may be improved, even when not increasing a gate length of the multi-gate transistor. Furthermore, a SCE (short channel effect) in which potential of a channel region is influenced by a drain voltage may be effectively suppressed.

SUMMARY

Aspects of the present invention provide a semiconductor device capable of improving element performance and reliability.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present disclosure, there is provided a semiconductor device comprising an active pattern including a lower pattern extending in a first direction, and a plurality of sheet patterns spaced apart from the lower pattern in a second direction perpendicular to the first direction, a plurality of gate structures disposed on the lower pattern to be spaced apart from each other in the first direction and including a gate electrode and a gate insulating film, the gate electrode and the gate insulating film wrapping the plurality of sheet patterns, a source/drain recess defined between gate structures adjacent to each other, and a source/drain pattern disposed inside the source/drain recess, and includes a semiconductor blocking film formed continuously along the source/drain recess, wherein the source/drain recess includes a plurality of width extension regions, and wherein a width of each of the width extension regions in the first direction increases and then decreases, as it goes away from an upper surface of the lower pattern.

According to an aspect of the present disclosure, there is provided a semiconductor device comprising an active pattern including a lower pattern extending in a first direction, and a plurality of sheet patterns spaced apart from the lower pattern in a second direction perpendicular to the first direction, a plurality of gate structures disposed on the lower pattern to be spaced apart from each other in the first direction and including a gate electrode and a gate insulating film, the gate electrode and the gate insulating film wrapping the plurality of sheet patterns, a source/drain recess defined between adjacent gate structures of the plurality of gate structures, and a source/drain pattern disposed inside the source/drain recess, and includes a semiconductor blocking film formed continuously along the source/drain recess, wherein the semiconductor blocking film includes a liner portion extending along a side wall of the source/drain recess and a bottom surface of the source/drain recess, and wherein a protruding portion protruding from the liner portion in the first direction, and the protruding portion of the semiconductor blocking film is in contact with the gate insulating film.

According to an aspect of the present disclosure, there is provided a semiconductor device comprising an active pattern including a lower pattern extending in a first direction, and a plurality of sheet patterns spaced apart from the lower pattern in a second direction perpendicular to the first direction, a plurality of gate structures disposed on the lower pattern to be spaced apart from each other in the first direction and includes a gate electrode and a gate insulating film, the gate electrode and the gate insulating film wrapping the plurality of sheet patterns, a source/drain recess defined between adjacent gate structures of the plurality of gate structures, and a source/drain pattern disposed inside the source/drain recess, and including a semiconductor blocking film which is in contact with the gate insulating film, the lower pattern, and the sheet patterns, wherein the gate structure includes an inter-gate structure including the gate electrode and the gate insulating film disposed between the lower pattern and the plurality of sheet patterns, and between adjacent sheet patterns of the plurality of sheet patterns, and wherein each of the plurality of sheet patterns protrudes in the first direction from side wall of the inter-gate structure adjacent in the second direction.

BRIEF DESCRIPTION OF THE DRAWINGS

The above and other aspects and features of the present invention will become more apparent by describing in detail exemplary embodiments thereof referring to the attached drawings, in which like numerals refer to like elements throughout. In the drawings.

DETAILED DESCRIPTION OF THE EMBODIMENTS

A semiconductor device according to some embodiments may include a tunneling transistor (tunneling FET), a three-dimensional (3D) transistor, or a transistor based on two-dimensional material (e.g., 2D material based FETs), and a heterostructure thereof. Further, the semiconductor device according to some embodiments may also include a bipolar junction transistor, a laterally diffused metal oxide semiconductor (LDMOS), or the like.

The semiconductor device according to some embodiments will be described referring to FIGS. 1 to 9.

Figure 1:
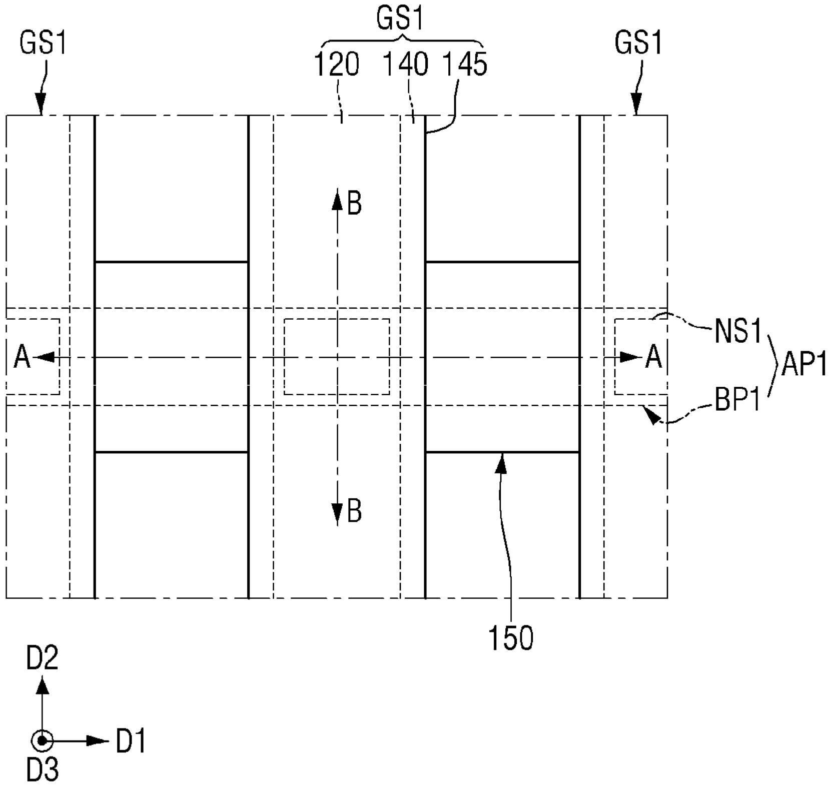
FIG. 1 is an exemplary plan view for explaining a semiconductor device, according to some embodiments.
Figure 2:
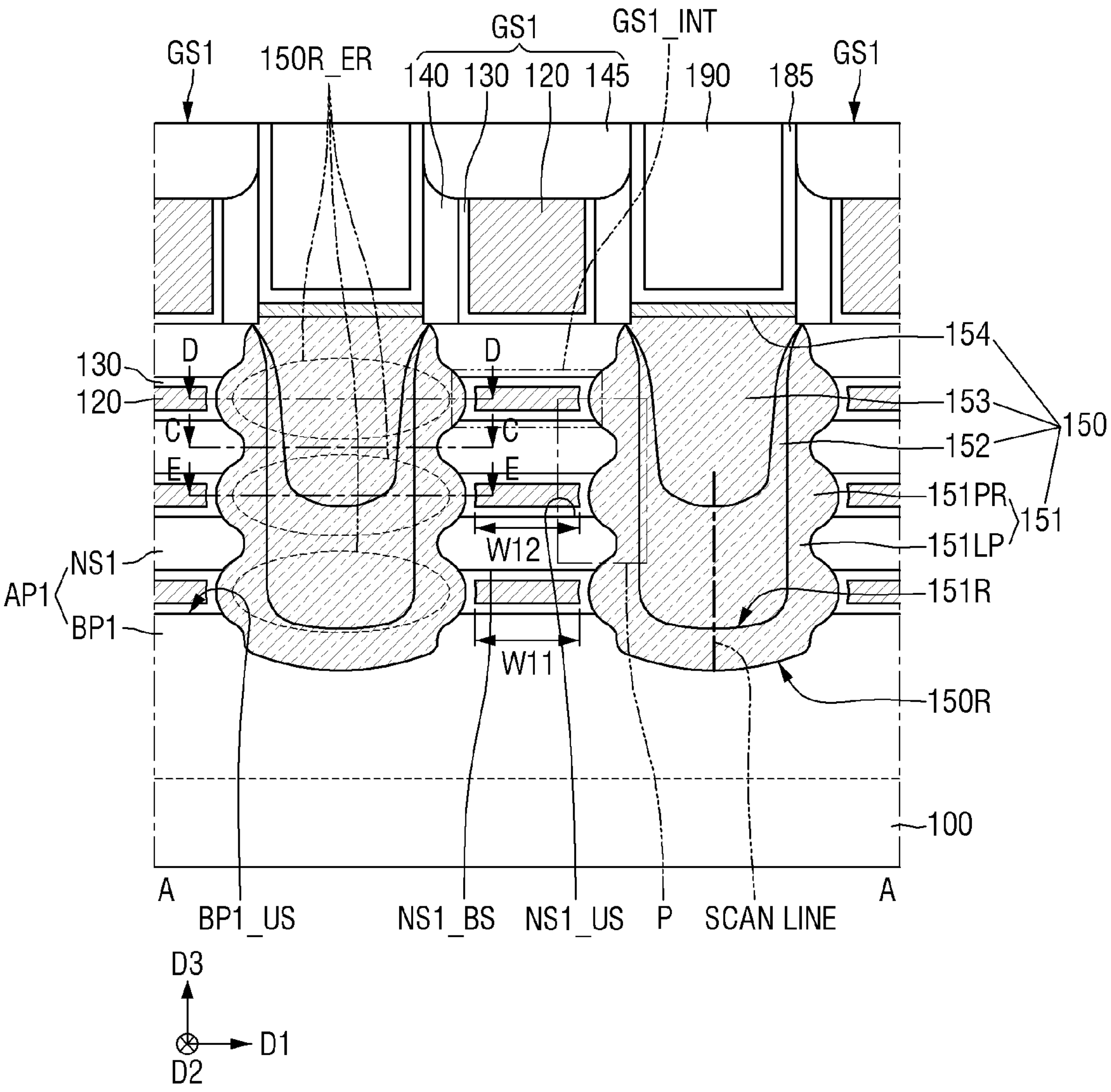
FIGS. 2 and 3 are cross-sectional views taken along A-A and B-B of FIG. 1.
Figure 3:
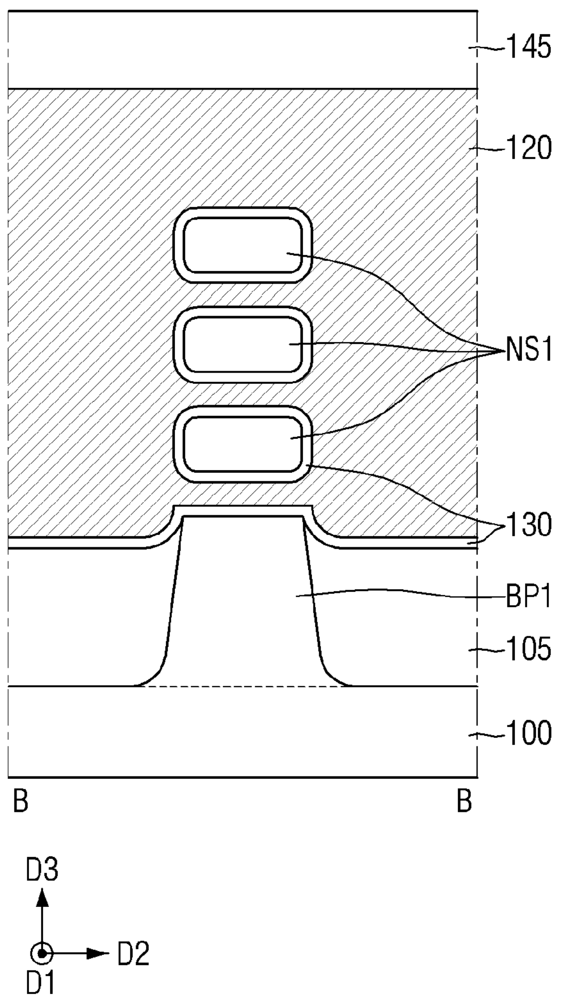
Figure 4:
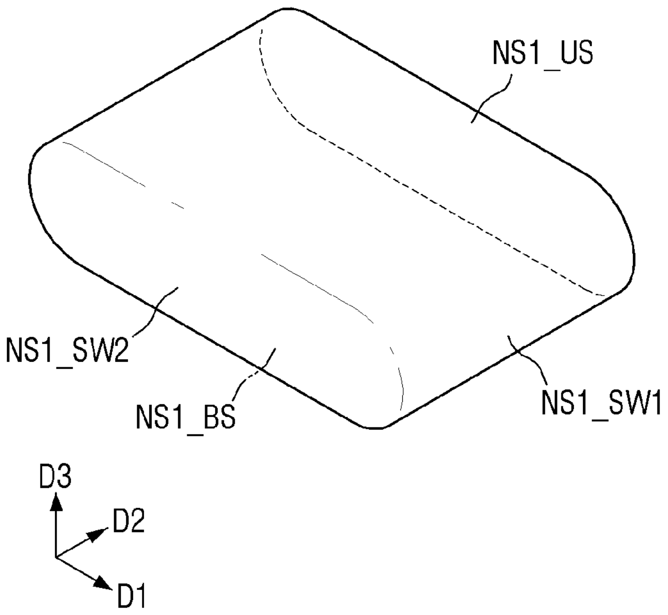
FIG. 4 is a diagram for explaining a shape of a first sheet pattern of FIG. 2.
Figure 5:
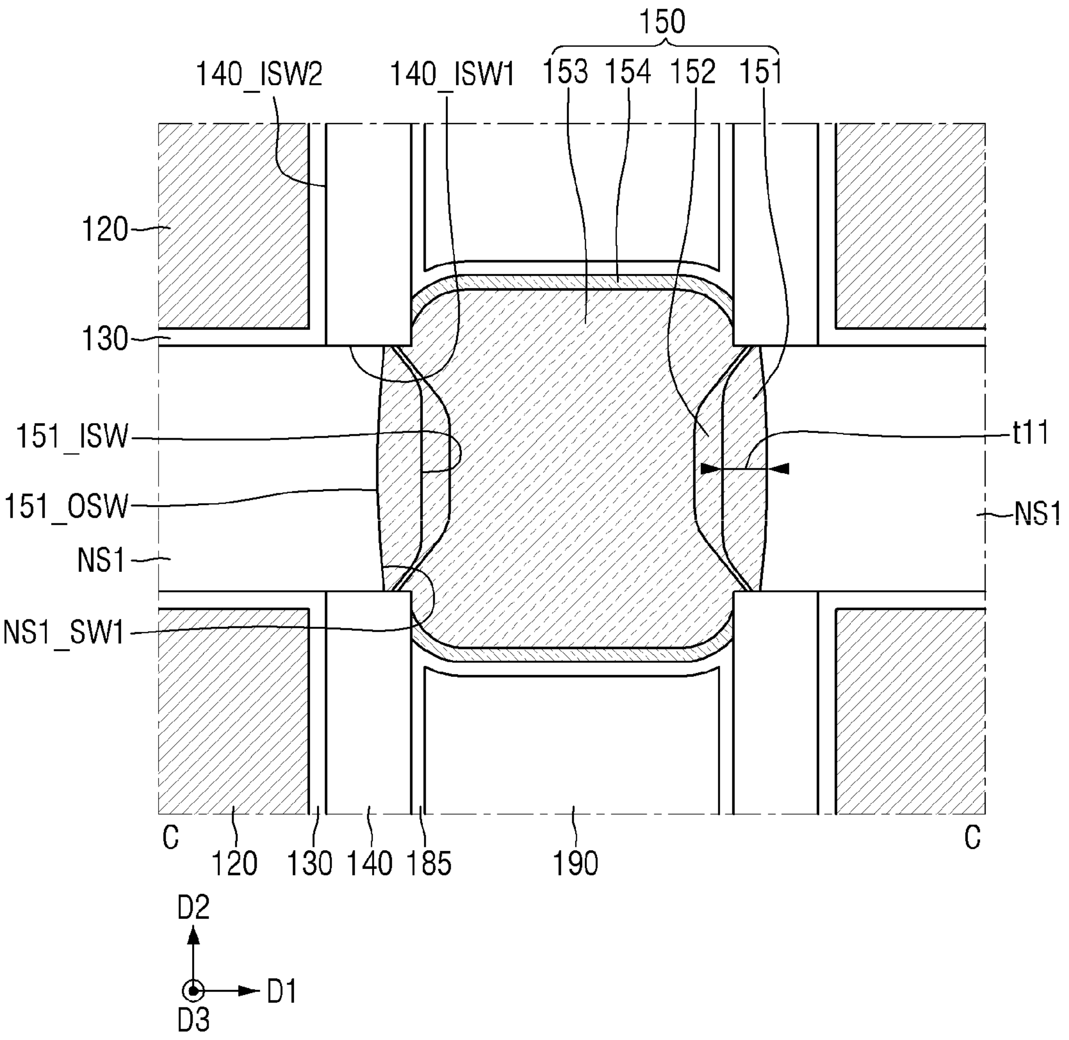
FIGS. 5 to 7 are cross-sectional views taken along C-C, D-D and E-E of FIG. 7.
Figure 6:
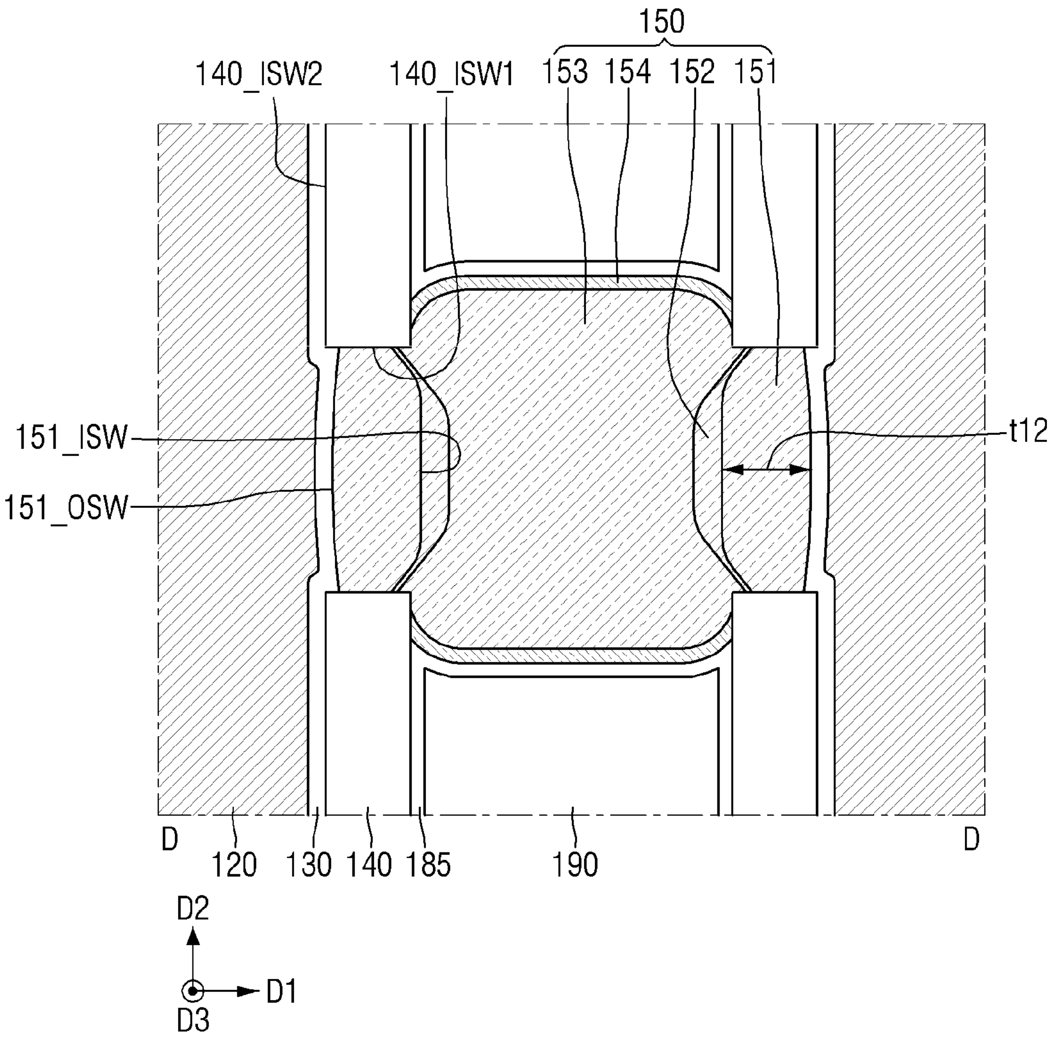
Figure 7:
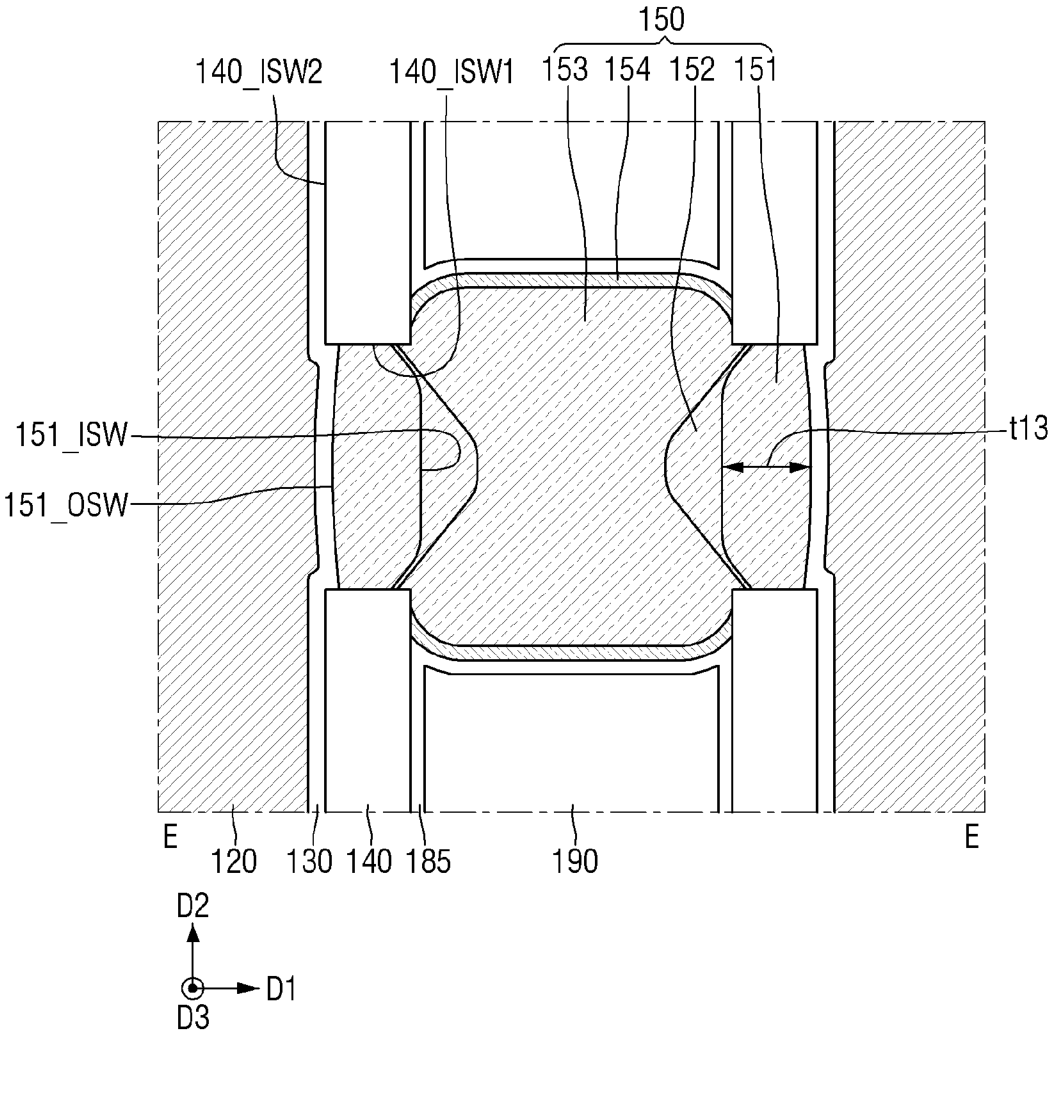
Figure 8:
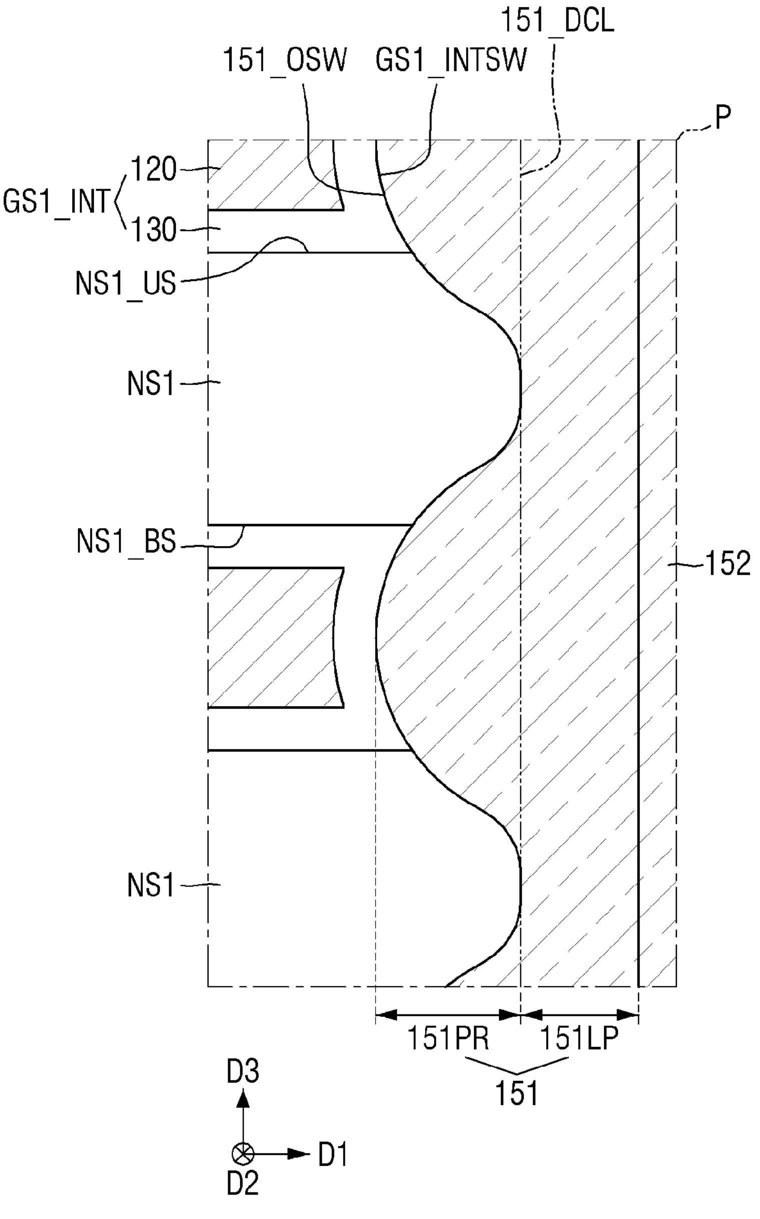
FIG. 8 is an enlarged view of a region P of FIG. 2.
Figure 9:
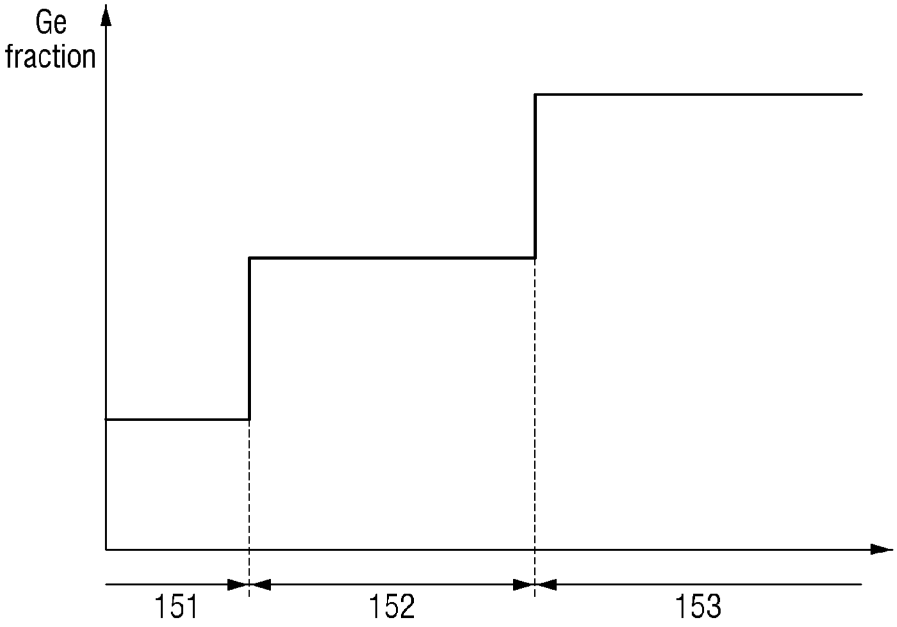
FIG. 9 is a diagram schematically showing a fraction of germanium along a SCAN LINE of FIG. 2.

FIG. 1 is an exemplary plan view for explaining a semiconductor device according to some embodiments. FIGS. 2 and 3 are cross-sectional views taken along A-A and B-B of FIG. 1. FIG. 4 is a diagram for explaining a shape of a first sheet pattern of FIG. 2. FIGS. 5 to 7 are cross-sectional views taken along lines C-C, D-D, and E-E of FIG. 2. FIG. 8 is an enlarged view of a region P of FIG. 2. FIG. 9 is a diagram schematically showing a fraction of germanium along a SCAN LINE of FIG. 2.

For reference, FIG. 2 is a diagram taken along a first lower pattern BP1 extending in a first direction D1. FIGS. 5 to 7 are diagrams shown on a D1-D2 plane, respectively. Since FIG. 1 is a plan view showing a D1-D2 plane, FIGS. 5 to 7 may be cross-sectional views shown from a planar viewpoint. FIG. 5 is a view taken along a first sheet pattern NS1. FIGS. 6 and 7 may each be diagrams in which a portion between the first sheet patterns NS1 adjacent to each other in a third direction D3 is cut.

Further, FIG. 1 briefly shows certain features in a plan view, except for a first gate insulating film 130, an etching stop film 185, and an interlayer insulating film 190, which are illustrated in cross-sectional views.

Referring to FIGS. 1 to 9, the semiconductor device according to some embodiments may include a first active pattern AP', a plurality of first gate structures GS1, and a first source/drain pattern 150.

A substrate 100 may be bulk silicon or an SOI (silicon-on-insulator). In contrast, the substrate 100 may be a silicon substrate or may include, but is not limited to, other materials, for example, silicon germanium, SGOI (silicon germanium on insulator), indium antimonide, lead tellurium compounds, indium arsenic, indium phosphide, gallium arsenide, or gallium antimonide.

A first active pattern AP1 may be disposed on the substrate 100. The first active pattern AP1 may extend long in the first direction D1. For example, the first active pattern AP1 may be disposed in a region in which a PMOS is formed.

The first active pattern AP1 may be a multi-channel active pattern. The first active pattern AP1 may include a first lower pattern BP1 and a plurality of first sheet patterns NS1. The first lower pattern BP1 may protrude from the substrate 100. The first lower pattern BP1 may extend lengthwise in the first direction D1. An item, layer, or portion of an item or layer described as extending "lengthwise" in a particular direction has a length in the particular direction and a width perpendicular to that direction, where the length is greater than the width.

A plurality of first sheet patterns NS1 may be disposed on an upper surface BP1_US of the first lower pattern BP1. The plurality of first sheet patterns NS1 may be spaced apart from the first lower pattern BP1 in the third direction D3. Each first sheet pattern NS1 may be spaced apart from each other in the third direction D3.

Each first sheet pattern NS1 may include an upper surface NS1_US and a lower surface NS_BS. The upper surface NS1_US of the first sheet pattern NS1 is a surface that is opposite to the lower surface NS1_BS of the first sheet pattern NS1 in the third direction D3. Each first sheet pattern NS1 may include first side walls NS1_SW1 opposite to each other in the first direction D1, and second side walls NS1_SW2 opposite to each other in the second direction D2.

The upper surface NS1_US of the first sheet pattern NS1 and the lower surface NS1_BS of the first sheet pattern NS1 may be connected by the first side walls NS1_SW1 of the first sheet pattern NS1 and the second side walls NS1_SW2 of the first sheet pattern NS1. The first side walls NS1_SW1 of the first sheet pattern NS1 are connected to and in contact with a first source/drain pattern 150 to be described below. The first side walls NS1_SW1 of the first sheet pattern NS1 may include an end of the first sheet pattern NS1. For example, the end of the first sheet pattern NS1 may be located at the center line between the upper surface NS1_US of the first sheet pattern NS1 and the lower surface NS1_BS of the first sheet pattern NS1. The term "contact," as used herein, refers to a direct connection (i.e., touching) unless the context indicates otherwise.

In FIGS. 2 and 4, although the first side walls NS1_SW1 of the first sheet pattern NS1 are shown as curved surfaces protruding toward the first source/drain pattern 150, the embodiment is not limited thereto. Unlike that shown, in some embodiments, the first side walls NS1_SW1 of the first sheet pattern NS1 may be a combination of a curved surface portion and a flat surface portion.

In FIG. 5, although the first side walls NS1_SW1 of the first sheet pattern NS1 are shown as curved surfaces, the embodiment is not limited thereto. As an example, unlike that shown, the first side walls NS1_SW1 of the first sheet pattern NS1 may include a flat surface portion and a curved surface portion. As another example, the first side walls NS1_SW1 of the first sheet pattern NS1 may be generally flat surfaces.

That is, the shapes of the first side walls NS1_SW1 may differ depending on which direction the first sheet pattern NS1 is cut.

Further, in FIGS. 3 and 4, although the second side walls NS1_SW2 of the first sheet pattern NS1 are shown as a combination of a curved surface portion and a flat surface portion, the embodiment is not limited thereto. For example, the second side walls NS1_SW2 of the first sheet pattern NS1 may be an overall curved surface or an overall flat surface.

The third direction D3 may be a direction that intersects the first direction D1 and the second direction D2. For example, the third direction D3 may be a thickness direction of the substrate 100. The first direction D1 may be a direction that intersects the second direction D2. The first direction D1, the second direction D2, and the third direction D3 may be perpendicular to one another.

Although three first sheet patterns NS1 are shown as being disposed in the third direction D3, this is only for convenience of explanation, and the embodiment is not limited thereto.

The first lower pattern BP1 may be formed by etching a part of the substrate 100, and may include an epitaxial layer that is grown from the substrate 100. The first lower pattern BP1 may include silicon and germanium, which is an elemental semiconductor material. Further, the first lower pattern BP1 may include a compound semiconductor, and may include, for example, a group IV-IV compound semiconductor or a group III-V compound semiconductor.

The group IV-IV compound semiconductor may include, for example, a binary compound or a ternary compound including at least two or more of carbon (C), silicon (Si), germanium (Ge), and tin (Sn), or a compound obtained by doping these elements with a group IV element.

The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

The first sheet pattern NS1 may include either silicon or germanium, which is an elemental semiconductor material, a group IV-IV compound semiconductor, or a group III-V compound semiconductor. Each first sheet pattern NS1 may include the same material as the first lower pattern BP1, or may include a material different from the first lower pattern BP1.

In the semiconductor device according to some embodiments, the first lower pattern BP1 may be a silicon lower pattern including silicon, and the first sheet pattern NS1 may be a silicon sheet pattern including silicon.

A width of the first sheet pattern NS1 in the second direction D2 may be increased or decreased in proportion to a width of the first lower pattern BP1 in the second direction D2. As an example, although the width in the second direction D2 of the first sheet patterns NS1 stacked in the third direction D3 is shown as being the same, this is only for convenience of explanation, and the embodiment is not limited thereto. Unlike that shown, in some embodiments, the width in the second direction D2 of the first sheet patterns NS1 stacked in the third direction D3 may decrease, as it goes away from the first lower pattern BP1. For example, the width in the second direction D2 of the first sheet patterns NS1 stacked in the third direction D3 may decrease as the distance from first lower pattern BP1 increases in the third direction D3.

The field insulating film 105 may be formed on the substrate 100. The field insulating film 105 may be disposed on the side walls of the first lower pattern BP1, contacting the side walls of the first lower pattern BP1. The field insulating film 105 is not disposed on the upper surface BP1_US of the first lower pattern BP1.

As an example, the field insulating film 105 may completely cover the side walls of the first lower pattern BP1. Unlike that shown, in some embodiments, the field insulating film 105 may cover a part of the side walls of the first lower pattern BP1. In such a case, a part of the first lower pattern BP1 may protrude in the third direction D3 from the upper surface of the field insulating film 105. In some embodiments, the upper surface BP1_US of the first lower pattern BP1 may be at a higher vertical level than an upper surface of the field insulating film 105.

Each first sheet pattern NS1 is disposed to be at a higher vertical level than the upper surface of the field insulating film 105. The field insulating film 105 may include, for example, an oxide film, a nitride film, an oxynitride film, or a combination film thereof. Although the field insulating film 105 is shown as a single film, this is only for convenience of explanation, and the embodiment is not limited thereto.

A plurality of first gate structures GS1 may be disposed on the substrate 100. Each first gate structure GS1 may extend lengthwise in the second direction D2. The first gate structures GS1 may be placed to be spaced apart in the first direction D1. The first gate structures GS1 may be adjacent to each other in the first direction D1.

The first gate structure GS1 may be disposed on the first active pattern AP1. The first gate structure GS1 may intersect the first active pattern AP1. The first gate structure GS1 may intersect the first lower pattern BP1. The first gate structure GS1 may wrap each first sheet pattern NS1. For example, the first gate structure GS1 may surround each first sheet pattern NS1. The first gate structure GS1 may include, for example, a first gate electrode 120, a first gate insulating film 130, a first gate spacer 140, and a first gate capping pattern 145.

The first gate structure GS1 may include a first inter-gate structure GS1_INT disposed between the first sheet patterns NS1 adjacent to each other in the third direction D3, and between the first lower pattern BP1 and the first sheet pattern NS1. The first inter-gate structure GS1_INT may include a first gate electrode 120 and a first gate insulating film 130 disposed between adjacent first sheet patterns NS1, and between the first lower pattern BP1 and the first sheet pattern NS1.

The first gate electrode 120 may be formed on the first lower pattern BP1. The first gate electrode 120 may intersect the first lower pattern BP1. The first gate electrode 120 may wrap the first sheet pattern NS1.

A part of the first gate electrode 120 may be disposed between the adjacent first sheet patterns NS1, and between the first lower pattern BP1 and the first sheet pattern NS1. When the first sheet pattern NS1 includes a first_1 sheet pattern and a first_2 sheet pattern that are adjacent to each other in the third direction D3, a part of the first gate electrode 120 may be disposed between the upper surface NS1_US of the first_1 sheet pattern and the lower surface NS1_BS of the first_2 sheet pattern that face each other. Further, a part of the first gate electrode 120 may be disposed between the upper surface BS1_US of the first lower pattern BP1 and the lower surface NS1_BS of the first lowermost sheet pattern of the first sheet patterns NS1. The first_1 sheet pattern may be the first lowermost sheet pattern of the first sheet patterns NS1, or the first_1 sheet pattern may not be the first lowermost sheet pattern NS1.

The first gate electrode 120 disposed between the first lower pattern BP1 and the first sheet pattern NS1 may have a first width W11 in the first direction D1. The first gate electrode 120 disposed between the first sheet patterns NS1 adjacent to each other in the third direction D3 may have a second width W12 in the first direction D1. In the semiconductor device according to some embodiments, the first width W11 may be the same as the second width W12. The first width W11 and the second width W12 are the widths of the first gate electrode 120 included in the first inter-gate structure GS1_INT.

The first gate electrode 120 may include at least one of a metal, a metal alloy, a conductive metal nitride, a metal silicide, a doped semiconductor material, a conductive metal oxide, and a conductive metal oxynitride. The first gate electrode 120 may include, but is not limited to, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The conductive metal oxides and the conductive metal oxynitrides may include, but are not limited to, an oxidized form of the materials described above.

The first gate electrode 120 may be disposed on both sides of a first source/drain pattern 150 to be described below. The first gate structure GS1 may be disposed on both sides of the first source/drain pattern 150 in the first direction D1.

As an example, both the first gate electrodes 120 disposed on either side of the first source/drain pattern 150 may be a normal gate electrode used as a gate of a transistor. As another example, the first gate electrode 120 disposed on one side of the first source/drain pattern 150 is used as a gate of a transistor, but the first gate electrode 120 disposed on the other side of the first source/drain pattern 150 may be a dummy gate electrode.

The first gate insulating film 130 may extend along the upper surface of the field insulating film 105 and the upper surface BP1_US of the first lower pattern BP1. The first gate insulating film 130 may wrap a plurality of first sheet patterns NS1. For example, the first gate insulating film 130 may surround the plurality of first sheet patterns NS1. The first gate insulating film 130 may be disposed along the periphery of the first sheet pattern NS1. The first gate electrode 120 is disposed on the first gate insulating film 130. The first gate insulating film 130 is disposed between the first gate electrode 120 and the first sheet pattern NS1. The first gate insulating film 130 may contact lower and side surface of the first gate electrode 120.

A part of the first gate insulating film 130 may be disposed between the first sheet patterns NS1 adjacent to each other in the third direction D3, and between the first lower pattern BP1 and the first sheet pattern NS1. When the first sheet pattern NS1 includes the first_1 sheet pattern and the first_2 sheet pattern that are adjacent to each other, a part of the first gate insulating film 130 may extend along the upper surface NS1_US of the first_1 sheet pattern and the lower surface NS1_BS of the first_2 sheet pattern that face each other.

The first gate insulating film 130 may include a silicon oxide, silicon oxynitride, silicon nitride, or a high dielectric constant material having a higher dielectric constant than the silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the first gate insulating film 130 is shown as a single film, this is only for convenience of explanation, and the embodiment is not limited thereto. The first gate insulating film 130 may include a plurality of films. The first gate insulating film 130 includes an interfacial layer disposed between the first sheet pattern NS1 and the first gate electrode 120, and a high dielectric constant insulating film.

The semiconductor device according to some embodiments may include an NC (Negative Capacitance) FET that uses a negative capacitor. For example, the first gate insulating film 130 may include a ferroelectric material film having ferroelectric properties, and a paraelectric material film having paraelectric properties.

The ferroelectric material film may have a negative capacitance, and the paraelectric material film may have a positive capacitance. For example, if two or more capacitors are connected in series and the capacitance of each capacitor has a positive value, the overall capacitances decrease from the capacitance of each of the individual capacitors. On the other hand, if at least one of the capacitances of two or more capacitors connected in series has a negative value, the overall capacitances may be greater than an absolute value of each of the individual capacitances, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance values, a transistor including the ferroelectric material film may have a subthreshold swing (SS) of less than 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopants included in the ferroelectric material film may differ, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum.

Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric properties. The paraelectric material film may include at least one of, for example, a silicon oxide and a metal oxide having a high dielectric constant. The metal oxide included in the paraelectric material film may include, but is not limited to, for example, at least one of hafnium oxide, zirconium oxide, and aluminum oxide.

The ferroelectric material film and the paraelectric material film may include the same material. The ferroelectric material film has ferroelectric properties, but the paraelectric material film may not have ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. The thickness of the ferroelectric material film may be, but is not limited to, for example, 0.5 to 10 nm. Since each ferroelectric material may have a different critical thickness that exhibits the ferroelectric properties, the thickness of the ferroelectric material film may vary, depending on the ferroelectric material.

As an example, the first gate insulating film 130 may include one ferroelectric material film. As another example, the first gate insulating film 130 may include a plurality of ferroelectric material films spaced apart from each other. The first gate insulating film 130 may have a stacked film structure in which a plurality of ferroelectric material films and a plurality of paraelectric material films are alternately stacked.

The first gate spacer 140 may be disposed on the side walls of the first gate electrode 120. The first gate spacer 140 is not disposed between the first lower pattern BP1 and the first sheet pattern NS1, and not disposed between the first sheet patterns NS1 adjacent to each other in the third direction D3.

The first gate spacer 140 may include an inner side wall 140_ISW2 and a connecting side wall 140_ISW1. The inner side wall 140_ISW2 of the first gate spacer 140 faces the side wall of the first gate electrode 120 extending in the second direction D2. The inner side wall 140_ISW2 of the first gate spacer 140 may extend in the second direction D2. The inner side wall 140_ISW2 of the first gate spacer 140 may be a surface that is opposite to an outer side wall facing the interlayer insulating film 190. The connecting side wall 140_ISW1 of the first gate spacer 140 is connected to the inner side wall 140_ISW2 of the first gate spacer 140. The connecting side wall 140_ISW1 of the first gate spacer 140 may extend in the first direction D1.

The first gate insulating film 130 may extend along the inner side wall 140_ISW2 of the first gate spacer 140. The first gate insulating film 130 may be in contact with the inner side wall 140_ISW2 of the first gate spacer 140.

The first gate spacer 140 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and a combination thereof. Although the first gate spacer 140 is shown as a single film, this is only for convenience of explanation, and the embodiment is not limited thereto.

The first gate capping pattern 145 may be disposed on the first gate electrode 120 and the first gate spacer 140. For example, the first gate capping pattern 145 may contact upper surfaces of the first gate electrode 120 and the first gate spacer 140. The upper surface of the first gate capping pattern 145 may be disposed on the same plane as the upper surface of the interlayer insulating film 190. Unlike that shown, in some embodiments, the first gate capping pattern 145 may be disposed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and a combination thereof. The first gate capping pattern 145 may include a material having an etching selectivity with respect to the interlayer insulating film 190.

The first source/drain pattern 150 may be formed on the first active pattern AP1. The first source/drain pattern 150 may be disposed on the first lower pattern BP1. The first source/drain pattern 150 is connected to the first sheet pattern NS1. The first source/drain pattern 150 is in contact with the first sheet pattern NS1.

The first source/drain pattern 150 may be disposed on the side surface of the first gate structure GS1. The first source/drain pattern 150 may be disposed between the first gate structures GS1 adjacent to each other in the first direction D1. For example, the first source/drain pattern 150 may be disposed on either side of the first gate structure GS1. Unlike that shown, in some embodiments, the first source/drain pattern 150 may be disposed on one side of the first gate structure GS1, but may not be disposed on the other side of the first gate structure GS1.

The first source/drain pattern 150 may be included in a source/drain of a transistor that uses the first sheet pattern NS1 as a channel region.

The first source/drain pattern 150 may be disposed inside a first source/drain recess 150R. The first source/drain recess 150R extends in the third direction D3. The first source/drain recess 150R may be defined between the first gate structures GS1 adjacent to each other in the first direction D1.

A bottom surface of the first source/drain recess 150R may be defined by the first lower pattern BP1. The side walls of the first source/drain recess 150R may be defined by the first sheet pattern NS1 and the first inter-gate structure GS1_INT. The side wall (GS1_INTSW of FIG. 8) of the first inter-gate structure GS1_INT may define a part of the side wall of the first source/drain recess 150R. Referring to FIGS. 5 to 7, the first source/drain recess 150R includes the connecting side wall 140_ISW1 of the first gate spacer. The side wall GS1_INTSW of the first inter-gate structure GS1_INT may be defined by the first gate insulating film 130 of the first inter-gate structure GS1_INT.

Between the first nanosheet NS1 disposed at the lowermost part and the first lower pattern BP1, the boundary between the first gate insulating film 130 and the first lower pattern BP1 may be an upper surface BP1_US of the first lower pattern BP1. In other words, the upper surface BP1_US of the first lower pattern BP1 may be a boundary between the first inter-gate structure GS1_INT disposed at the lowermost part and the first lower pattern BP1. The bottom surface of the first source/drain recess 150R is lower than the upper surface BP1_US of the first lower pattern BP1.

The side wall of the first source/drain recess 150R may have a wavy form. The first source/drain recess 150R may include a plurality of width extension regions 150R_ER. The width extension region 150R_ER of each first source/drain recess 150R may be defined above the upper surface BP1_US of the first lower pattern BP1.

The width extension region 150R_ER of the first source/drain recess 150R may be defined between the first nanosheets NS1 adjacent to each other in the third direction D3. The width extension region 150R_ER of the first source/drain recess 150R may be defined between the first lower pattern BP1 and the first nanosheet NS1. The width extension region 150R_ER of the first source/drain recess 150R may extend between the first nanosheets NS1 adjacent to each other in the third direction D3. In other words, the width extension region 150R_ER of the first source/drain recess 150R is disposed between the first nanosheets NS1, and may be defined between the first inter-gate structures GS1_INT adjacent to each other in the first direction D1. The width extension region 150R_ER of the first source/drain recess 150R is disposed between the first nanosheet NS1 and the first lower pattern BP1, and may be defined between the first inter-gate structures GS1_INT adjacent to each other in the first direction D1.

The width extension region 150R_ER of each first source/drain recess 150R may include a portion having an increased width in the first direction D1, and a portion having a decreased width in the first direction D1, as it goes away from the upper surface BP1_US of the first lower pattern BP1. For example, the width of the width extension region 150R_ER of the first source/drain recess 150R may increase and then decrease, as a distance from the upper surface BP1_US of the first lower pattern BP1 increases in the third direction D3.

In the width extension region 150R_ER of each first source/drain recess 150R, regions in which the width of the width extension region 150R_ER of the first source/drain recess 150R is maximum may be located between the first nanosheet NS1 and the first lower pattern BP1, or between the first nanosheets NS1 adjacent to each other in the third direction D3. For example, the width extension region 150R_ER may have a maximum width in a region between the first nanosheet NS1 and the first lower pattern BP1 and/or in a region between the first nanosheets NS1 adjacent to each other in the third direction D3.

The first source/drain pattern 150 may be in contact with the first sheet pattern NS1 and the first lower pattern BP1. A part of the first source/drain pattern 150 may be in contact with the connecting side wall 140_ISW1 of the first gate spacer. Since the first gate spacer 140 is not disposed between the first inter-gate structures GS1_INT between the adjacent first nanosheets NS1, the first gate insulating film 130 is in contact with the first source/drain pattern 150.

The first source/drain pattern 150 may include a first semiconductor blocking film 151, a first lower semiconductor filling film 152, a first upper semiconductor filling film 153, and a first semiconductor capping film 154. The first lower semiconductor filling film 152 and the first upper semiconductor filling film 153 may be included in the first semiconductor filling film.

The first semiconductor blocking film 151 may be formed continuously along the first source/drain recess 150R. The first semiconductor blocking film 151 may be formed continuously along the side walls of the first source/drain recess 150R and the bottom surface of the first source/drain recess 150R. The first semiconductor blocking film 151 formed along the first source/drain recess 150R defined by the first sheet pattern NS1 is directly connected to the first semiconductor blocking film 151 formed along the first source/drain recess 150R defined by the first inter-gate structure GS1_INT.

The first semiconductor blocking film 151 is in contact with the first gate insulating film 130, the first sheet pattern NS1 and the first lower pattern BP1.

The first semiconductor blocking film 151 may include an outer side wall 151_OSW and an inner side wall 151_ISW. The outer side wall 151_OSW of the first semiconductor blocking film 151 is in contact with the first gate insulating film 130, the first sheet pattern NS1, and the first lower pattern BP1. The outer side wall 151_OSW of the first semiconductor blocking film 151 is directly connected to the first side wall NS1_SW1 of the first sheet pattern NS1. The outer side wall 151_OSW of the first semiconductor blocking film 151 is in contact with the side wall (e.g., side wall GS1_INTSW of FIG. 8) of the first inter-gate structure GS1_INT. The outer side wall 151_OSW of the first semiconductor blocking film 151 may show the profile of the first source/drain recess 150R.

The inner side wall 151_ISW of the first semiconductor blocking film 151 may be a surface that is opposite to the outer side wall 151_OSW of the first semiconductor blocking film 151. The inner side wall 151_ISW of the first semiconductor blocking film 151 may define a first liner recess 151R. For example, the first liner recess 151R may include a portion in which the width in the first direction D1 is kept constant, as a distance from the upper surface BP1_US of the first lower pattern BP1 increases in the third direction D3. Unlike that shown, in some embodiments, the width of the first liner recess 151R in the first direction D1 may increase, as it goes away from the upper surface BP1_US of the first lower pattern BP1.

In FIGS. 5 to 7, the first semiconductor blocking film 151 may include a portion in which the width in the second direction D2 decreases, as it goes away from the outer side wall 151_OSW of the first semiconductor blocking film 151. For example, the first semiconductor blocking film 151 may include the portion in which the width in the second direction D2 decreases as the distance from the outer side wall 151_OSW of the first semiconductor blocking film 151 increases in the third direction D3. The inner side wall 151_ISW of the first semiconductor blocking film 151 may include a facet portion and a connecting portion. The facet portion of the inner side wall 151_ISW of the first semiconductor blocking film 151 may extend from the connecting side wall 140_ISW1 of the first gate spacer 140. The facet portion of the inner side wall 151_ISW of the first semiconductor blocking film 151 may form an acute angle with the connecting side wall 140_ISW1 of the first gate spacer 140. The connection portion of the inner side wall 151_ISW of the first semiconductor blocking film 151 may extend in the second direction D2. The connecting portion of the inner side wall 151_ISW of the first semiconductor blocking film 151 may include a curved surface portion.

The first semiconductor blocking film 151 may include a liner portion 151LP and a protruding portion 151PR. The liner portion 151LP of the first semiconductor blocking film 151 may extend along the side wall of the first source/drain recess 150R and the bottom surface of the first source/drain recess 150R. The first liner recess 151R may be defined by the liner portion 151LP of the first semiconductor blocking film 151.

The protruding portion 151PR of the first semiconductor blocking film 151 may protrude from the liner portion 151LP of the first semiconductor blocking film 151 in the first direction D1. The protruding portion 151PR of the first semiconductor blocking film 151 protrudes from the liner portion 151LP of the first semiconductor blocking film 151 that extends along the side wall of the first source/drain recess 150R.

In FIGS. 2 and 8, the protruding portion 151PR of the first semiconductor blocking film 151 may be divided from the liner portion 151LP of the first semiconductor blocking film 151, on the basis of a divided connection line 151_DCL that connects the ends of the first nanosheets NS1 arranged in the third direction D3. For example, the liner portion 151LP of the first semiconductor blocking film 151 extending along the side wall of the first source/drain recess 150R may be divided from the protruding portion 151PR of the first semiconductor blocking film 151, on the basis of the divided connection line 151_DCL.

The protruding portion 151PR of the first semiconductor blocking film 151 may protrude from the liner portion 151LP of the first semiconductor blocking film 151 toward the first inter-gate structure GS1_INT. The protruding portion 151PR of the first semiconductor blocking film 151 may protrude toward the first gate electrode 120 of the first inter-gate structure GS1_INT. The protruding portion 151PR of the first semiconductor blocking film 151 may be in contact with the first gate insulating film 130 of the first inter-gate structure GS1_INT.

In other words, the first sheet pattern NS1 protrudes in the first direction D1 from the side wall GS1_INTSW of the first inter-gate structures GS1_INT adjacent in the third direction D3. The first sheet pattern NS1 protrudes from the side wall GS1_INTSW of the first inter-gate structure GS1_INT toward the first semiconductor blocking film 151.

In the semiconductor device according to some embodiments, the thickness of the protruding portion 151PR of the first semiconductor blocking film 151 in the third direction D3 may decrease toward the first gate electrode 120 of the first inter-gate structure GS1_INT.

In FIGS. 2 and 8, the outer side wall 151_OSW of the first semiconductor blocking film 151 which forms the boundary with the first gate insulating film 130 of the first inter-gate structure GS1_INT is convex toward the first gate electrode 120 of the first inter-gate structure GS1_INT.

For example, the first gate insulating film 130 may be formed with a uniform thickness along the boundary between the protruding portion 151PR of the first semiconductor blocking film 151 and the first gate electrode 120.

In FIGS. 5 to 7, a thickness t11 in the first direction D1 of the first semiconductor blocking film 151 which is in contact with the first side wall NS1_SW1 of the first sheet pattern NS1 is smaller than thicknesses t12 and t13 in the first direction D1 of the first semiconductor blocking film 151 which is in contact with the first gate insulating film 130 of the first inter-gate structure GS1_INT.

Further, the portion which is in contact with the first gate insulating film 130 is the protruding portion 151PR of the first semiconductor blocking film 151. That is, in FIGS. 6 and 7, the respective thicknesses t12 and t13 of the first semiconductor blocking film 151, which are in contact with the connecting side wall 140_ISW1 of the first gate spacer, are greater than the thickness t11 of the first semiconductor blocking film 151 which is in contact with the connecting side wall 140_ISW1 of the first gate spacer 140 in FIG. 5.

Since the protruding portion 151PR of the first semiconductor blocking film 151 is disposed to overlap the first inter-gate structure GS1_INT in the first direction D1, the first semiconductor blocking film 151 may prevent the etching solution from penetrating through the vicinity of the connecting side wall 140_ISW1 of the first gate spacer 140. As a result, the first semiconductor blocking film 151 may prevent the first lower semiconductor filling film 152 and the first upper semiconductor filling film 153 from being etched by the etching solution.

The first semiconductor blocking film 151 may include, for example, silicon-germanium. The first semiconductor blocking film 151 may include a silicon-germanium film. The first semiconductor blocking film 151 may include doped p-type impurities. For example, the p-type impurities may be, but are not limited to, boron (B).

The first lower semiconductor filling film 152 and the first upper semiconductor filling film 153 may fill the first liner recess 151R.

The first lower semiconductor filling film 152 may be disposed on the first semiconductor blocking film 151. The first lower semiconductor filling film 152 may be formed along the first liner recess 151R.

The first lower semiconductor filling film 152 may be disposed on the inner side wall 151_ISW of the first semiconductor blocking film 151. For example, the first lower semiconductor filling film 152 may be in contact with the first semiconductor blocking film 151.

The first lower semiconductor filling film 152 may cover at least a part of the inner side wall 151_ISW of the first semiconductor blocking film 151. For example, the first lower semiconductor filling film 152 may completely cover the inner side wall 151_ISW of the first semiconductor blocking film 151. The first lower semiconductor filling film 152 may cover the facet portion of the inner side wall 151_ISW of the first semiconductor blocking film 151, and the connecting portion of the inner side wall 151_ISW of the first semiconductor blocking film 151. The first lower semiconductor filling film 152 may be in contact with the connecting side wall 140_ISW1 of the first gate spacer 140.

Unlike that shown, in some embodiments, the first lower semiconductor filling film 152 may not be in contact with the connecting side wall 140_ISW1 of the first gate spacer. In such a case, the first lower semiconductor filling film 152 does not cover at least a part of the facet portion of the inner side wall 151_ISW of the first semiconductor blocking film 151.

The first upper semiconductor filling film 153 is disposed on the first lower semiconductor filling film 152. The first upper semiconductor filling film 153 may be in contact with the first lower semiconductor filling film 152. In FIG. 2, the upper surface of the first upper semiconductor filling film 153 may protrude upward from the upper surface NS1_US of the first sheet pattern NS1 disposed at the uppermost part. For example, the upper surface of the first upper semiconductor filling film 153 may be at a higher vertical level than the upper surface NS1_US of the uppermost one of the first sheet patterns NS1.

The first lower semiconductor filling film 152 and the first upper semiconductor filling film 153 may include, for example, silicon-germanium. The first lower semiconductor filling film 152 and the first upper semiconductor filling film 153 may each include a silicon-germanium film. The first lower semiconductor filling film 152 and the first upper semiconductor filling film 153 may each include doped p-type impurities.

The first semiconductor capping film 154 is disposed on the first upper semiconductor filling film 153. The first semiconductor capping film 154 may be in contact with the first upper semiconductor filling film 153.

As an example, the first semiconductor capping film 154 may include silicon. The first semiconductor capping film 154 may include a silicon film. As another example, the first semiconductor capping film 154 may include silicon-germanium. When the first semiconductor capping film 154 includes silicon-germanium, although a fraction of germanium of the first semiconductor capping film 154 may be smaller than a fraction of germanium of the first semiconductor blocking film 151, the embodiment is not limited thereto. Although the first semiconductor capping film 154 may include, but is not limited to, doped p-type impurities.

Unlike that shown, in some embodiments, the first source/drain pattern 150 may not include the first semiconductor capping film 154.

In FIG. 9, the fraction of germanium of the first semiconductor blocking film 151 is smaller than the fraction of germanium of the first semiconductor filling films 152 and 153. The fraction of germanium of the first lower semiconductor filling film 152 is smaller than the fraction of germanium of the first upper semiconductor filling film 153 and greater than the fraction of germanium of the first semiconductor blocking film 151.

The etching stop film 185 may be disposed on the side wall of the first gate structure GS1, the upper surface of the first source/drain pattern 150, and the side wall of the first source/drain pattern 150. Although not shown, the etching stop film 185 may be disposed on the upper surface of the field insulating film 105.

The etching stop film 185 may include a material having an etching selectivity with respect to an interlayer insulating film 190 to be described later. The etching stop film 185 may include, for example, at least one of silicon nitride (SiN), silicon oxynitride (SiON), silicon oxycarbonitride (SiOCN), silicon boronitride (SiBN), silicon oxyboronitride (SiOBN), silicon oxycarbide (SiOC), and combinations thereof.

The interlayer insulating film 190 may be disposed on the etching stop film 185. The interlayer insulating film 190 may be disposed on the first source/drain pattern 150. The interlayer insulating film 190 may not cover the upper surface of the first gate capping pattern 145. For example, the upper surface of the interlayer insulating film 190 may be disposed on the same plane as the upper surface of the first gate capping pattern 145. For example, the upper surfaces of the interlayer insulating film 190 and the first gate capping pattern 145 may be coplanar with one another.

The interlayer insulating film 190 may include, for example, at least one of silicon oxide, silicon nitride, silicon oxynitride, and a low dielectric constant material. The low dielectric constant material may include, but is not limited to, for example, for example, Fluorinated TetraEthylOrthoSilicate (FTEOS), Hydrogen SilsesQuioxane (HSQ), BisbenzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica, or combinations thereof.

Figure 10:
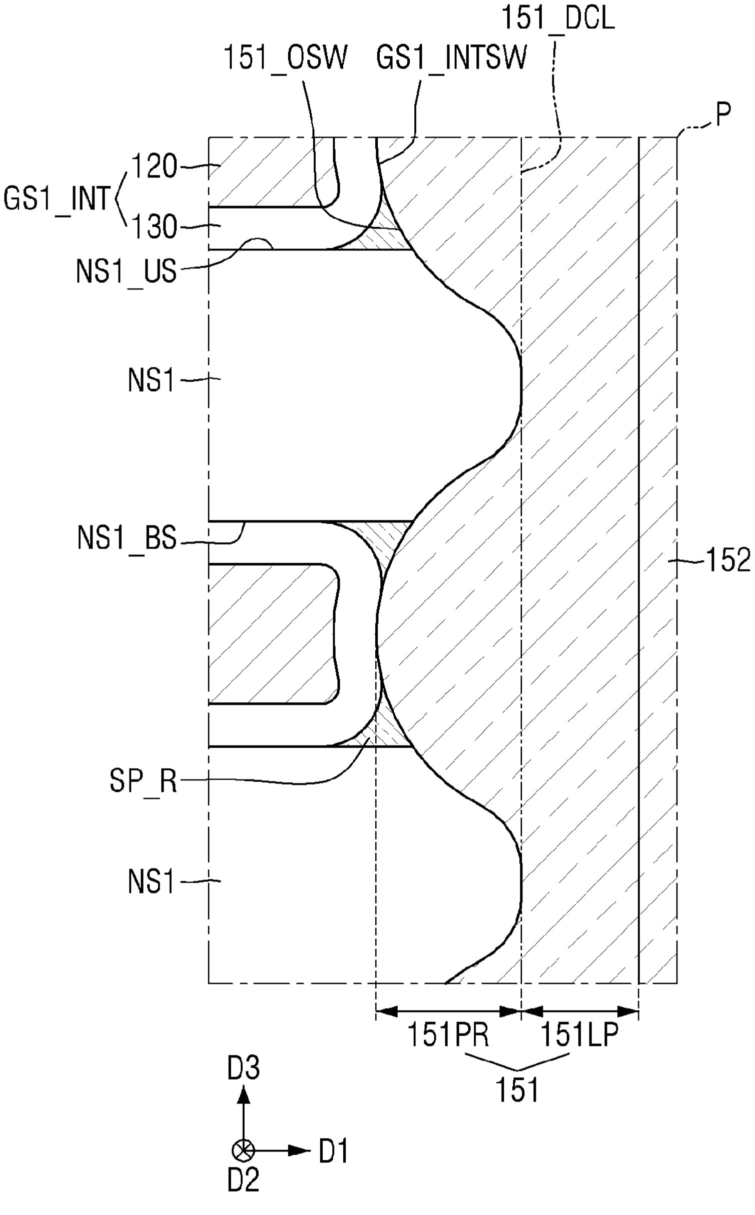
FIGS. 10 and 11 are diagrams for explaining a semiconductor device according to some embodiments.
Figure 11:
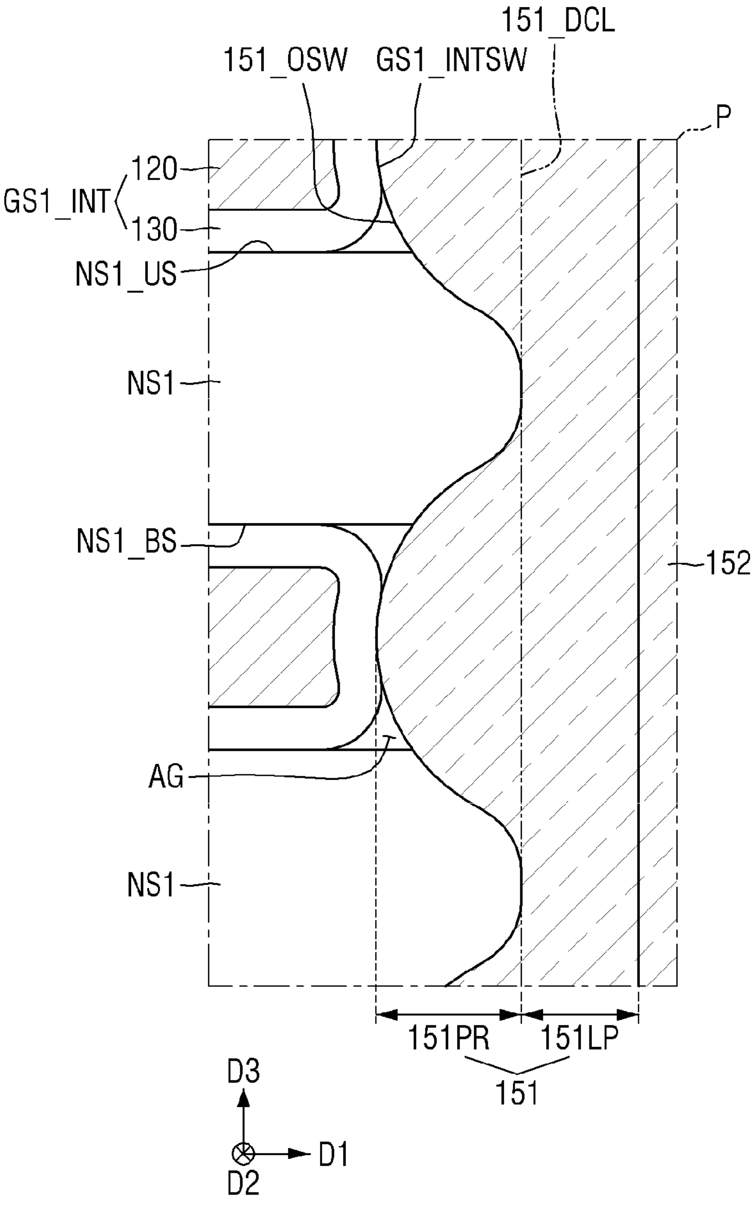

FIGS. 10 and 11 are diagrams for explaining a semiconductor device according to some embodiments, respectively. For convenience of explanation, different points from those described using FIGS. 1 to 9 will be mainly described. For reference, FIGS. 10 and 11 are enlarged views of a region P of FIG. 2.

Referring to FIG. 10, the semiconductor device according to some embodiments may further include a semiconductor residue pattern SP_R disposed between the first inter-gate structure GS1_INT and the first semiconductor blocking film 151.

The semiconductor residue pattern SP_R may be disposed between the protruding portion 151PR of the first semiconductor blocking film 151 and the first gate insulating film 130 of the first inter-gate structure GS1_INT. The semiconductor residue pattern SP_R may be in contact with the first sheet pattern NS1. The semiconductor residue pattern SP_R may be in contact with the outer side wall 151_OSW of the first semiconductor blocking film 151 and the side wall GS1_INTSW of the first inter-gate structure GS1_INT.

The semiconductor residue pattern SP_R may include, for example, silicon-germanium. The fraction of germanium of the semiconductor residue pattern SP_R is greater than the fraction of germanium of the first semiconductor blocking film 151. The semiconductor residue pattern SP_R may be a reside which remains after the sacrificial pattern (e.g., sacrificial pattern SC_L of FIG. 48) is removed.

Referring to FIG. 11, the semiconductor device according to some embodiments may further include an air gap AG disposed between the first inter-gate structure GS1_INT and the first semiconductor blocking film 151.

The air gap AG may be disposed between the protruding portion 151PR of the first semiconductor blocking film 151 and the first gate insulating film 130 of the first inter-gate structure GS1_INT. The air gap AG may be defined between the protruding portion 151PR of the first semiconductor blocking film 151, the first inter-gate structure GS1_INT, and the first sheet pattern NS1.

Although not shown, the semiconductor residue pattern SP_R or the air gap AG described above may be disposed near the connecting side wall 140_ISW1 of the first gate spacers 140 of FIGS. 6 and 7.

Figure 12:
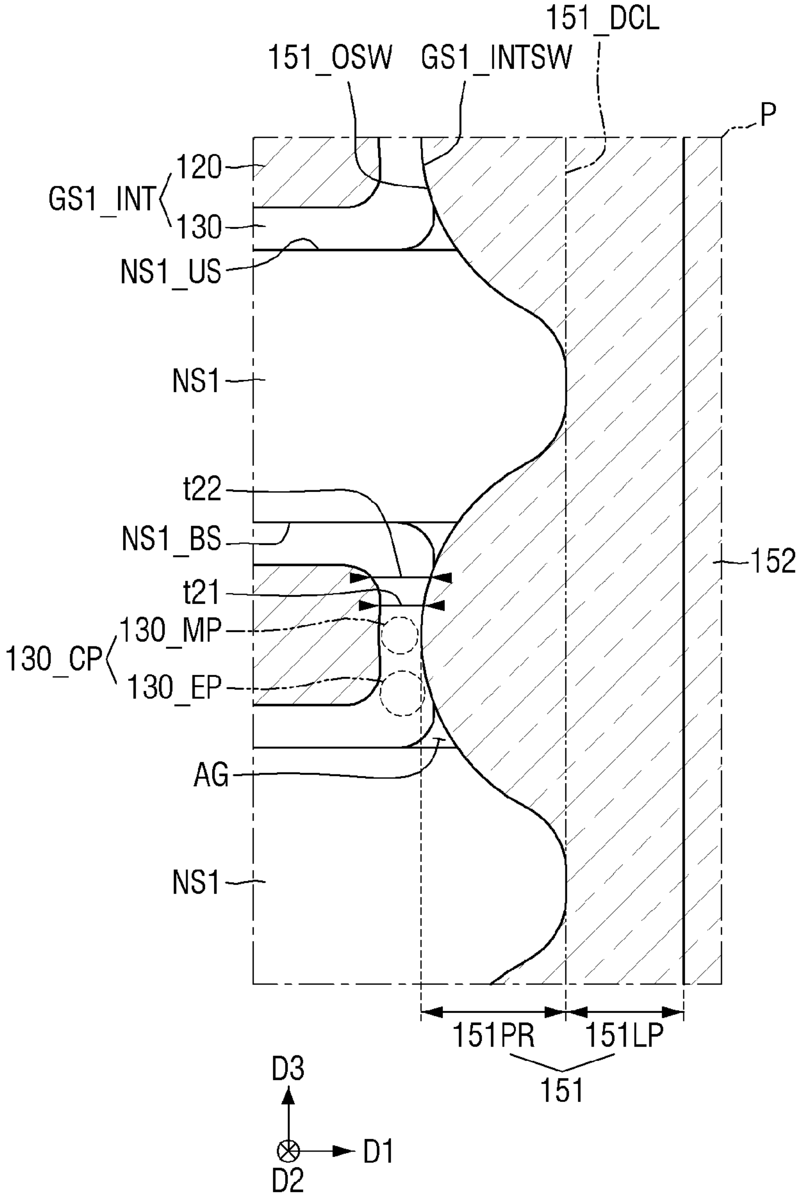
FIG. 12 is a diagram for explaining the semiconductor device, according to some embodiments.

FIG. 12 is a diagram for explaining a semiconductor device according to some embodiments. For convenience of explanation, different points from those described using FIGS. 1 to 11 will be mainly described. For reference, FIG. 12 is an enlarged view of the region P of FIG. 2.

Referring to FIG. 12, in the semiconductor device according to some embodiments, the first gate insulating film 130 of the first inter-gate structure GS1_INT may include a contact portion 130_CP that is in contact with the first semiconductor blocking film 151.

The contact portion 130_CP of the first gate insulating film 130 may include a central portion 130_MP and an edge portion 130_EP. The edge portion 130_EP of the contact portion 130_CP of the first gate insulating film 130 may be adjacent to the upper surface NS1_US of the first sheet pattern NS1 and the lower surface NS1_BS of the first sheet pattern NS1. The central portion 130_MP of the contact portion 130_CP of the first gate insulating film 130 may be located between the edge portions 130_EP of the contact portion 130_CP of the first gate insulating film 130.

For example, a thickness t22 of the edge portion 130_EP of the contact portion 130_CP of the first gate insulating film 130 is greater than a thickness t21 of the central portion 130_MP of the contact portion 130_CP of the first gate insulating film 130.

In other words, in the first gate insulating film 130 of the first inter-gate structure GS1_INT formed along the boundary between the first gate electrode 120 and the protruding portion 151PR of the first semiconductor blocking film 151, the thickness of the first gate insulating film 130 may decrease and then increase, as it goes away from the upper surface NS1_US of the first sheet pattern NS1. For example, the thickness of the first gate insulating film 130 may decrease and then increase as a distance from the upper surface NS1_US of the first sheet pattern NS1 increases in the third direction D3.

Although FIG. 12 shows that the air gap AG is disposed between the first inter-gate structure GS1_INT and the first semiconductor blocking film 151, the embodiment is not limited thereto. Unlike that shown, in some embodiments, the semiconductor residue pattern SP_R described in FIG. 11 may be disposed at the position of the air gap AG.

Figure 13:
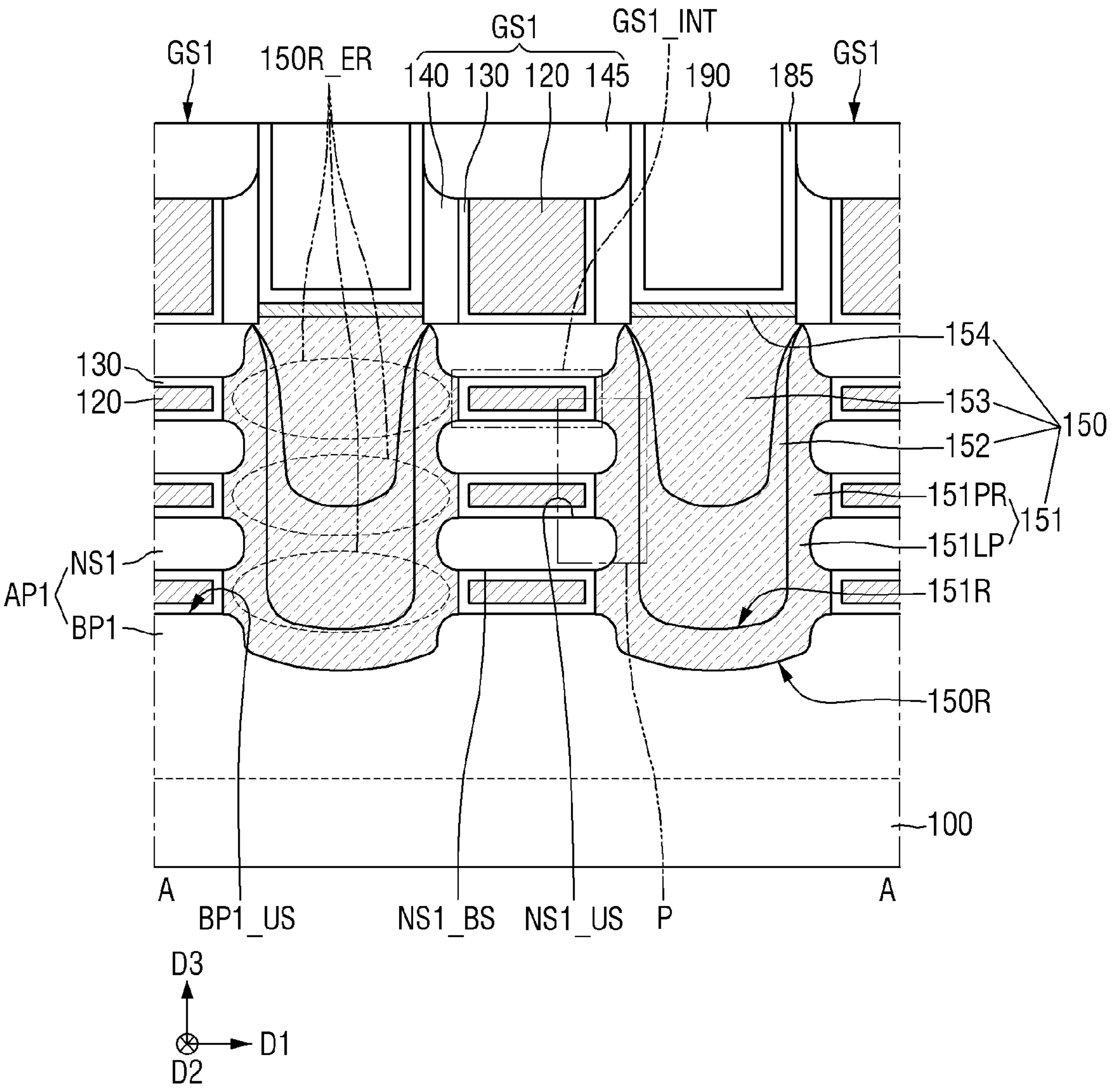
FIGS. 13 and 14 are diagrams for explaining the semiconductor device, according to some embodiments.
Figure 14:
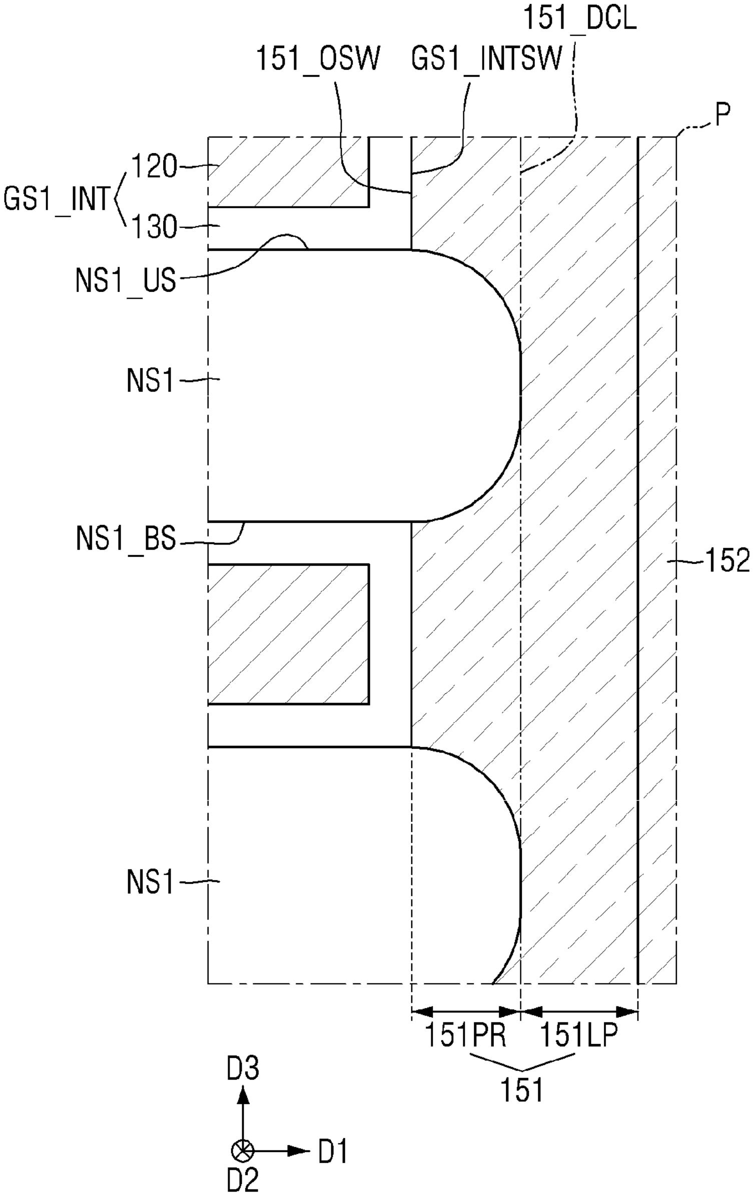
Figure 15:
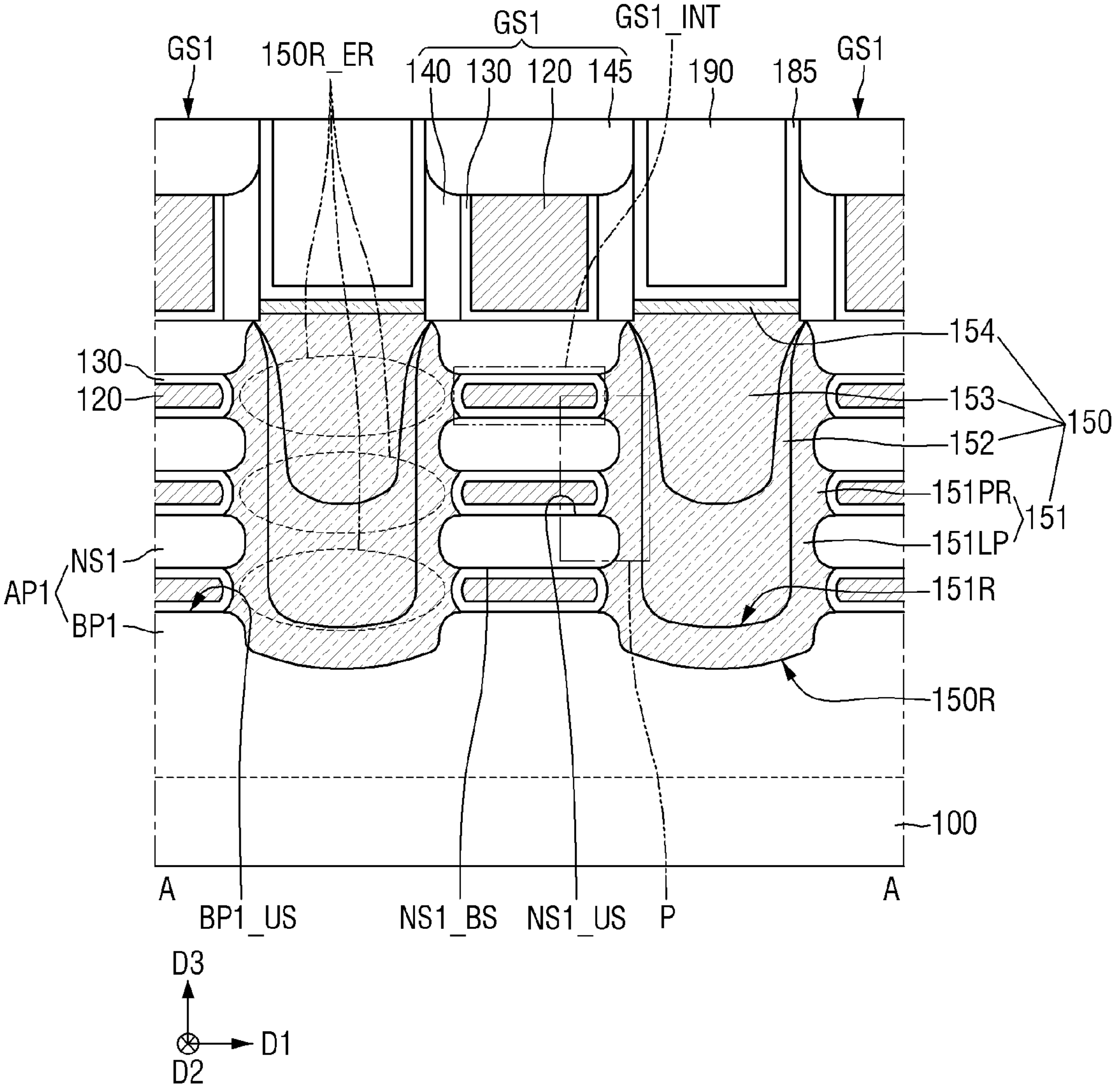
FIGS. 15 and 16 are diagrams for explaining the semiconductor device, according to some embodiments.
Figure 16:
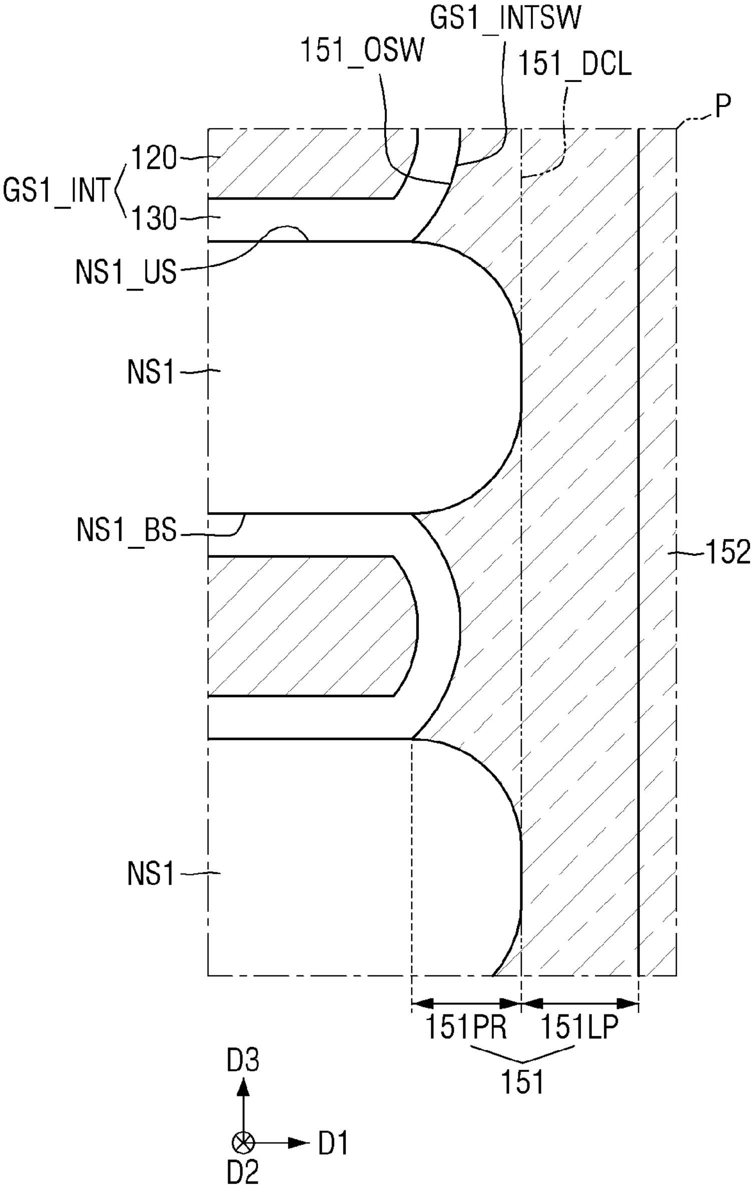

FIGS. 13 and 14 are diagrams for explaining a semiconductor device according to some embodiments. FIGS. 15 and 16 are diagrams for explaining the semiconductor device according to some embodiments. For convenience of explanation, different points from those described using FIGS. 1 to 9 will be mainly described. For reference, FIGS. 14 and 16 are enlarged views of the region P of FIGS. 13 and 15, respectively.

Referring to FIGS. 13 and 14, in the semiconductor device according to some embodiments, the outer side wall 151_OSW of the first semiconductor blocking film 151 which forms the boundary with the first gate insulating film 130 of the first inter-gate structure GS1_INT may be flat. For example, the outer side wall 151_OSW of the first semiconductor blocking film 151, which forms the boundary with the first gate insulating film 130 of the first inter-gate structure GS1_INT, may be planar.

In the cross-sectional view taken along the first direction D1 in which the first lower pattern BP1 extends, the boundary between the first inter-gate structure GS1_INT and the first semiconductor blocking film 151 may be a plane.

The width of the width extension region 150R_ER of the first source/drain recess 150R may increase and then be kept constant, as it goes away from the upper surface BP1_US of the first lower pattern BP1. For example, the width of the width extension region 150R_ER of the first source/drain recess 150R may increase and then be kept constant as the distance from the upper surface BP1_US of the first lower pattern BP1 increases in the third direction D3. Also, the width of the width extension region 150R_ER of the first source/drain recess 150R may be kept constant and then decrease, as it goes away from the upper surface BP1_US of the first lower pattern BP1. For example, the width of the width extension region 150R_ER of the first source/drain recess 150R may be kept constant and then decrease as the distance from the upper surface BP1_US of the first lower pattern BP1 increases in the third direction D3.

Referring to FIGS. 15 and 16, the outer side wall 151_OSW of the first semiconductor blocking film 151 which forms the boundary with the first gate insulating film 130 of the first inter-gate structure GS1_INT may be a concave curved surface.

In the cross-sectional view taken along the first direction D1 in which the first lower pattern BP1 extends, the first inter-gate structure GS1_INT may protrude toward the first semiconductor blocking film 151, similarly to the first sheet pattern NS1. However, the first inter-gate structure GS1_INT does not protrude to the divided connection line 151_DCL.

The width of the width extension region 150R_ER of the first source/drain recess 150R may increase, decrease, increase, and then decrease again, as it goes away from the upper surface BP1_US of the first lower pattern BP1. For example, the width of the width extension region 150R_ER of the first source/drain recess 150R may increase, decrease, increase, and then decrease again as the distance from the upper surface BP1_US of the first lower pattern BP1 increases in the third direction D3.

Figure 17:
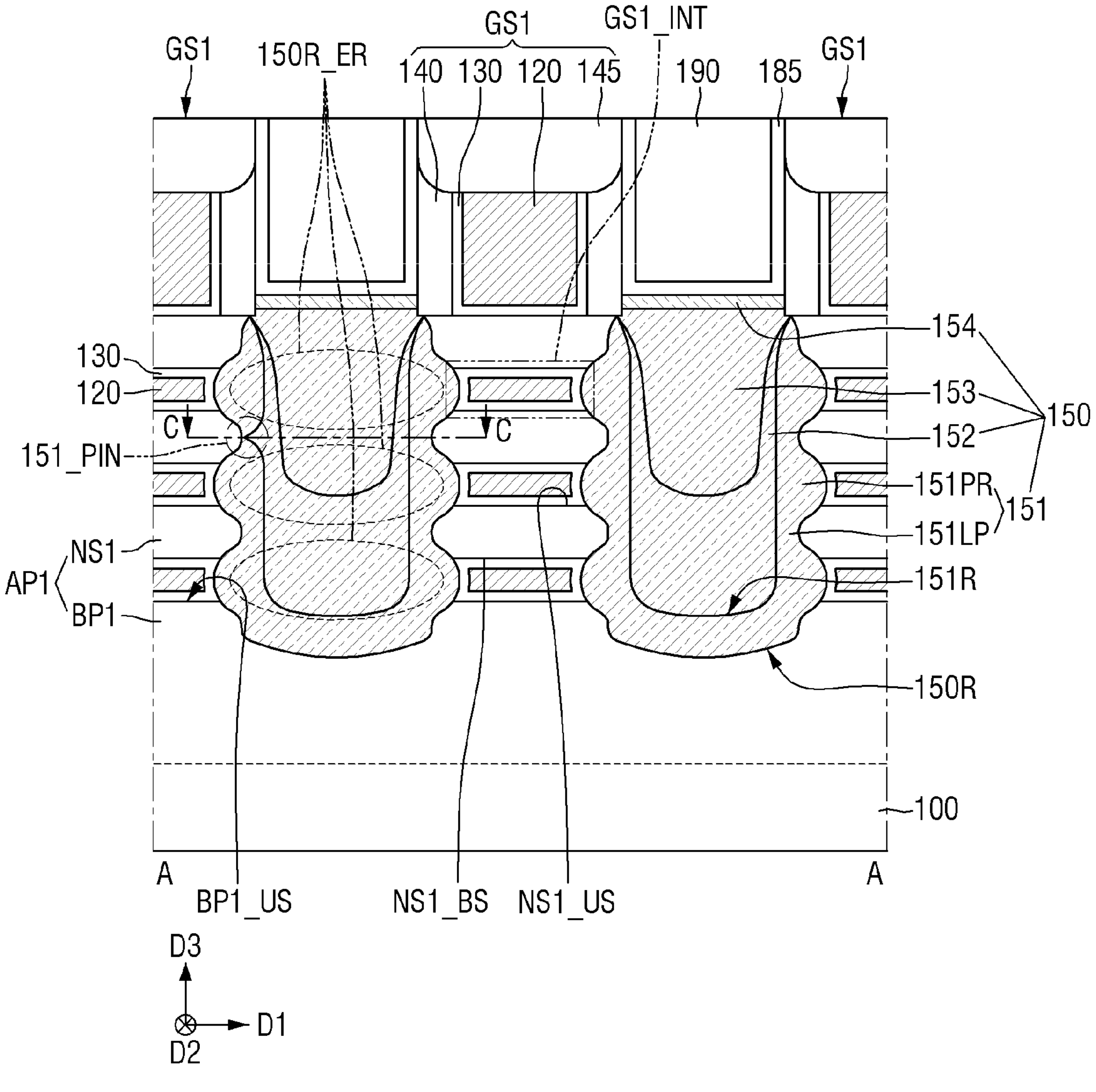
FIGS. 17 and 18 are diagrams for explaining the semiconductor device, according to some embodiments.
Figure 18:
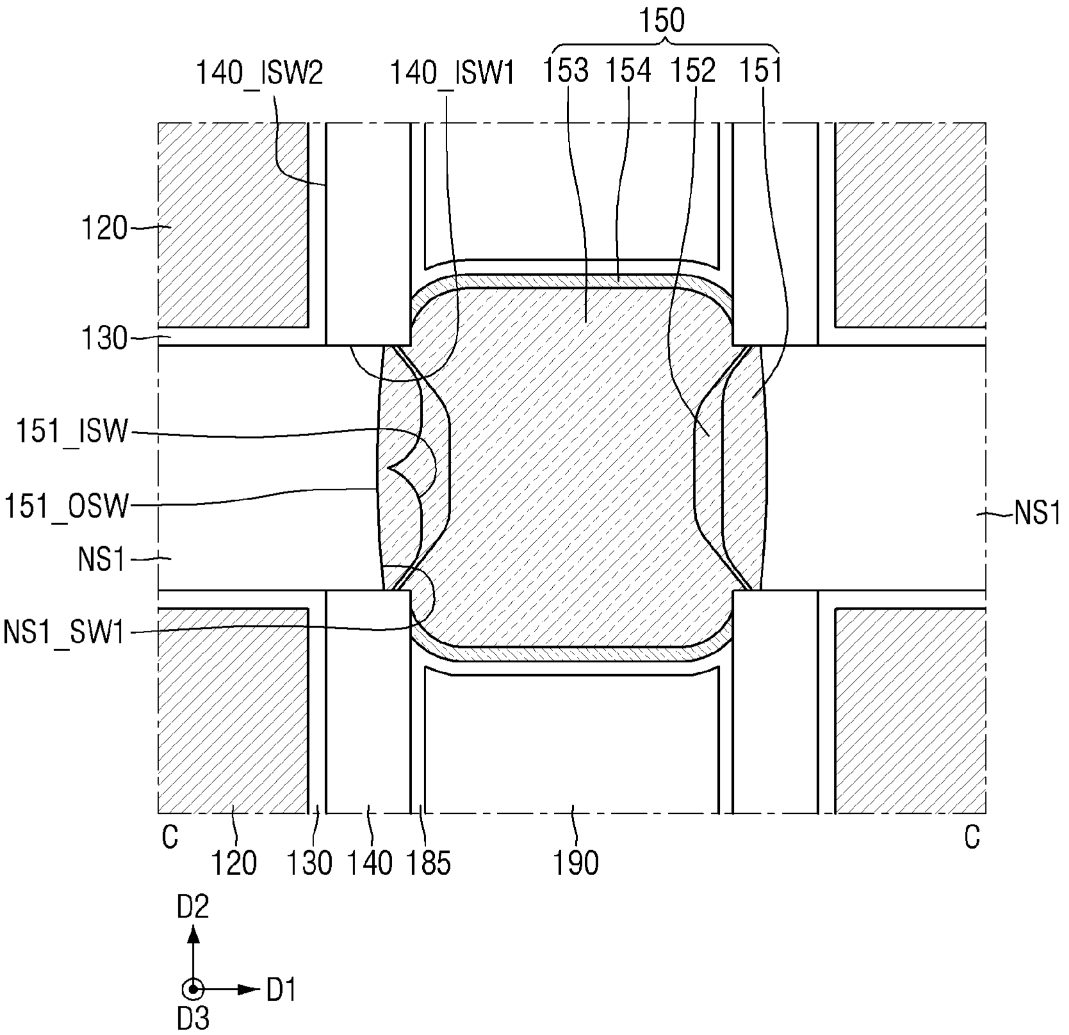

FIGS. 17 and 18 are diagrams for explaining a semiconductor device according to some embodiments. For convenience of explanation, different points from those described using FIGS. 1 to 9 will be mainly described.

Referring to FIGS. 17 and 18, in the semiconductor device according to some embodiments, the first semiconductor blocking film 151 may include a pinning region 151_PIN. The first semiconductor blocking film 151 which extends along the side wall of the first source/drain recess 150R may include the pinning region 151_PIN.

The pinning region 151_PIN may be formed in the liner portion 151LP of the first semiconductor blocking film 151. For example, the pinning region 151_PIN may be formed at a position which overlaps the first sheet pattern NS1 in the first direction D1.

In the pinning region 151_PIN, the thickness of the first semiconductor blocking film 151 may sharply decrease. In the pinning region 151_PIN, the thickness of the liner portion 151LP of the first semiconductor blocking film 151 decreases and then increases, as it goes away from the first lower pattern BP1. For example, the thickness of the liner portion 151LP in the pinning region 151_PIN may decrease and then increase as the distance from the first lower pattern BP1 increases in the third direction D3.

From a planar viewpoint, the inner side wall 151_ISW of the first semiconductor blocking film 151 in the pinning region 151_PIN includes a portion which is retracted toward the outer side wall 151_OSW of the first semiconductor blocking film 151.

From the planar viewpoint, in the pinning region 151_PIN, the inner side wall 151_ISW of the first semiconductor blocking film 151 may be spaced apart from the outer side wall 151_OSW of the first semiconductor blocking film 151 in the first direction D1.

Unlike that shown, in some embodiments, the inner side wall 151_ISW of the first semiconductor blocking film 151 in the pinning region 151_PIN may be separated into two portions. For example, in the pinning region 151_PIN, the inner side wall 151_ISW of the first semiconductor blocking film 151 may join the outer side wall 151_OSW of the first semiconductor blocking film 151.

Although the drawing shows that the single first semiconductor blocking film 151 includes the single pinning region 151_PIN, the embodiment is not limited thereto. Of course, the single first semiconductor blocking film 151 may include a plurality of pinning regions 151_PIN.

Although the drawing shows that a part of the first source/drain pattern 150 includes the pinning region 151_PIN, and the rest of the first source/drain pattern 150 does not include the pinning region 151_PIN, the embodiment is not limited thereto.

Figure 19:
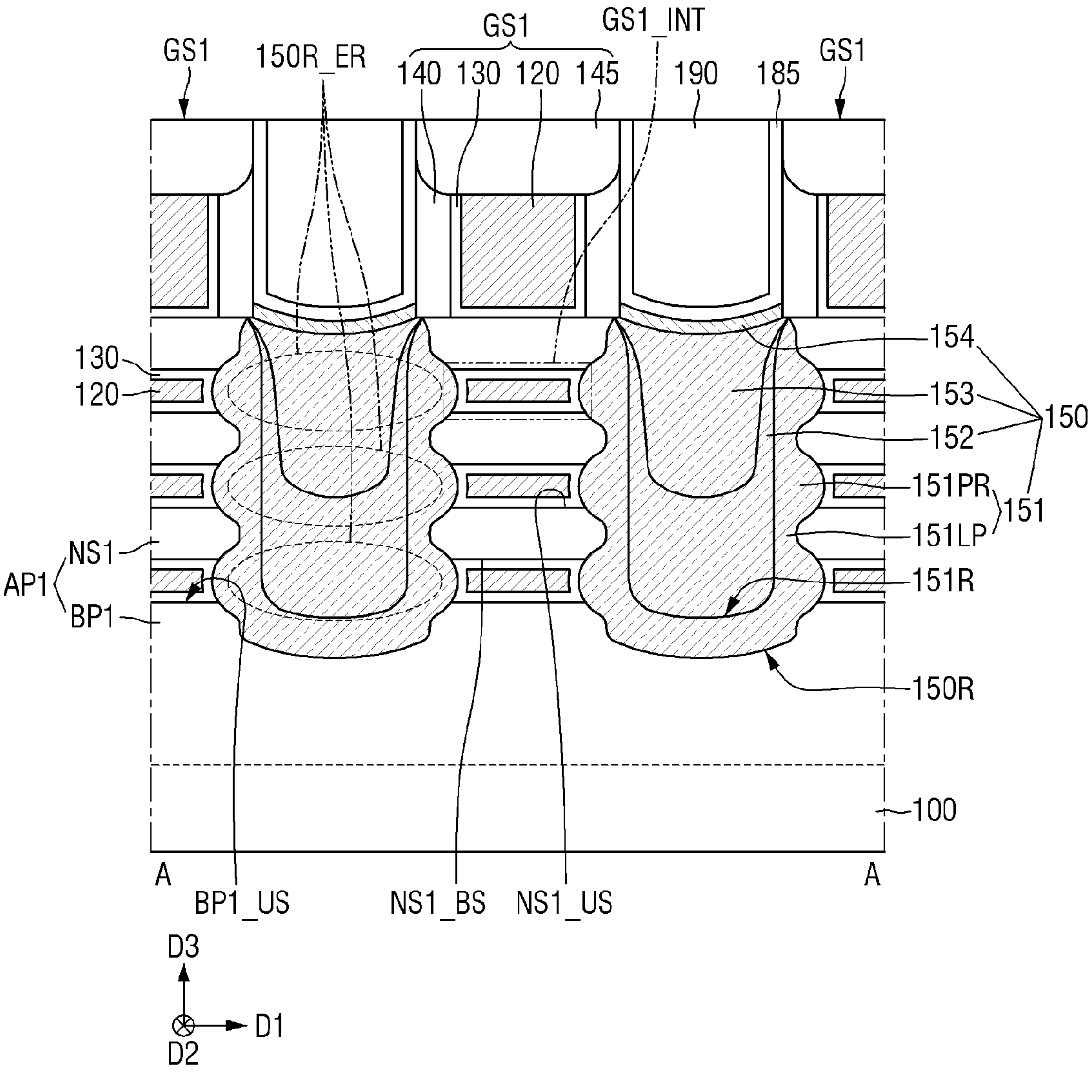
FIGS. 19 and 20 are diagrams for explaining the semiconductor device, according to some embodiments.
Figure 20:
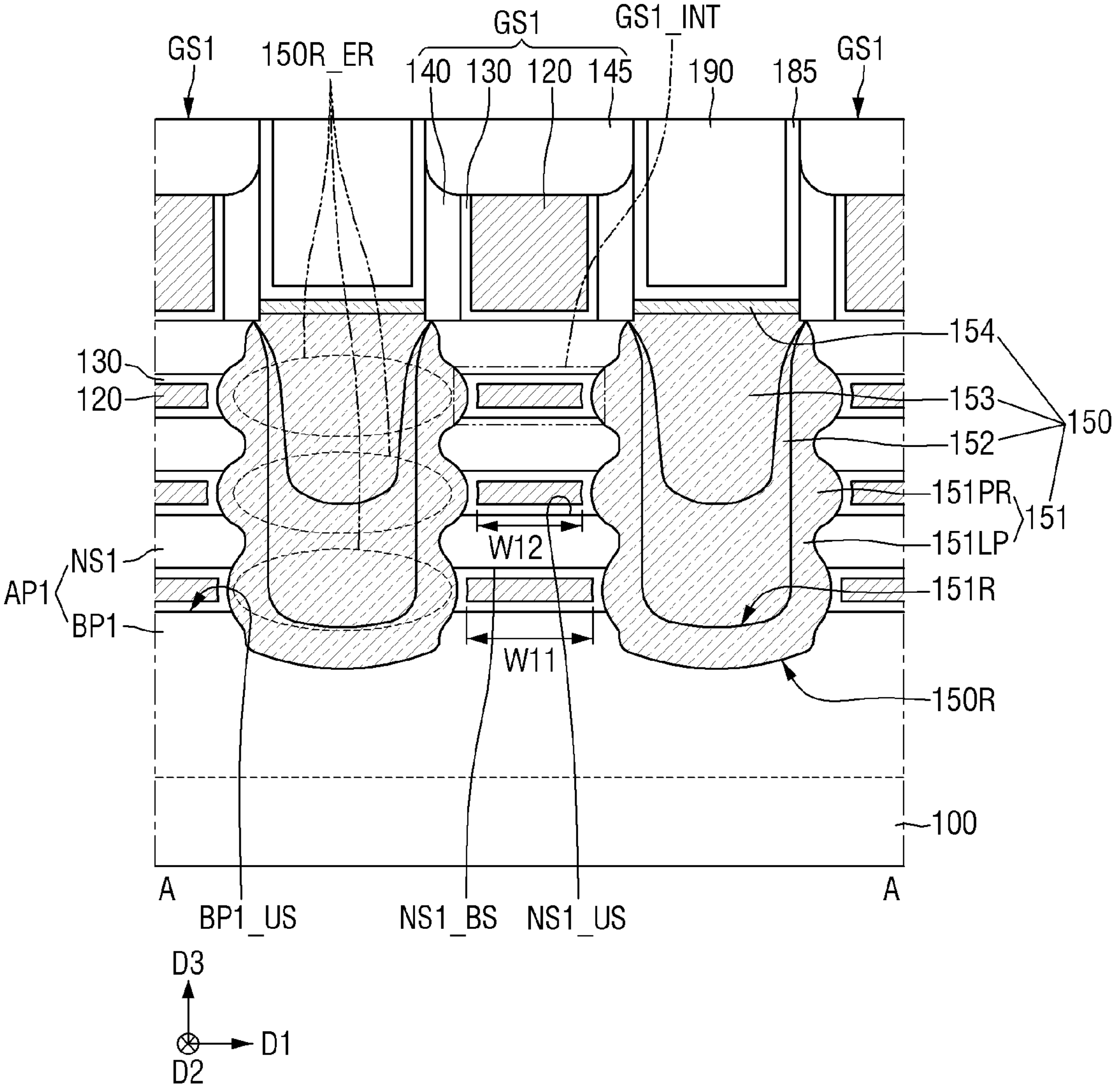

FIGS. 19 and 20 are diagrams for explaining a semiconductor device according to some embodiments, respectively. For convenience of explanation, different points from those described using FIGS. 1 to 9 will be mainly described.

Referring to FIG. 19, in the semiconductor device according to some embodiments, the upper surface of the first upper semiconductor filling film 153 does not include a portion that protrudes upward from the upper surface NS1_US of the first sheet pattern NS1 disposed at the uppermost part.

Although the upper surface of the first upper semiconductor filling film 153 is shown as having a concave curved surface, the embodiment is not limited thereto.

Referring to FIG. 20, in the semiconductor device according to some embodiments, the width W11 of the first gate electrode 120 disposed between the first lower pattern BP1 and the first sheet pattern NS1 is greater than the width W12 of the first gate electrode 120 disposed between the first sheet patterns NS1 adjacent to each other in the third direction D3.

Among the first gate electrodes 120 included in the first inter-gate structure GS1_INT, the width in the first direction D1 of the first gate electrode 120 located at the lowermost part may be the greatest.

Figure 21:
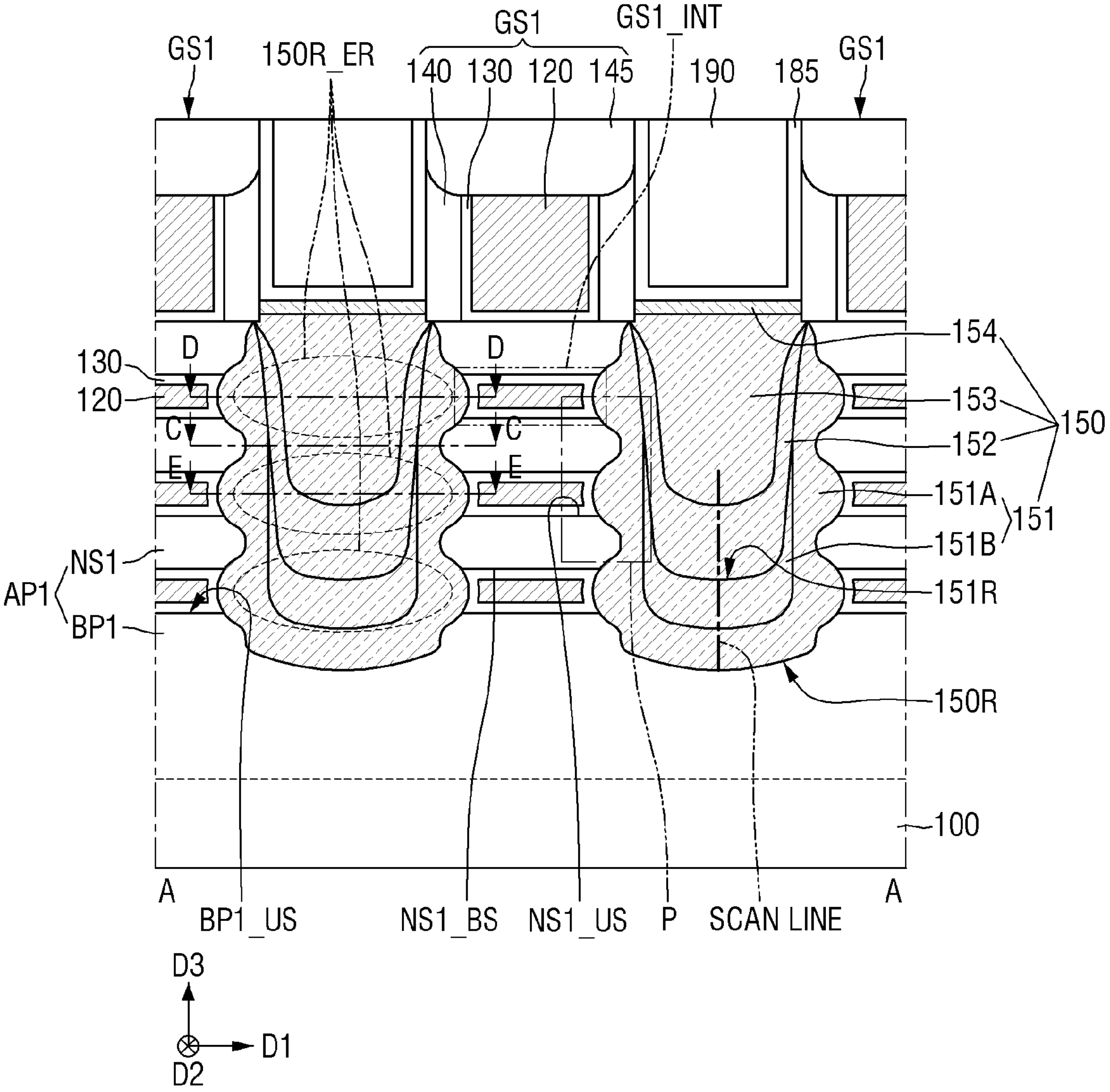
FIGS. 21 to 26 are diagrams for explaining the semiconductor device, according to some embodiments.
Figure 22:
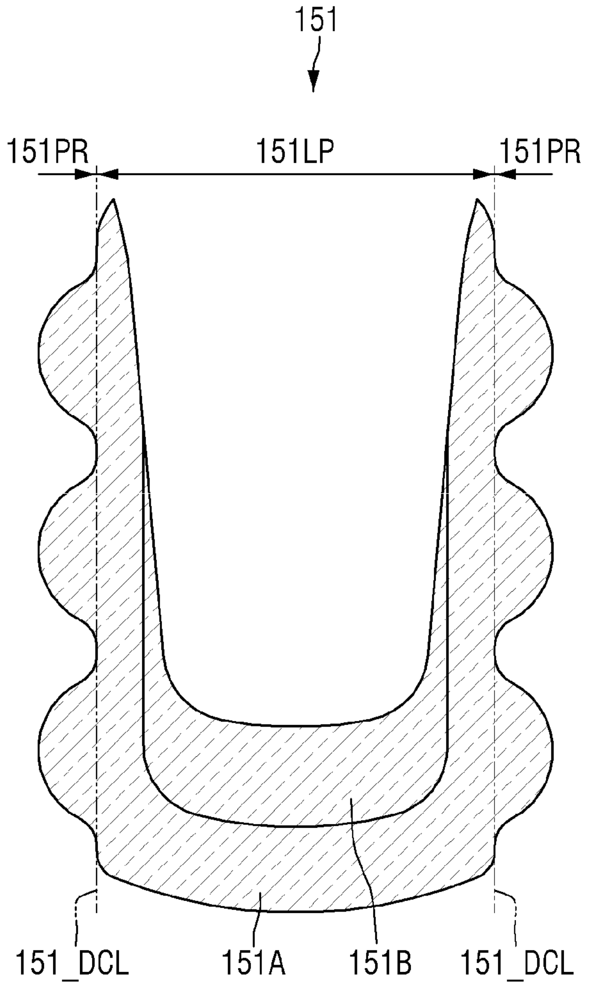
Figure 23:
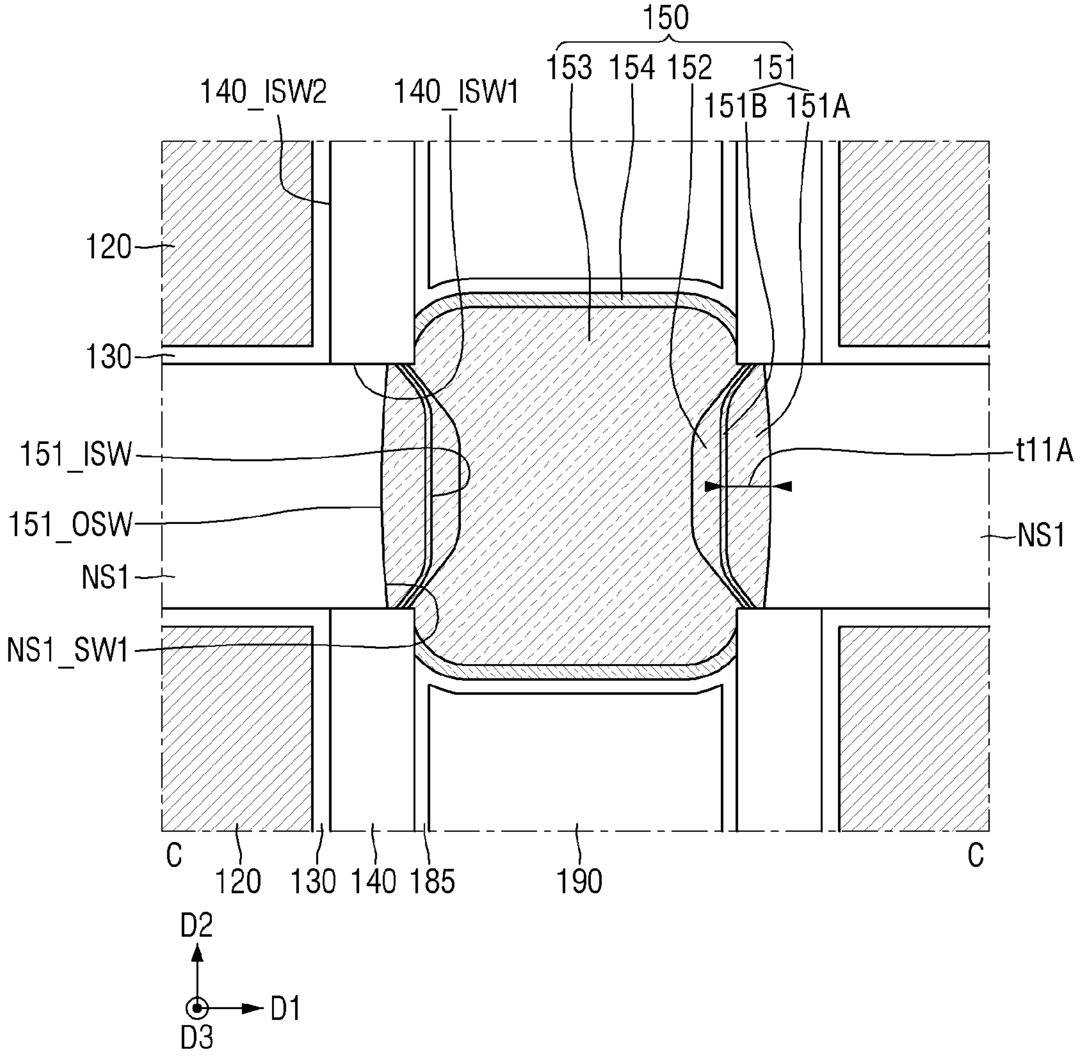
Figure 24:
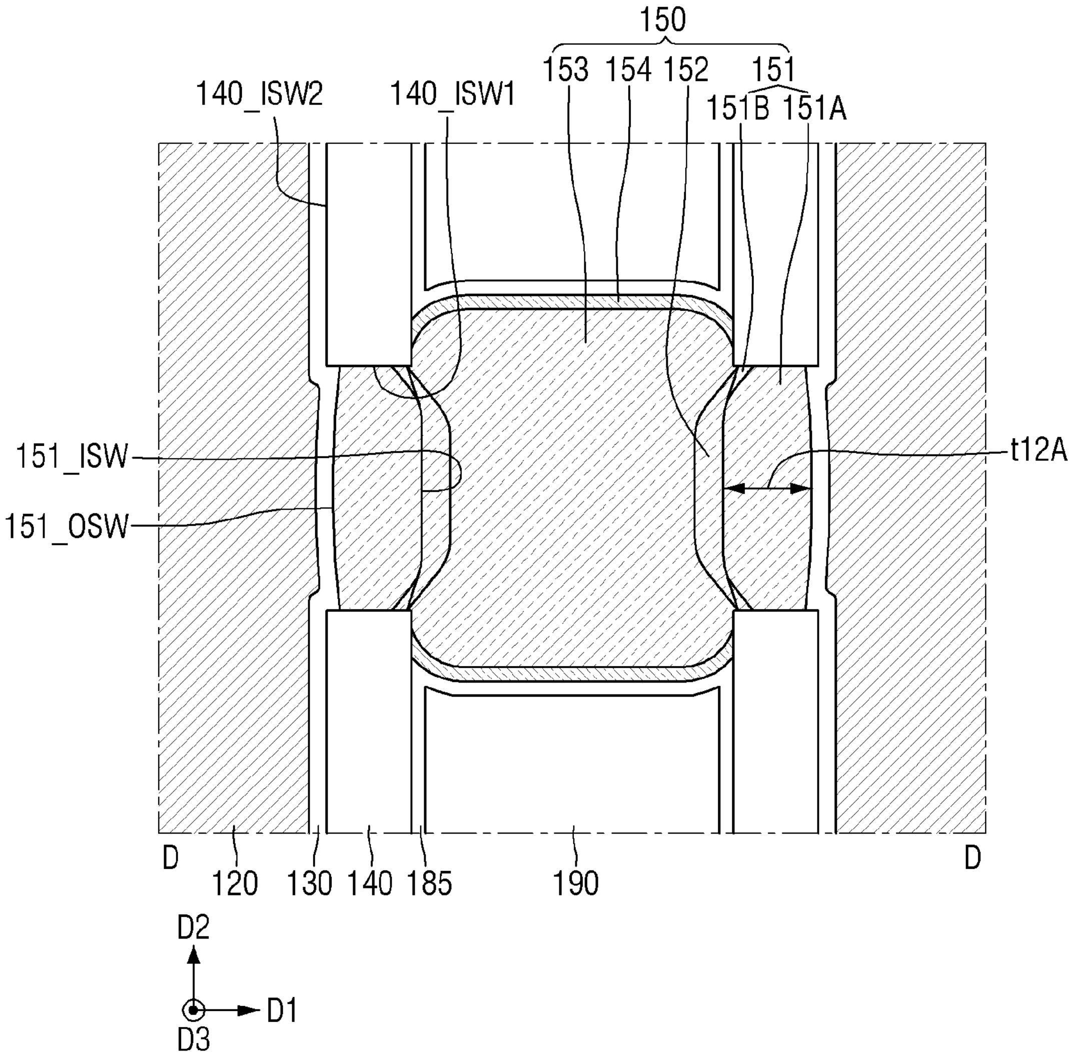
Figure 25:
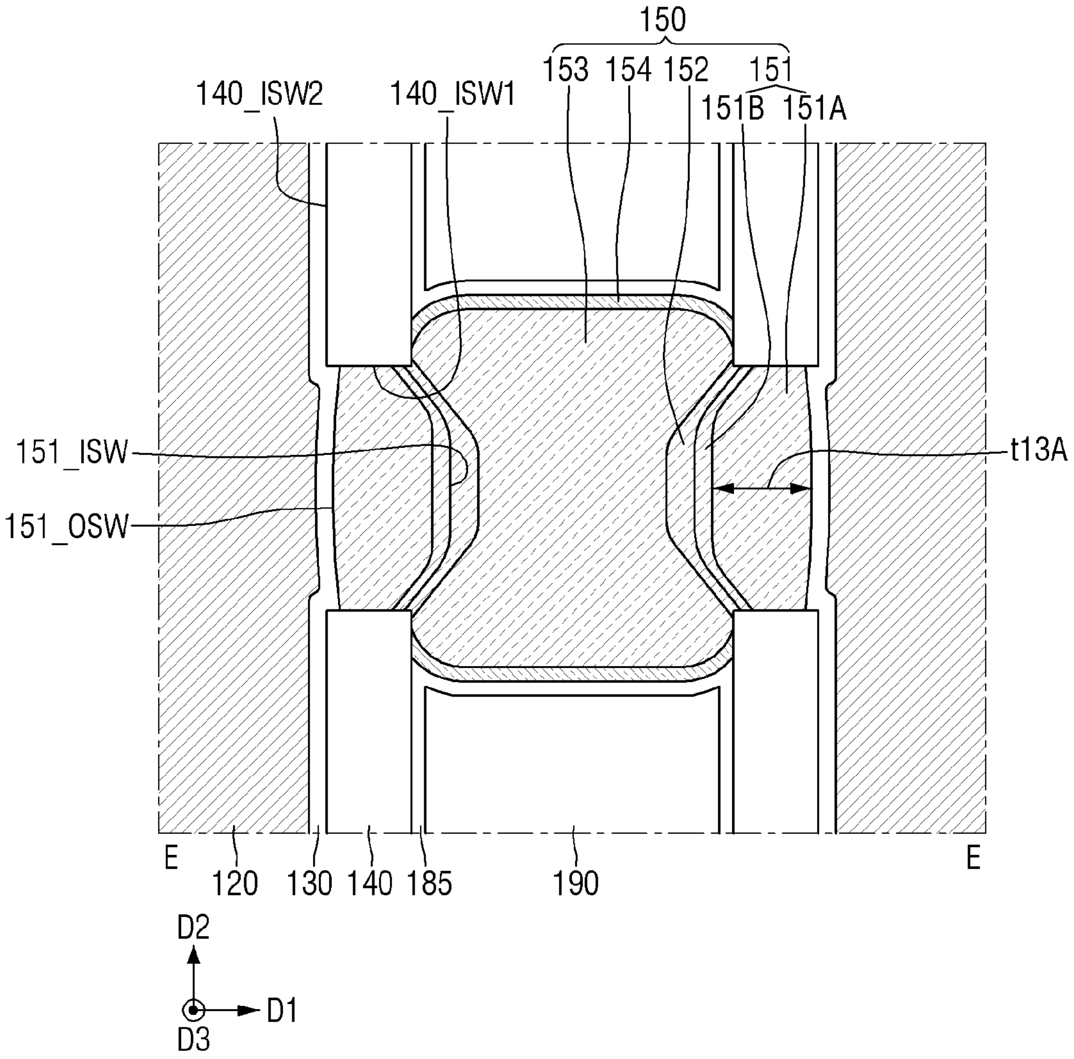
Figure 26:
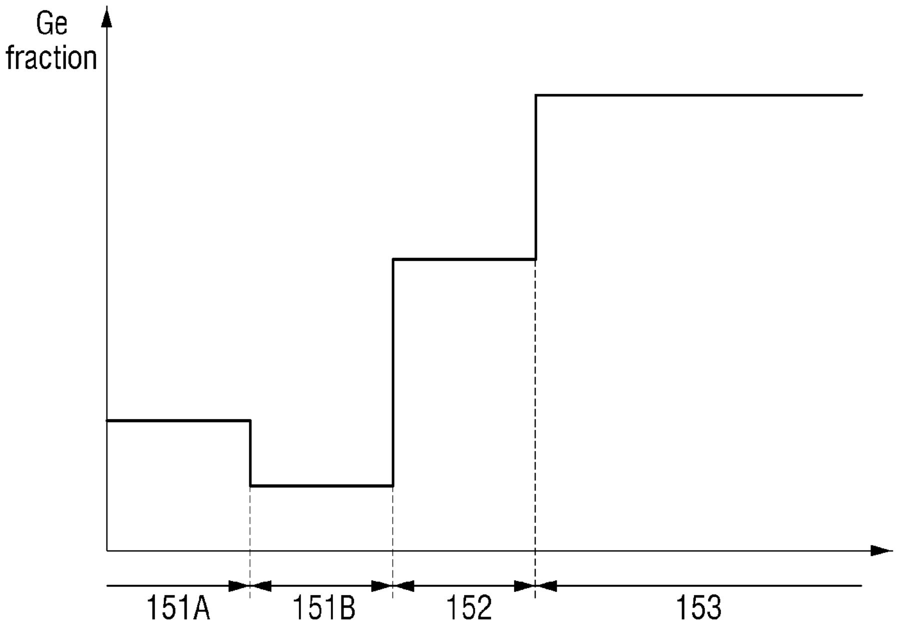

FIGS. 21 to 26 are diagrams for explaining a semiconductor device according to some embodiments. For convenience of explanation, different points from those described using FIGS. 1 to 9 will be mainly described. For reference, FIG. 21 is a cross-sectional view taken along A-A of FIG. 1, and FIG. 22 is an enlarged view of only the first semiconductor blocking film 151 of FIG. 21. FIGS. 23 to 25 are cross-sectional views taken along C-C, D-D and E-E of FIG. 21, respectively. FIG. 26 is a diagram schematically showing a fraction of germanium along a SCAN LINE of FIG. 21.

For reference, FIG. 23 is a diagram taken along the first sheet pattern NS1. FIG. 24 is cut view of the first inter-gate structure GS1_INT portion disposed above the upper surface NS1_US of the first sheet pattern NS1 of FIG. 23. FIG. 25 is a cut view of the first inter-gate structure GS1_INT portion disposed below the lower surface NS1_BS of the first sheet pattern NS1 of FIG. 23.

Referring to FIGS. 21 to 26, in the semiconductor device according to some embodiments, the first semiconductor blocking film 151 may include a first lower semiconductor blocking film 151A, and a first upper semiconductor blocking film 151B.

The first lower semiconductor blocking film 151A may be formed continuously along the first source/drain recess 150R. The first lower semiconductor blocking film 151A may be formed continuously along the side wall of the first source/drain recess 150R and the bottom surface of the first source/drain recess 150R.

The first lower semiconductor blocking film 151A is in contact with the first gate insulating film 130, the first sheet pattern NS1, and the first lower pattern BP1. The outer side wall 151_OSW of the first semiconductor blocking film 151 may be defined by the first lower semiconductor blocking film 151A.

The first upper semiconductor blocking film 151B may be formed on the first lower semiconductor blocking film 151A. The first upper semiconductor blocking film 151B may be formed along at least a part of the profile of the first lower semiconductor blocking film 151A.

The first liner recess 151R may be defined by the first lower semiconductor blocking film 151A and the first upper semiconductor blocking film 151B. The inner side wall 151_ISW of the first semiconductor blocking film 151 may be defined by the first lower semiconductor blocking film 151A and the first upper semiconductor blocking film 151B.

The width of the first liner recess 151R in the first direction D1 may increase, as it goes away from the upper surface BP1_US of the first lower pattern BP1. For example, the width of the first liner recess 151R in the first direction D1 may continuously increase as the distance from the upper surface BP1_US of the first lower pattern BP1 increases in the third direction D3.

In FIG. 22, the protruding portion 151PR of the first semiconductor blocking film 151 may be defined by the first lower semiconductor blocking film 151A. The protruding portion 151PR of the first semiconductor blocking film 151 may not include the first upper semiconductor blocking film 151B. The liner portion 151LP of the first semiconductor blocking film 151 may include a first lower semiconductor blocking film 151A and a first upper semiconductor blocking film 151B.

In FIGS. 23 to 25, a thickness t11A in the first direction D1 of the first lower semiconductor blocking film 151A which is in contact with the first side wall NS1_SW1 of the first sheet pattern NS1 is smaller than thicknesses t12A and t13A in the first direction D1 of the first lower semiconductor blocking film 151A which is in contact with the first gate insulating film 130 of the first inter-gate structure GS1_INT.

In FIGS. 21, 24 and 25, the thickness t12A of the first lower semiconductor blocking film 151A which is in contact with the first gate insulating film 130 above the upper surface NS1_US of the first sheet pattern NS1 may be smaller than the thickness t13A of the first lower semiconductor blocking film 151A which is in contact with the first gate insulating film 130 below the lower surface NS1_BS of the first sheet pattern NS1.

In FIG. 24, the inner side wall 151_ISW of the first semiconductor blocking film 151 may be defined by the first upper semiconductor blocking film 151B and the first lower semiconductor blocking film 151A. For example, the first upper semiconductor blocking film 151B may not cover a part of the inner side wall of the first lower semiconductor blocking film 151A which is opposite to the outer side wall 151_OSW of the first semiconductor blocking film 151.

In FIG. 25, the inner side wall 151_ISW of the first semiconductor blocking film 151 may be defined by the first upper semiconductor blocking film 151B. For example, the first upper semiconductor blocking film 151B may entirely cover the inner side wall surface of the first lower semiconductor blocking film 151A that is opposite to the outer side wall 151_OSW of the first semiconductor blocking film 151.

In FIG. 23, the thickness of the first upper semiconductor blocking film 151B on the first lower semiconductor blocking film 151A may be smaller than the thickness of the first upper semiconductor blocking film 151B on the first lower semiconductor blocking film 151A in FIG. 25.

The first lower semiconductor blocking film 151A and the first upper semiconductor blocking film 151B may each include, for example, silicon-germanium. The first lower semiconductor blocking film 151A and the first upper semiconductor blocking film 151B may include a silicon-germanium film.

In FIG. 26, the fraction of germanium of the first lower semiconductor blocking film 151A and the fraction of germanium of the first upper semiconductor blocking film 151B are smaller than the fraction of germanium of the first semiconductor filling films 152 and 153. The fraction of germanium of the first lower semiconductor blocking film 151A is greater than the fraction of germanium of the first upper semiconductor blocking film 151B, and smaller than the fraction of germanium of the first lower semiconductor filling film 152.

Figure 27:
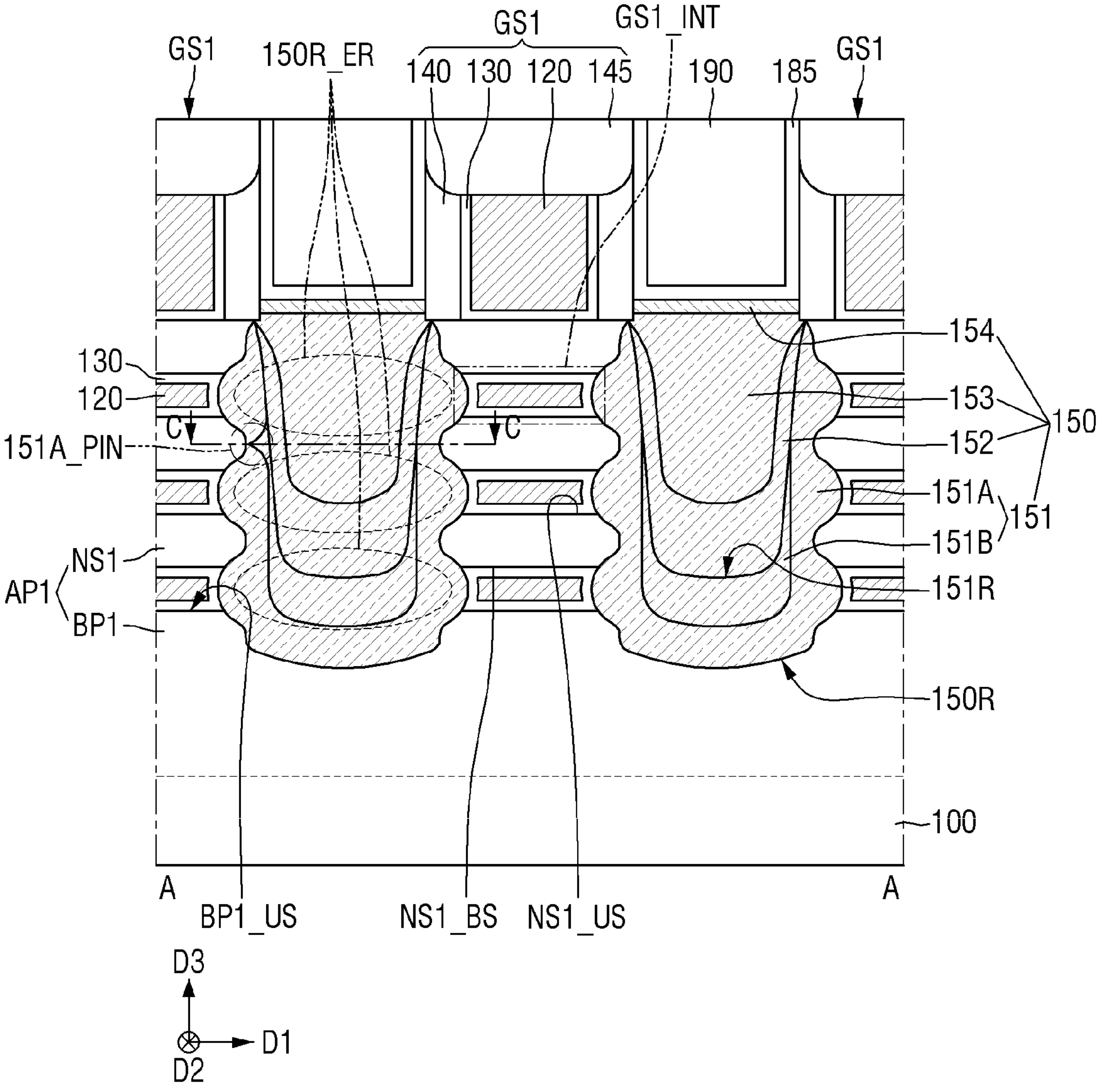
FIGS. 27 and 28 are diagrams for explaining the semiconductor device, according to some embodiments.
Figure 28:
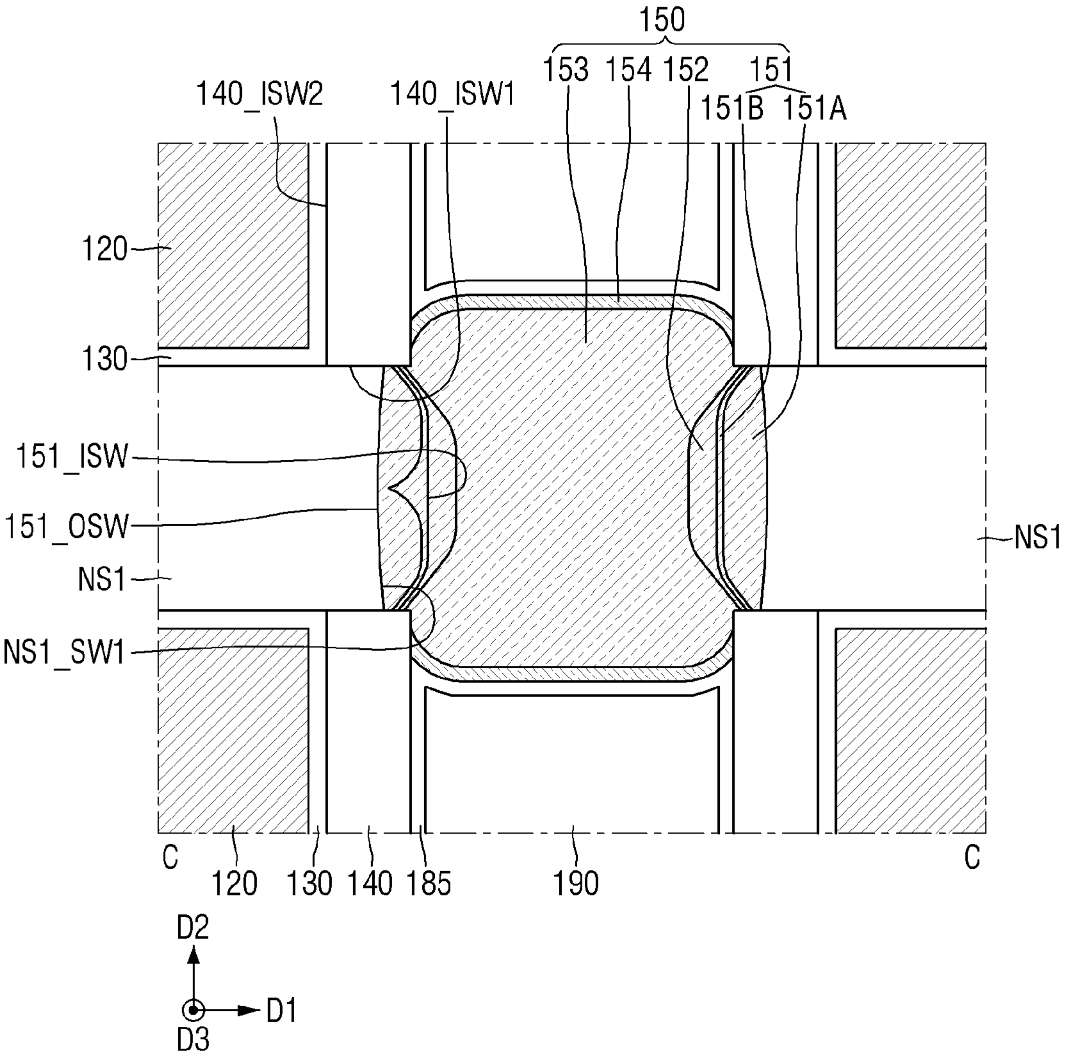
Figure 29:
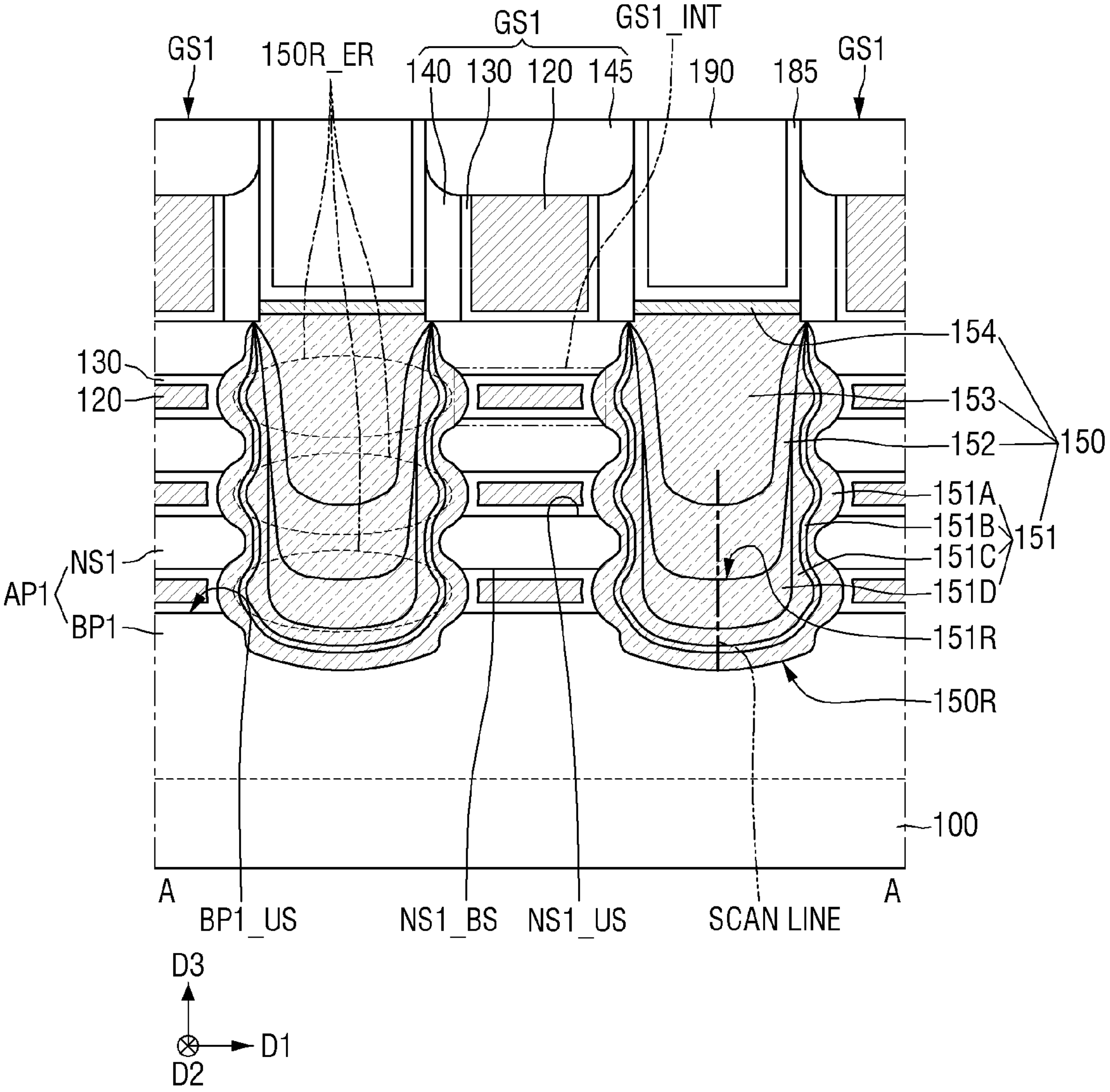
FIGS. 29 and 30 are diagrams for explaining the semiconductor device, according to some embodiments.
Figure 30:
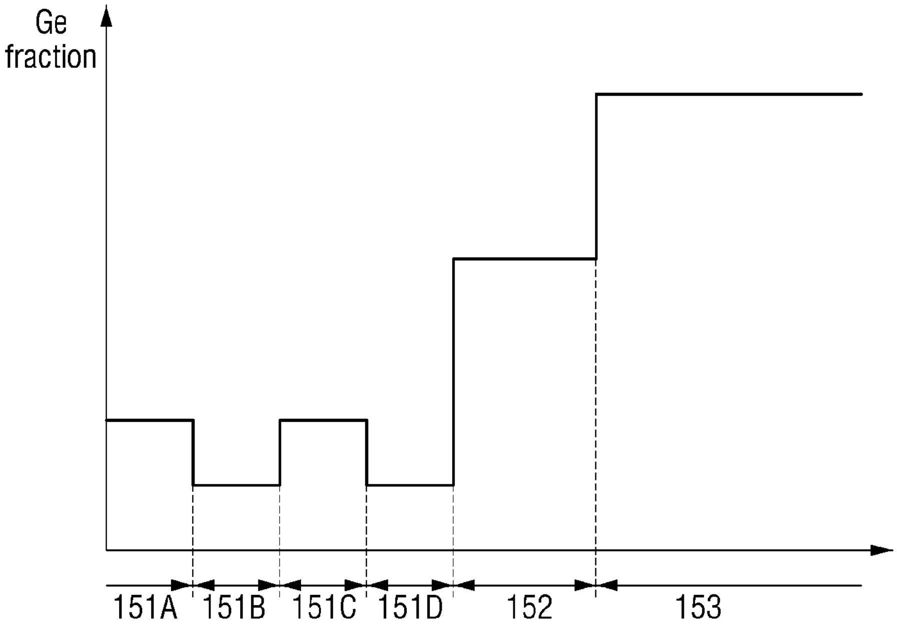

FIGS. 27 and 28 are diagrams for explaining a semiconductor device according to some embodiments. FIGS. 29 and 30 are diagrams for explaining a semiconductor device according to some embodiments. For convenience of explanation, different points from those described using FIGS. 21 to 26 will be mainly described. For reference, FIG. 30 is a diagram schematically showing the fraction of germanium along a SCAN LINE of FIG. 29.

Referring to FIGS. 27 and 28, in the semiconductor device according to some embodiments, the first semiconductor blocking film 151 may include an internal pinning region 151A_PIN. The first semiconductor blocking film 151 extending along the side wall of the first source/drain recess 150R may include an internal pinning region 151A_PIN.

More specifically, the first lower semiconductor blocking film 151A may include the internal pinning region 151A_PIN. The internal pinning region 151A_PIN may be formed at a position that overlaps the first sheet pattern NS1 in the first direction D1.

In the internal pinning region 151A_PIN, the thickness of the first lower semiconductor blocking film 151A may sharply decrease. In the internal pinning region 151A_PIN, the thickness of the first lower semiconductor blocking film 151A included in the liner portion 151LP of the first semiconductor blocking film 151 decreases and then increases, as it goes away from the first lower pattern BP1. For example, the thickness of the first lower semiconductor blocking film 151A included in the liner portion 151LP of the first semiconductor blocking film 151 decreases and then increases as the distance from the first lower pattern BP1 increases in the third direction D3.

From the planar viewpoint, the inner side wall of the first lower semiconductor blocking film 151A in the internal pinning region 151A_PIN includes a portion that is retracted toward the outer side wall 151_OSW of the first semiconductor blocking film 151. The first upper semiconductor blocking film 151B may fill the internal pinning region 151A_PIN of the first lower semiconductor blocking film 151A.

Although the drawing shows that the single first lower semiconductor blocking film 151A includes the single internal pinning region 151A_PIN, the embodiment is not limited thereto. The single first lower semiconductor blocking film 151A may include a plurality of internal pinning regions 151A_PIN.

Although the drawing shows that a part of the first source/drain pattern 150 includes the internal pinning region 151A_PIN, and the rest of the first source/drain pattern 150 does not include the internal pinning region 151A_PIN, the embodiment is not limited thereto.

Referring to FIGS. 29 and 30, in the semiconductor device according to some embodiments, the first semiconductor blocking film 151 may further include a lower insertion semiconductor blocking film 151C, and an upper insertion semiconductor blocking film 151D.

The lower insertion semiconductor blocking film 151C and the upper insertion semiconductor blocking film 151D may be sequentially formed on the first upper semiconductor blocking film 151B.

The first lower semiconductor blocking film 151A and the lower insertion semiconductor blocking film 151C may be formed continuously along the first source/drain recess 150R.

The first upper semiconductor blocking film 151B may be formed continuously along the first source/drain recess 150R. Unlike that shown, in some embodiments, the first upper semiconductor blocking film 151B may be formed along a part of the profile of the first lower semiconductor blocking film 151A.

The upper insertion semiconductor blocking film 151D may be formed on the lower insertion semiconductor blocking film 151C. The upper insertion semiconductor blocking film 151D may be formed along at least a part of the profile of the lower insertion semiconductor blocking film 151C. The first liner recess 151R may be defined by the lower insertion semiconductor blocking film 151C and the upper insertion semiconductor blocking film 151D.

Depending on the thickness of the first lower semiconductor blocking film 151A, the protruding portion (e.g., protruding portion 151PR of FIG. 22) of the first semiconductor blocking film 151 may be defined by the first lower semiconductor blocking film 151A, and may be defined by the first lower semiconductor blocking film 151A and the first upper semiconductor blocking film 151B.

The lower insertion semiconductor blocking film 151C and the upper insertion semiconductor blocking film 151D may each include, for example, silicon-germanium. The lower insertion semiconductor blocking film 151C and the upper insertion semiconductor blocking film 151D may include a silicon-germanium film.

In FIG. 30, the fraction of germanium of the lower insertion semiconductor blocking film 151C is greater than the fraction of germanium of the upper insertion semiconductor blocking film 151D. The fraction of germanium of the lower insertion semiconductor blocking film 151C is smaller than the fraction of germanium of the first lower semiconductor filling film 152. In general, the fraction of germanium of the first semiconductor blocking film 151 is smaller than the fraction of germanium of the first semiconductor filling films 152 and 153.

Figure 31:
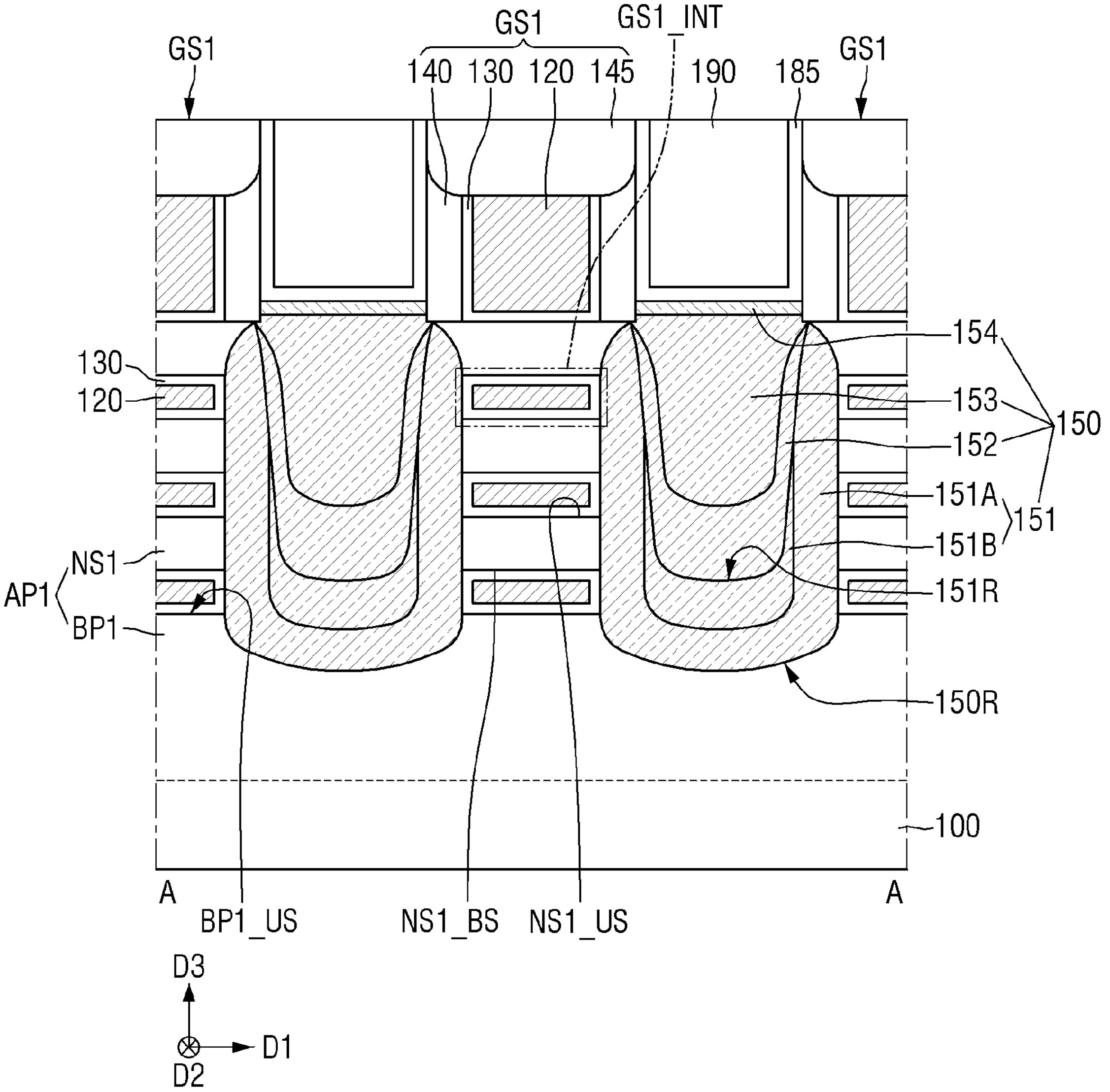
FIG. 31 is a diagram for explaining the semiconductor device, according to some embodiments.

FIG. 31 is a diagram for explaining the semiconductor device according to some embodiments. For convenience of explanation, different points from those described using FIGS. 21 to 26 will be mainly described.

Referring to FIG. 31, in the semiconductor device according to some embodiments, the first source/drain recess 150R does not include a plurality of width extension regions (e.g., width extension regions 150R_ER of FIG. 2).

The first semiconductor blocking film 151 includes the liner portion (e.g., liner portion 151LP of FIG. 22), but does not include the protruding portion (e.g., protruding portion 151PR of FIG. 22).

The side wall of the first source/drain recess 150R does not have a wavy shape. The upper part of the side wall of the first source/drain recess 150R may decrease in width in the first direction D1, as it goes away from the first lower pattern BP1. For example, the upper part of the side wall of the first source/drain recess 150R may decrease in width in the first direction D1 as the distance from the first lower pattern BP1 increases in the third direction D3.

Figure 32:
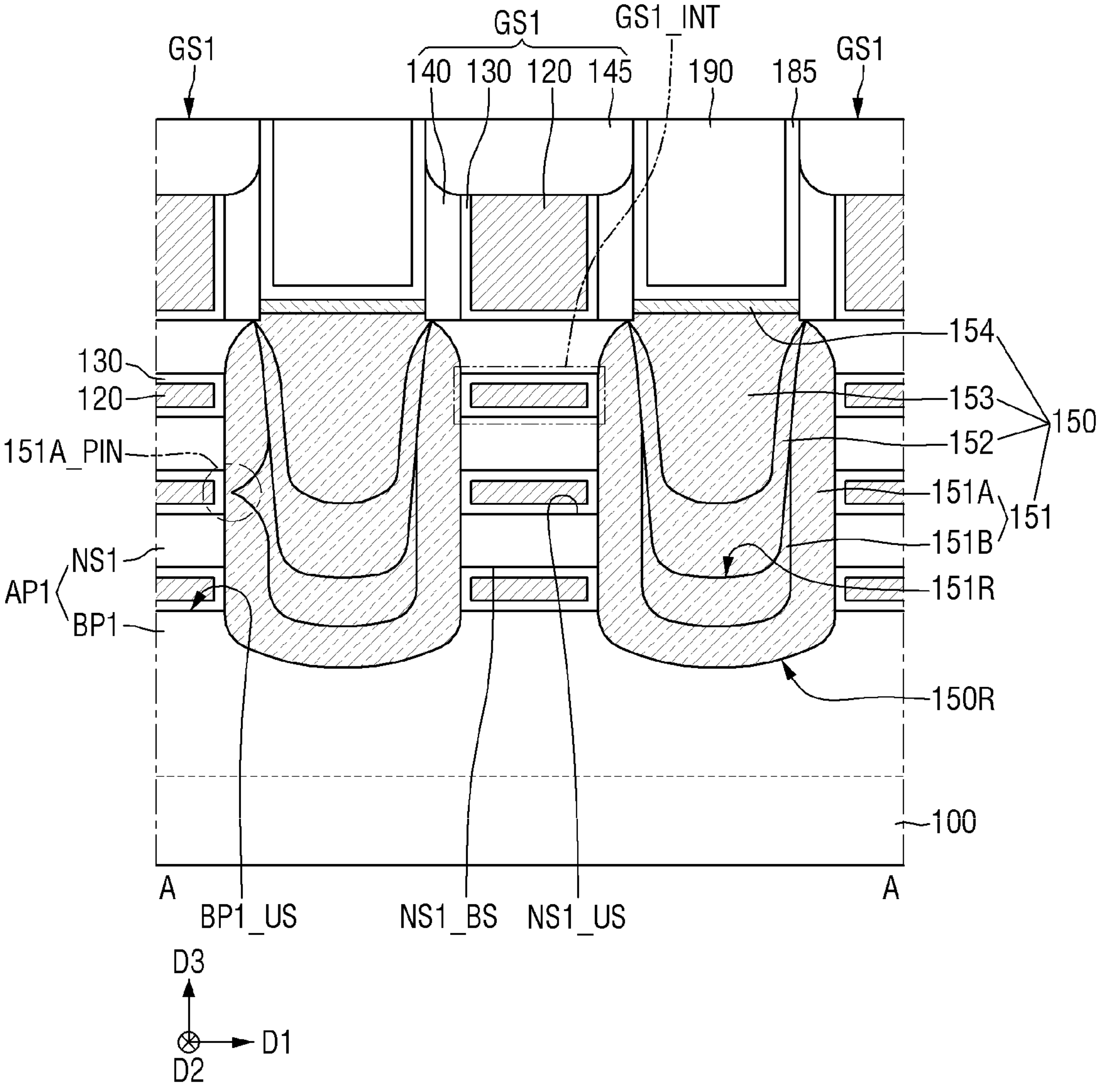
FIG. 32 is a diagram for explaining the semiconductor device, according to some embodiments.

FIG. 32 is a diagram for explaining a semiconductor device according to some embodiments. For convenience of explanation, different points from those described using FIG. 31 will be mainly described.

Referring to FIG. 32, in the semiconductor device according to some embodiments, the first semiconductor blocking film 151 may include an internal pinning region 151A_PIN.

The first lower semiconductor blocking film 151A may include an internal pinning region 151A_PIN. Although the internal pinning region 151A_PIN may be formed at a position that overlaps the first inter-gate structure GS1_INT in the first direction D1, the embodiment is not limited thereto.

In the internal pinning region 151A_PIN, the thickness of the first lower semiconductor blocking film 151A may sharply decrease. In the internal pinning region 151A_PIN, the thickness of the first lower semiconductor blocking film 151A decreases and then increases, as it goes away from the first lower pattern BP1. For example, the thickness of the first lower semiconductor blocking film 151A decreases and then increases as the distance from the first lower pattern BP1 increases in the third direction D3.

Figure 33:
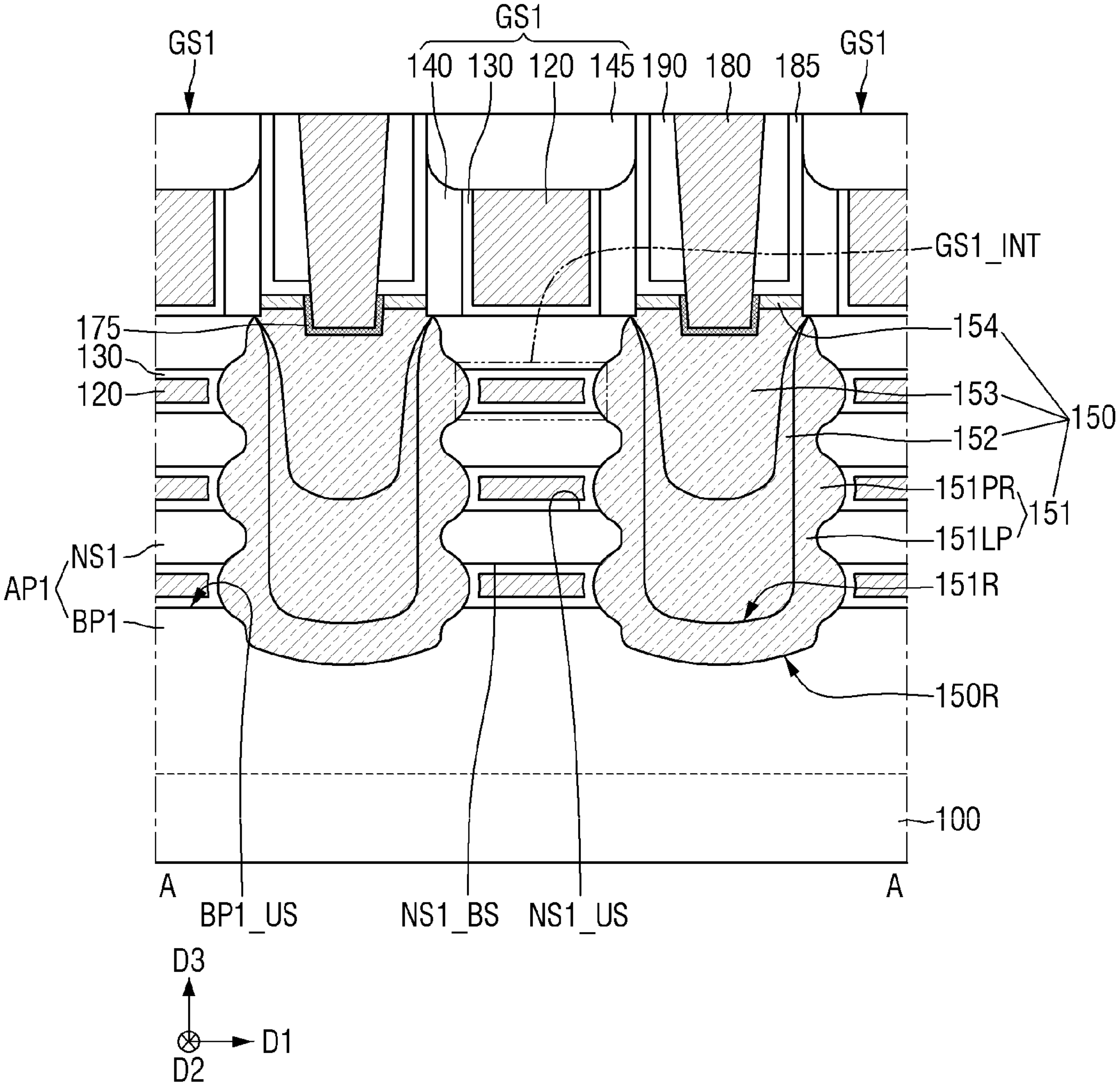
FIGS. 33 and 34 are diagrams for explaining the semiconductor device, according to some embodiments.
Figure 34:
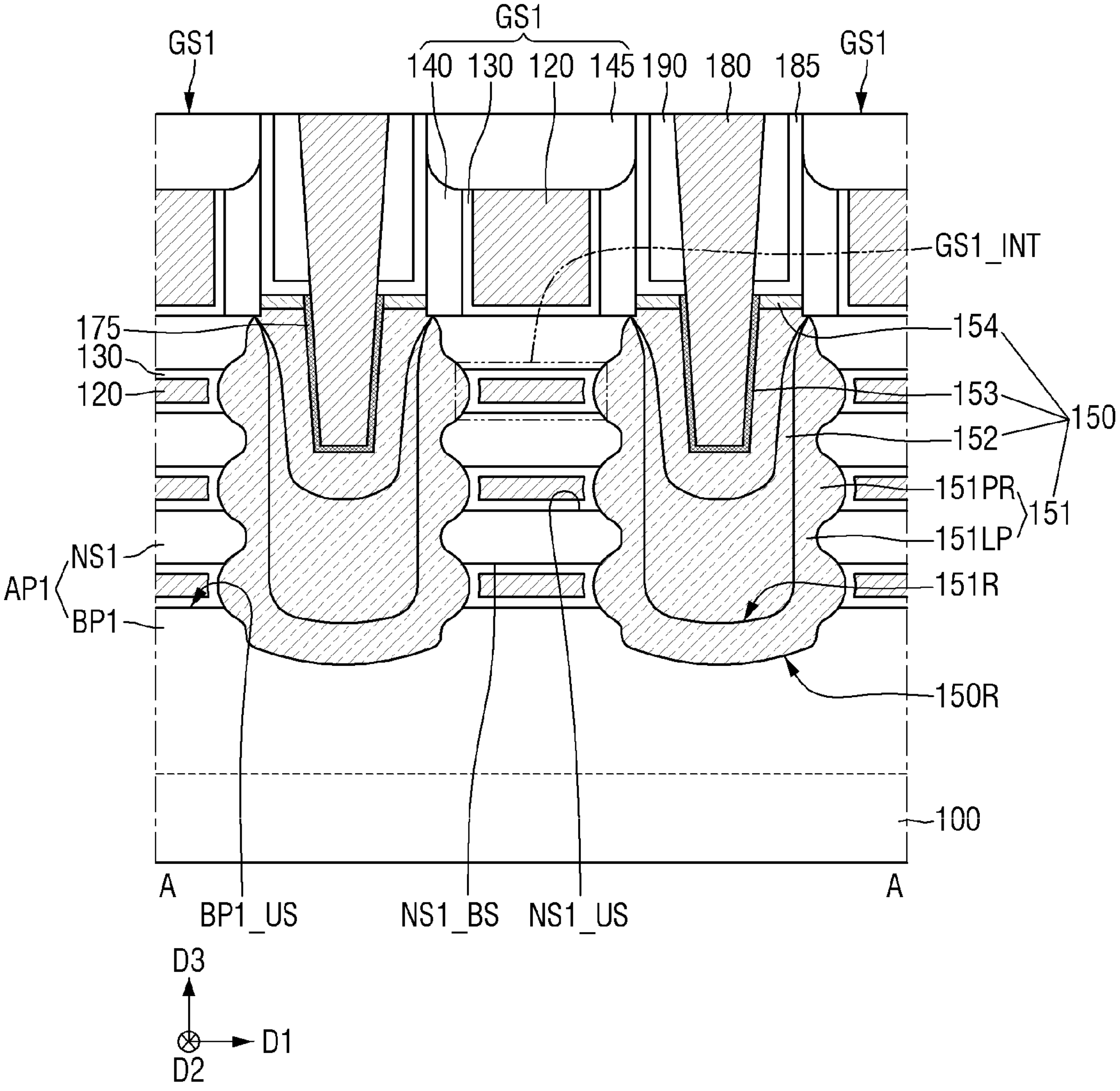

FIGS. 33 and 34 are diagrams for explaining a semiconductor device according to some embodiments, respectively.

For convenience of explanation, different points from those described using FIGS. 1 to 9 will be mainly described.

Referring to FIGS. 33 and 34, the semiconductor device according to some embodiments may further include a source/drain contact 180 disposed on the first source/drain pattern 150.

The source/drain contact 180 is connected to the first source/drain pattern 150. The source/drain contact 180 may be connected to the first source/drain pattern 150 through the interlayer insulating film 190 and the etching stop film 185. A bottom surface of the source/drain contact 180 may be at a lower level than an upper surface of the first source/drain pattern 150.

A metal silicide film 175 may be further disposed between the source/drain contact 180 and the first source/drain pattern 150. The source/drain contact 180 may contact the metal silicide film 175, and the metal silicide film 175 may contact the first source/drain pattern 150.

In FIG. 33, the bottom surface of the source/drain contact 180 may be at a higher level than the lower surface NS1_BS of the first nanosheet disposed at the uppermost part among the first sheet patterns NS1.

In FIG. 34, the bottom surface of the source/drain contact 180 may be located between the lower surface NS1_BS of the first sheet pattern NS1 disposed at the lowermost part among the first sheet patterns NS1 and the lower surface NS1_BS of the first sheet pattern NS1 disposed at the uppermost part.

Although the source/drain contact 180 is shown as a single film, this is only for convenience of explanation, and the embodiment is not limited thereto. The source/drain contact 180 may include, for example, at least one of metal, metal alloy, conductive metal nitride, conductive metal carbide, conductive metal oxide, conductive metal carbonitride, and two-dimensional (2D) material. The metal silicide film 175 may include a metal silicide.

FIGS. 35 to 38 are diagrams for explaining a semiconductor device according to some embodiments.

Figure 35:
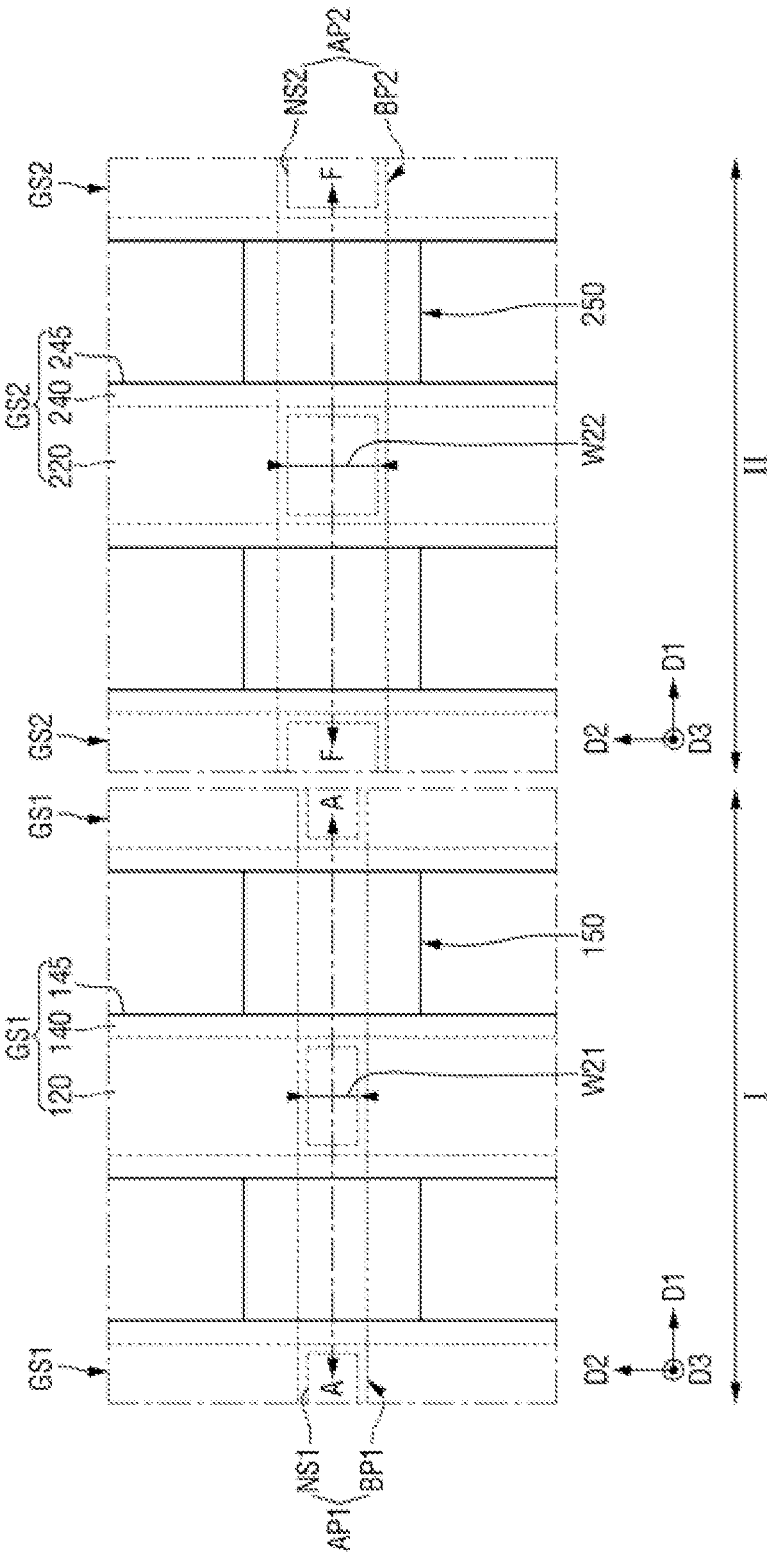
FIGS. 35 to 38 are diagrams for explaining the semiconductor device, according to some embodiments.
Figure 36:
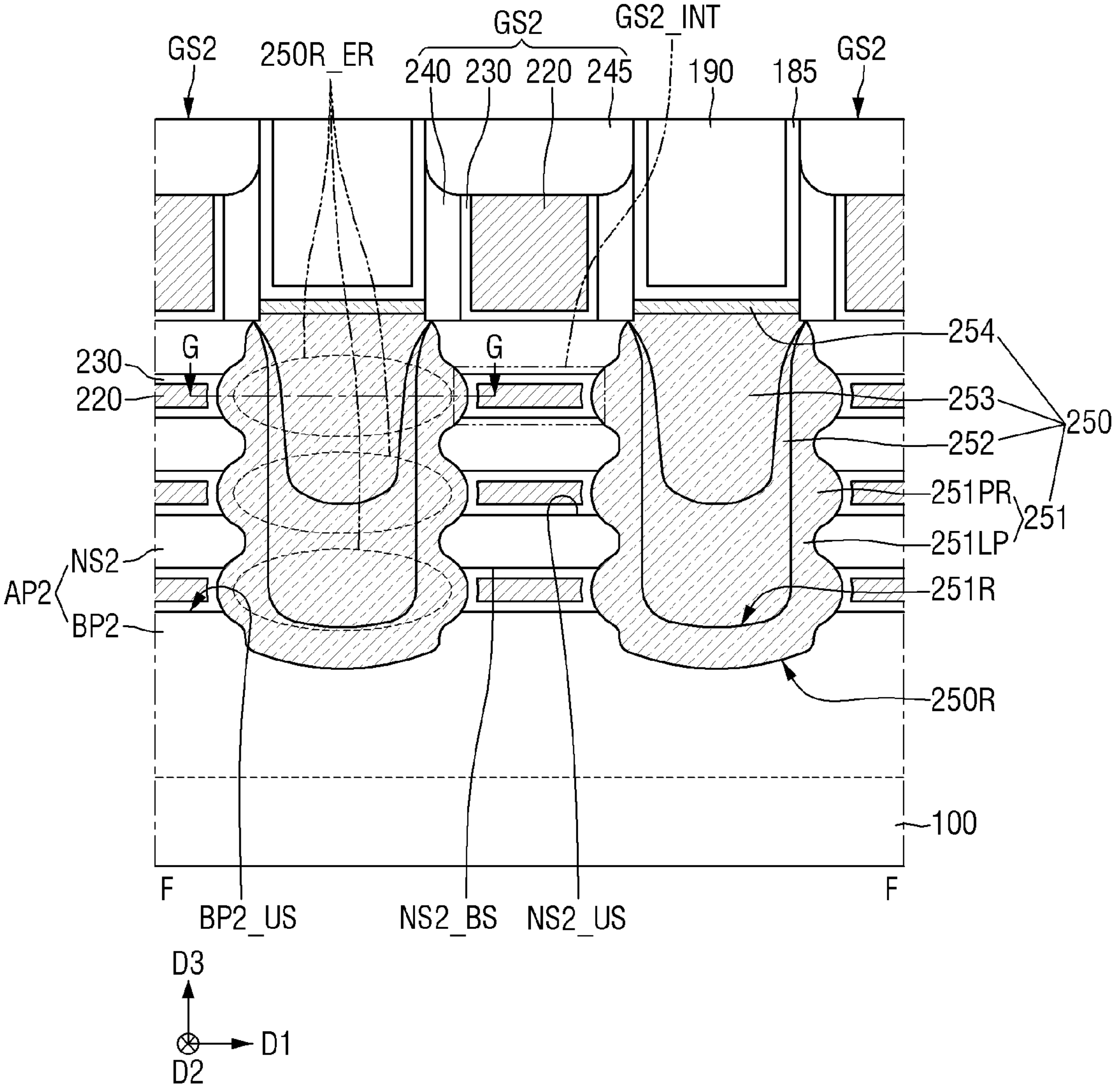
Figure 38:
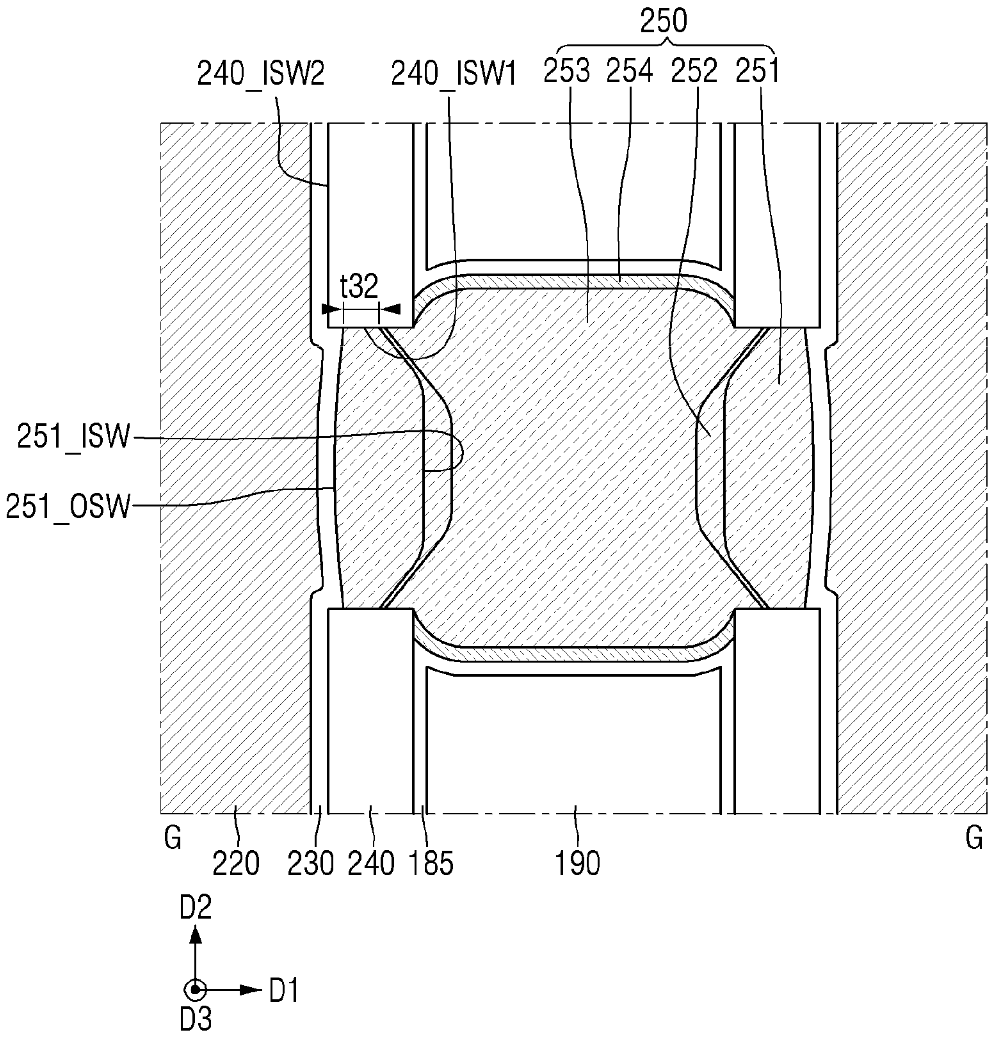

For reference, FIG. 35 is an exemplary plan view for explaining a semiconductor device according to some embodiments. FIG. 36 is a cross-sectional view taken along F-F of FIG. 35. FIG. 38 is a cross-sectional view taken along G-G of FIG. 36.

Figure 37:
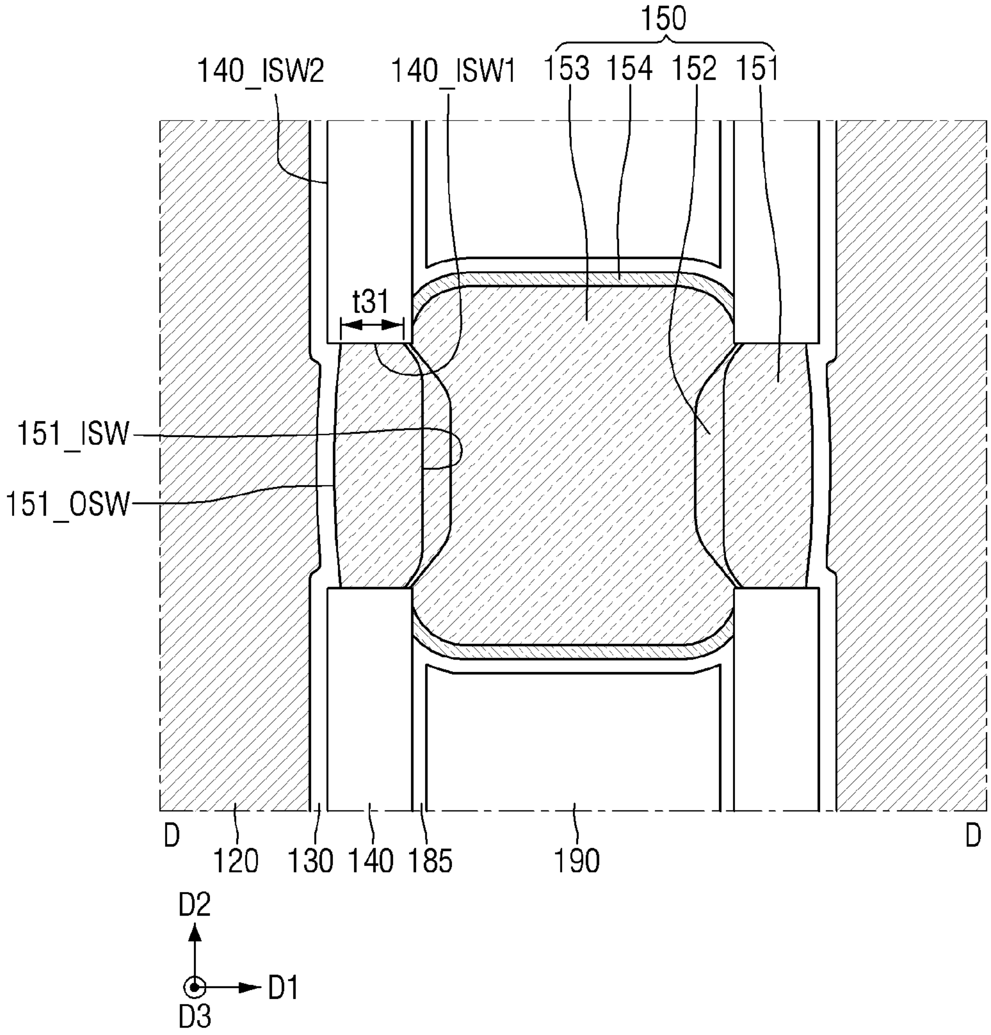

On the other hand, the cross-sectional view taken along A-A of FIG. 35 may be the same as one of FIGS. 2, 13, 15, 15, 17, 19, and 20. FIG. 37 may be a cross-sectional view taken along D-D of FIG. 2.

Further, the cross-sectional view taken along A-A of FIG. 35 may be similar to FIG. 21. In such a case, the second semiconductor blocking film 251 may have a double film structure in FIG. 36.

Although a boundary shape between the second inter-gate structure GS2_INT and the second source/drain pattern 250 in FIG. 36 is shown as being the same as the boundary shape between the first inter-gate structure GS1_INT and the first source/drain pattern 150 in FIG. 2, the embodiment is not limited thereto.

In addition, the description of a first region I of FIG. 35 may be the same as that described using FIGS. 1 to 30. Therefore, the following description will focus on the content relating to a second region II of FIG. 35. As used herein, terms such as “same,” “equal,” “planar,” or “coplanar,” when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Referring to FIGS. 35 to 38, the semiconductor devices according to some embodiments may include a first active pattern AP1, a plurality of first gate structures GS1, a first source/drain pattern 150, a second active pattern AP2, a plurality of second gate structures GS2, and a second source/drain pattern 250.

The substrate 100 may include the first region I and the second region II. The first region I and the second region II may be regions in which a PMOS is formed.

The first active pattern AP1, the plurality of first gate structures GS1, and the first source/drain pattern 150 are disposed in the first region I of the substrate 100. The second active pattern AP2, the plurality of second gate structures GS2, and the second source/drain pattern 250 are disposed in the second region II of the substrate 100.

The second active pattern AP2 may include a second lower pattern BP2 and a plurality of second sheet patterns NS2. The plurality of second sheet patterns NS2 may be spaced apart from the second lower pattern BP2 in the third direction D3. The second sheet pattern NS2 includes an upper surface NS2_US and a lower surface NS2_BS, which are opposite to each other in the third direction D3. The second lower pattern BP2 and the second sheet pattern NS2 may include one of silicon or germanium which is an elemental semiconductor material, a group IV-IV compound semiconductor, or a group III-V compound semiconductor. In the semiconductor device according to some embodiments, the second lower pattern BP2 may be a silicon lower pattern including silicon, and the second sheet pattern NS2 may be a silicon sheet pattern including silicon.

The width of the second lower pattern BP2 in the second direction D2 is greater than the width of the first lower pattern BP1 in the second direction D2. The width W22 of the second sheet pattern NS2 in the second direction D2 is greater than the width of the first sheet pattern NS1 in the second direction D2.

The plurality of second gate structures GS2 may be disposed on the substrate 100. The second gate structure GS2 may be disposed on the second active pattern AP2. The second gate structure GS2 may intersect the second active pattern AP2. The second gate structure GS2 may intersect the second lower pattern BP2. The second gate structure GS2 may wrap each second sheet pattern NS2. The second gate structure GS2 may include a second inter-gate structure GS2_INT that is disposed between the second sheet patterns NS2 adjacent to each other in the third direction D3, and between the second lower pattern BP2 and the second sheet pattern NS2.

The second gate structure GS2 may include, for example, a second gate electrode 220, a second gate insulating film 230, a second gate spacer 240, and a second gate capping pattern 245. The second gate spacer 240 may include an inner side wall 240_ISW2 and a connecting side wall 240_ISW1. Since the descriptions of the second gate electrode 220, the second gate insulating film 230, the second gate spacer 240, and the second gate capping pattern 245 are the same as the descriptions of the first gate electrode 120, the first gate insulating film 130, the first gate spacer 140, and the first gate capping pattern 145, respectively, the descriptions thereof will not be provided below.

The second source/drain pattern 250 may be formed on the second active pattern AP2. The second source/drain pattern 250 may be formed on the second lower pattern BP2. The second source/drain pattern 250 may be connected to the second sheet pattern NS2. The second source/drain pattern 250 may be included in a source/drain of a transistor that uses the second sheet pattern NS2 as a channel region.

The second source/drain pattern 250 may be disposed inside the second source/drain recess 250R. The second source/drain recess 250R may include a plurality of width extension regions 250R_ER. The width extension region 250R_ER of each second source/drain recess 250R may include a portion that has an increased width in the first direction D1, and a portion which has a decreased width in the first direction D1, as it goes away from the upper surface BP2_US of the second lower pattern BP2. For example, the width extension region 250R_ER may include a portion that has an increased width in the first direction D1 as the distance from the second lower pattern BP2 increases in the third direction D3, and a portion which has a decreased width in the first direction D1 as the distance from the second lower pattern BP2 increases in the third direction D3.

The second source/drain pattern 250 may be in contact with the second sheet pattern NS2 and the second lower pattern BP2. A part of the second source/drain pattern 250 may be in contact with the connecting side wall 240_ISW1 of the second gate spacer 240. The second gate insulating film 230 of the second inter-gate structure GS2_INT is in contact with the second source/drain pattern 250.

The second source/drain pattern 250 may include a second semiconductor blocking film 251, a second lower semiconductor filling film 252, a second upper semiconductor filling film 253, and a second semiconductor capping film 254. The second semiconductor blocking film 251 may include an outer side wall 251_OSW and an inner side wall 251_ISW. The second semiconductor blocking film 251 may include a liner portion 251LP and a protruding portion 251PR.

Since the description of the shape and the material of the second source/drain pattern 250 is the same as the description of the shape and the material of the first source/drain pattern 150, the description thereof will not be provided below.

A thickness t31 of the first semiconductor blocking film 151 that is in contact with the connecting side wall 140_ISW1 of the first gate spacer 140 in FIG. 37 is greater than a thickness t32 of the first semiconductor blocking film 151 that is in contact with the connecting side wall 240_ISW1 of the second gate spacer 240 in FIG. 38.

On the other hand, the width W22 of the second sheet pattern NS2 in the second direction D2 is greater than the width of the first sheet pattern NS1 in the second direction D2.

In other words, in the portion which is in contact with the gate insulating film, the thickness of the semiconductor blocking film which is in contact with the connecting side wall of the gate spacer may decrease, as the width of the sheet pattern in the second direction D2 increases.

Figure 39:
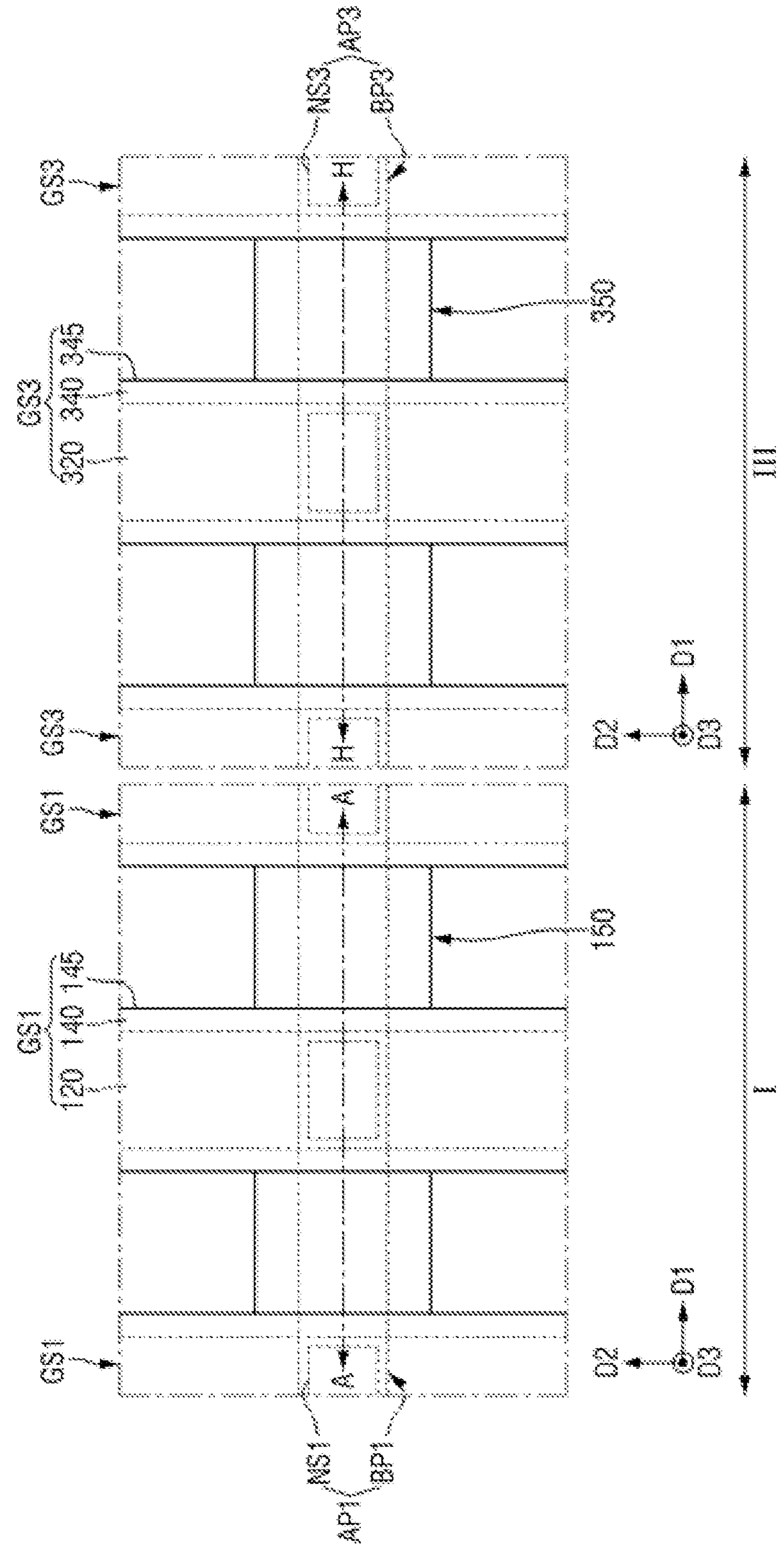
FIGS. 39 to 41 are diagrams for explaining the semiconductor device, according to some embodiments.
Figure 40:
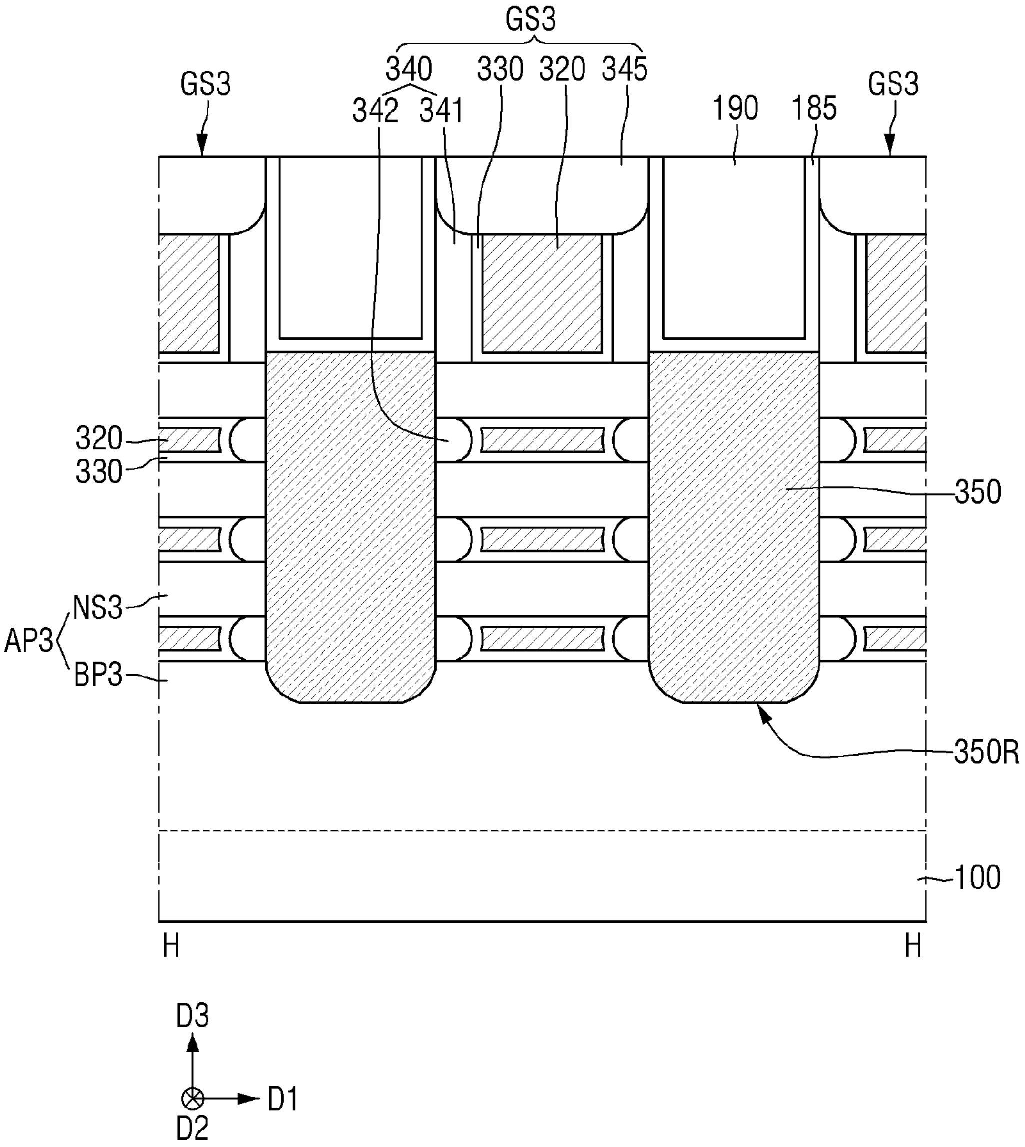
Figure 41:
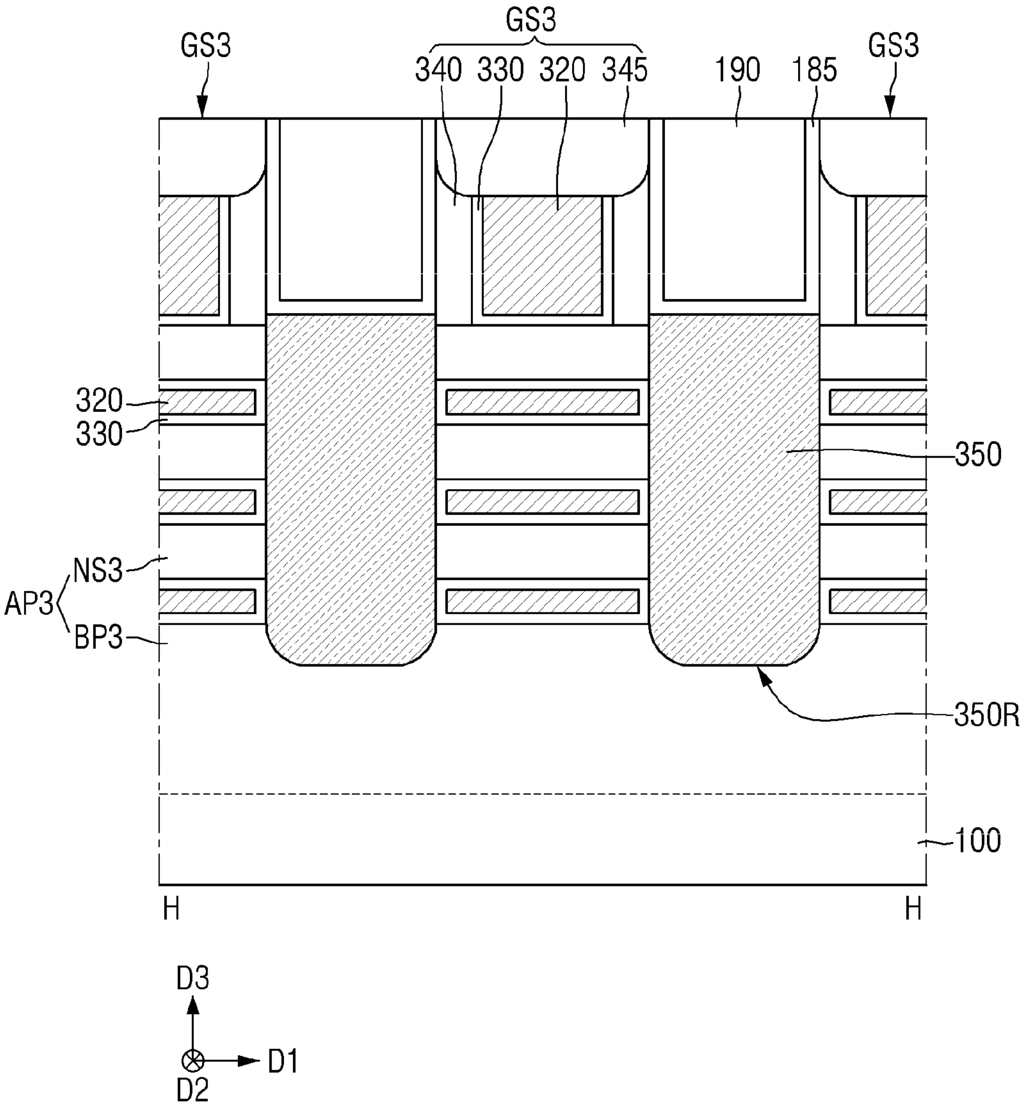

FIGS. 39 to 41 are diagrams for explaining a semiconductor device according to some embodiments. For reference, FIG. 39 is an exemplary plan view for explaining a semiconductor device according to some embodiments. FIGS. 40 and 41 are cross-sectional views taken along H-H of FIG. 39.

Further, the cross-sectional views taken along A-A of FIG. 39 may be the same as one of FIGS. 2, 13, 15, 17, 19, 20, 21, 27, 29, 31 and 32. In addition, the description of the first region I of FIG. 39 may be the same as that described using FIGS. 1 to 32. Therefore, the following description will focus on the contents relating to a third region III of FIG. 39.

Referring to FIGS. 39 to 41, the semiconductor device according to some embodiments may include a first active pattern AP1, a plurality of first gate structures GS1, a first source/drain pattern 150, a third active pattern AP3, a plurality of third gate structures GS3, and a third source/drain pattern 350.

The substrate 100 may include the first region I and the third region III. The first region I may be a region in which a PMOS is formed, and the third region III may be a region in which an NMOS is formed.

The first active pattern AP1, the plurality of first gate structures GS1, and the first source/drain pattern 150 are disposed in the first region I of the substrate 100. The third active pattern AP3, the plurality of third gate structures GS3, and the third source/drain pattern 350 are disposed in the third region III of the substrate 100.

The third active pattern AP3 may include a third lower pattern BP3, and a plurality of third sheet patterns NS3. The plurality of third sheet patterns NS3 may be spaced apart from the third lower pattern BP3 in the third direction D3. The third lower pattern BP3 and the third sheet pattern NS3 may include one of silicon or germanium which is an elemental semiconductor material, a group Iv-Iv compound semiconductor, or a group III-v compound semiconductor. In the semiconductor device according to some embodiments, the third lower pattern BP3 may be a silicon lower pattern including silicon, and the third sheet pattern NS3 may be a silicon sheet pattern including silicon.

A plurality of third gate structures GS3 may be disposed on the substrate 100. The third gate structure GS3 may be disposed on the third active pattern AP3. The third gate structure GS3 may intersect the third active pattern AP3. The third gate structure GS3 may intersect the third lower pattern BP3. The third gate structure GS3 may wrap each third sheet pattern NS2. The third gate structure GS3 may include, for example, a third gate electrode 320, a third gate insulating film 330, a third gate spacer 340, and a third gate capping pattern 345.

In FIG. 40, unlike the first gate spacer 140, the third gate spacer 340 may include an outer spacer 341 and an inner spacer 342. The inner spacer 342 may be disposed between the third sheet patterns NS3 adjacent to each other in the third direction D3. The inner spacer 342 may be in contact with the third gate insulating film 330. The inner spacer 342 may define a part of the third source/drain recess 350R.

In FIG. 41, the third gate spacer 340 does not include an inner spacer, like the first gate spacer 140. That is, the third gate insulating film 330 may be in contact with the third source/drain pattern 350.

Since the descriptions of the third gate electrode 320, the third gate insulating film 330, the third gate spacer 340, and the third gate capping pattern 345 are the same as the descriptions of the first gate electrode 120, the first gate insulating film 130, the first gate spacer 140, and the first gate capping pattern 145, respectively, the description thereof will not be provided.

The third source/drain pattern 350 may be formed on the third active pattern AP3. The third source/drain pattern 350 may be formed on the third lower pattern BP3. The third source/drain pattern 350 may be connected to the third sheet pattern NS2. The third source/drain pattern 350 may be included in a source/drain of a transistor that uses the third sheet pattern NS3 as a channel region.

The third source/drain pattern 350 may be disposed inside the third source/drain recess 350R. The bottom surface of the third source/drain recess 350R may be defined by the third lower pattern BP3. The side walls of the third source/drain recess 350R may be defined by the third nanosheet NS3 and the third gate structure GS3.

The third source/drain pattern 350 may include silicon doped with n-type impurities. The n-type impurities may be, but are not limited to, for example, phosphorus (P) or arsenic (As).

As in FIG. 41, when the third source/drain pattern 350 is in contact with the third gate insulating film 330, unlike that explained above, the third source/drain pattern 350 may include a silicon-germanium liner that extends along the profile of the third source/drain recess 350R. The third source/drain pattern 350 may include silicon doped with n-type impurities on the silicon-germanium liner.

FIGS. 42 to 49 are intermediate stage diagrams for explaining the method for fabricating the semiconductor device according to some embodiments. FIGS. 42 to 49 may be cross-sectional views taken along A-A of FIG. 1. The following fabricating method will be described in terms of a cross-sectional view.

Figure 42:
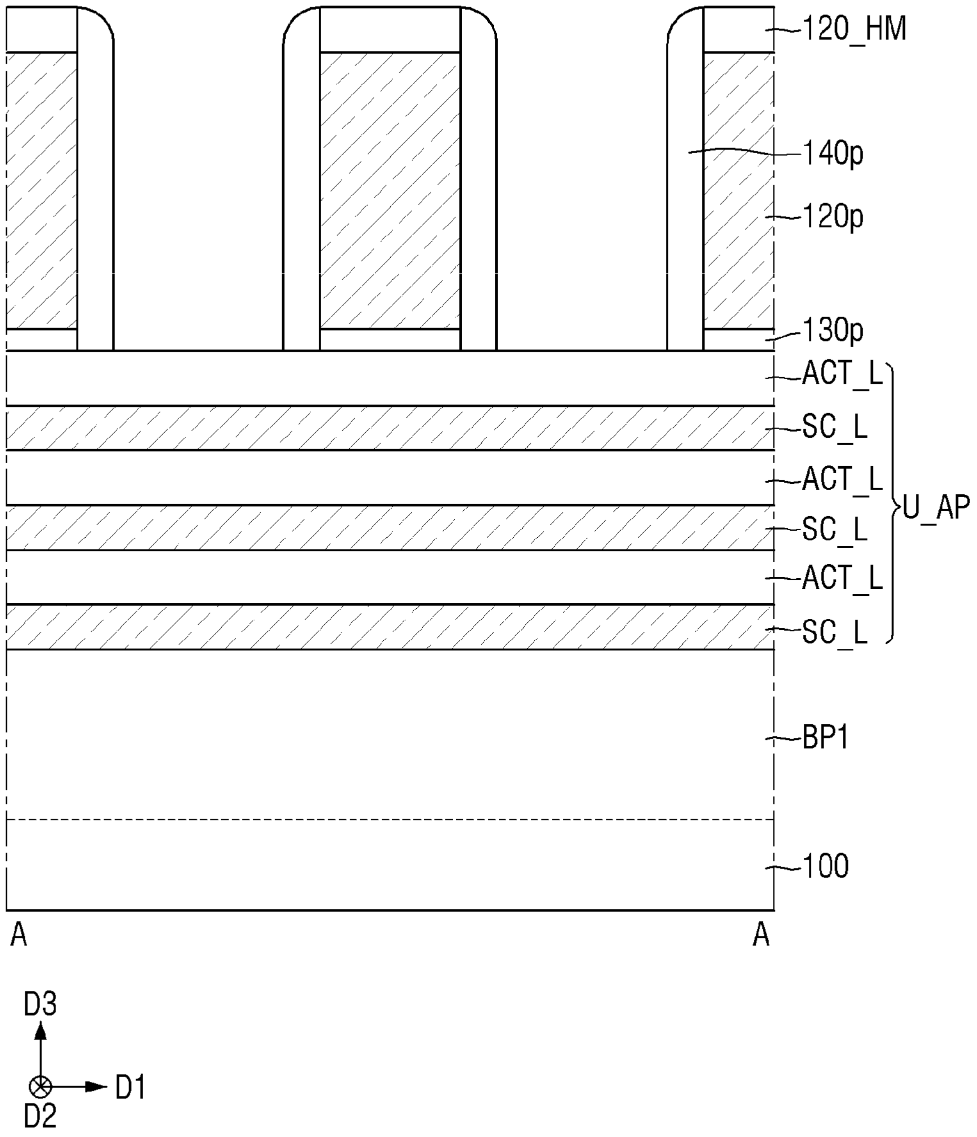
FIGS. 42 to 49 are intermediate stage diagrams for explaining a method for fabricating the semiconductor device, according to some embodiments.

Referring to FIG. 42, the first lower pattern BP1 and the upper pattern structure U_AP may be formed on the substrate 100.

The upper pattern structure U_AP may be disposed on the first lower pattern BP1. The upper pattern structure U_AP may include a sacrificial pattern SC_L and an active pattern ACT_L that are alternately stacked on the first lower pattern BP1. For example, the sacrificial pattern SC_L may include a silicon-germanium film. The active pattern ACT_L may include a silicon film. The fraction of germanium of the sacrificial pattern SC_L is greater than the fraction of germanium of the first semiconductor blocking film 151 of FIG. 2.

Subsequently, a dummy gate insulating film 130*p*, a dummy gate electrode 120*p*, and a dummy gate capping film 120_HM may be formed on the upper pattern structure U_AP. The dummy gate insulating film 130*p* may include, but is not limited to, for example, silicon oxide. The dummy gate electrode 120*p* may include, but is not limited to, for example, polysilicon. The dummy gate capping film 120_HM may include, but is not limited to, for example, silicon nitride.

A pre gate spacer 140*p* may be formed on the side wall of the dummy gate electrode 120*p*.

Figure 43:
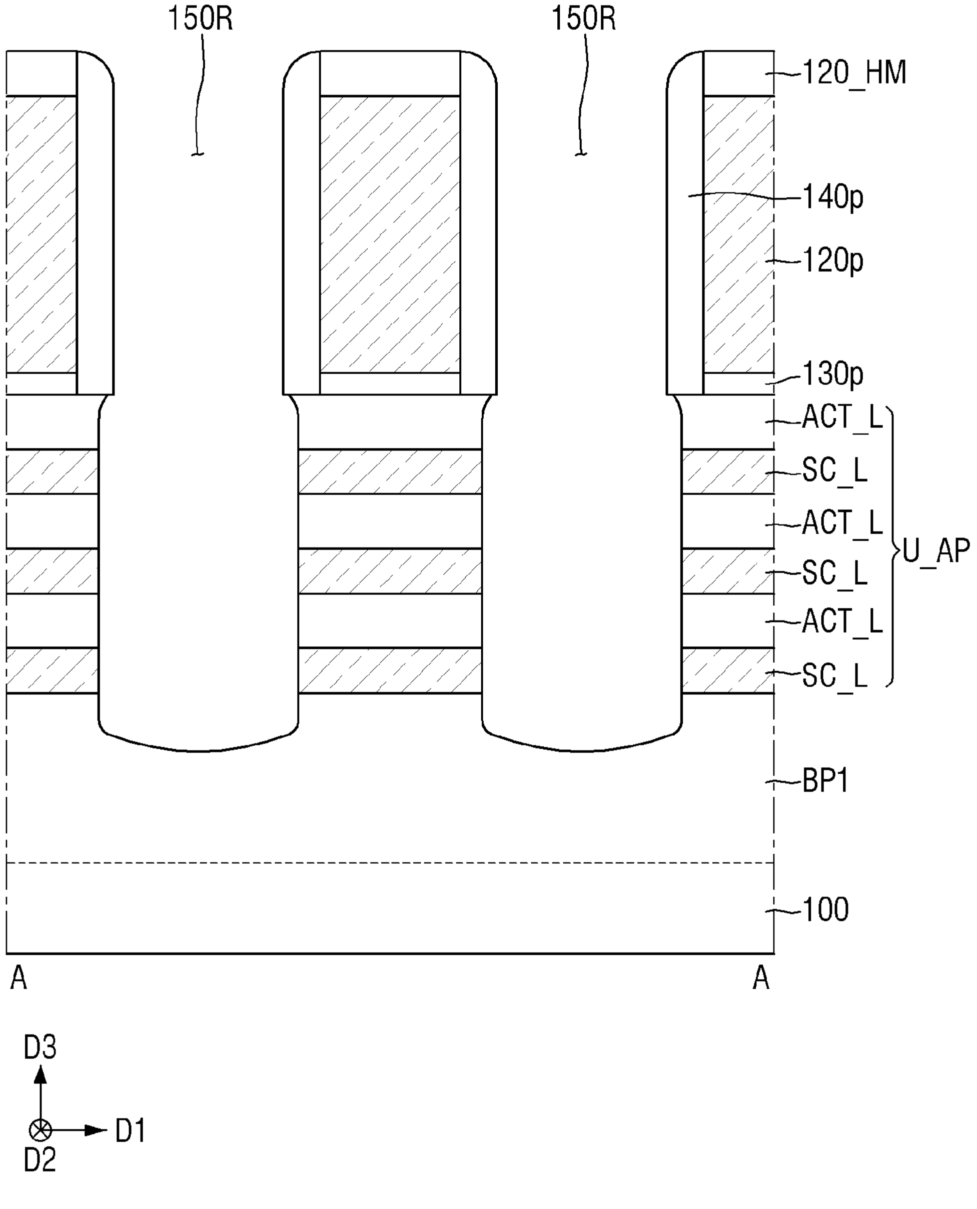

Referring to FIG. 43, the first source/drain recess 150R may be formed in the upper pattern structure U_AP, using the dummy gate electrode 120*p* as a mask.

A part of the first source/drain recess 150R may be formed inside the first lower pattern BP1.

Figure 44:
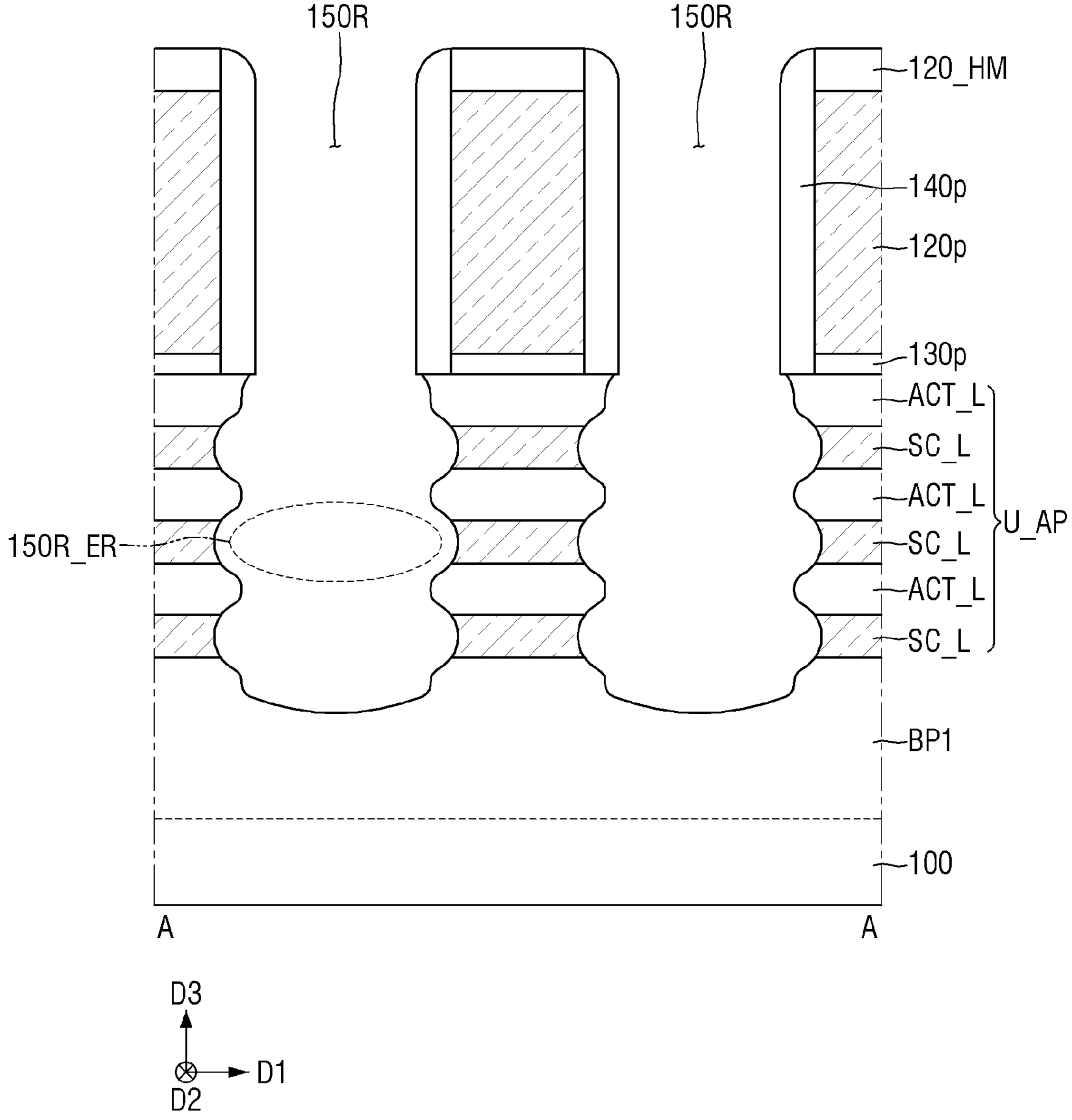

Referring to FIG. 44, a part of the sacrificial pattern SC_L exposed by the first source/drain recess 150R may be removed.

Accordingly, width extension regions 150R_ER of a plurality of first source/drain recesses 150R may be formed.

Figure 45:
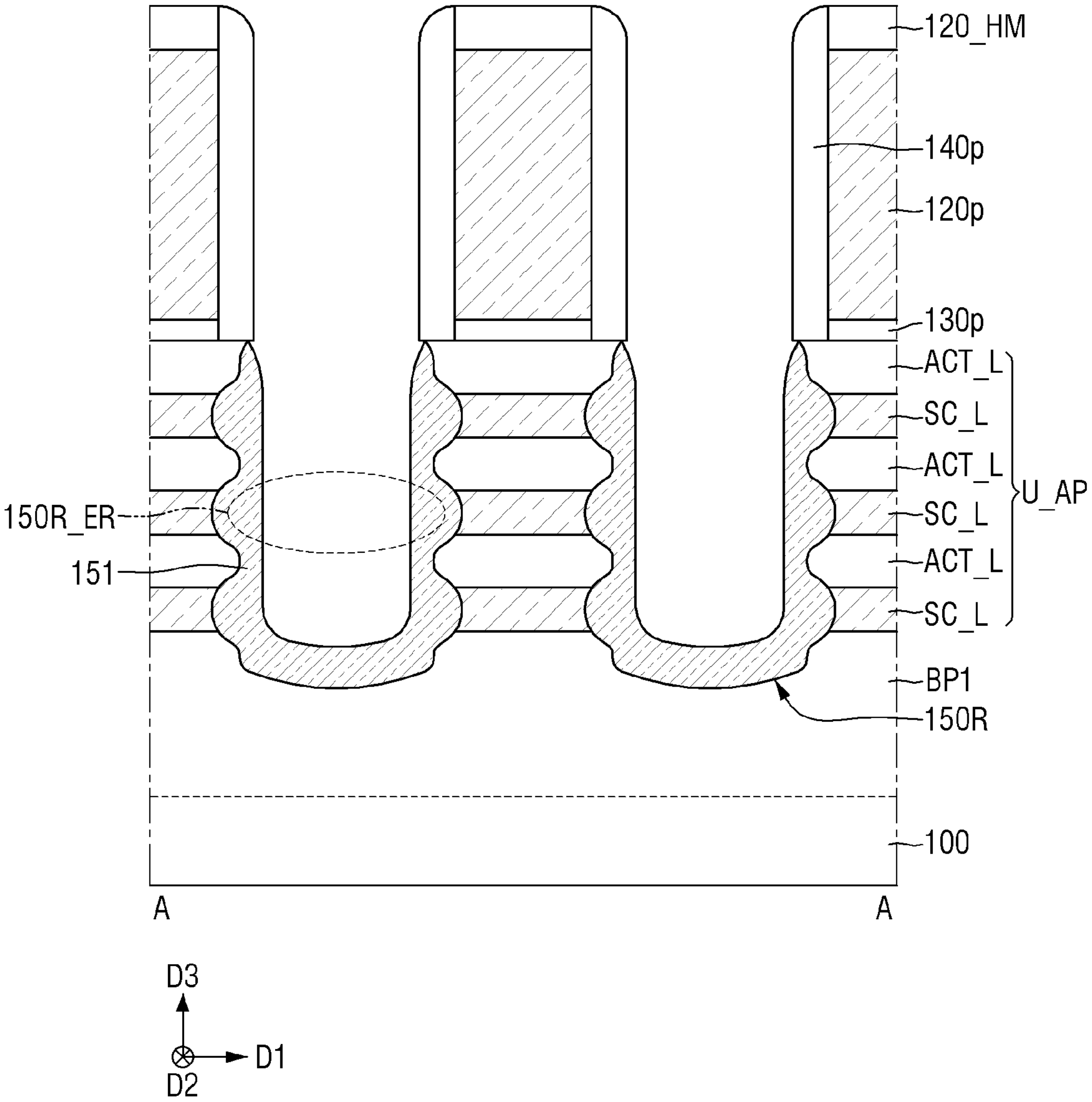
Figure 46:
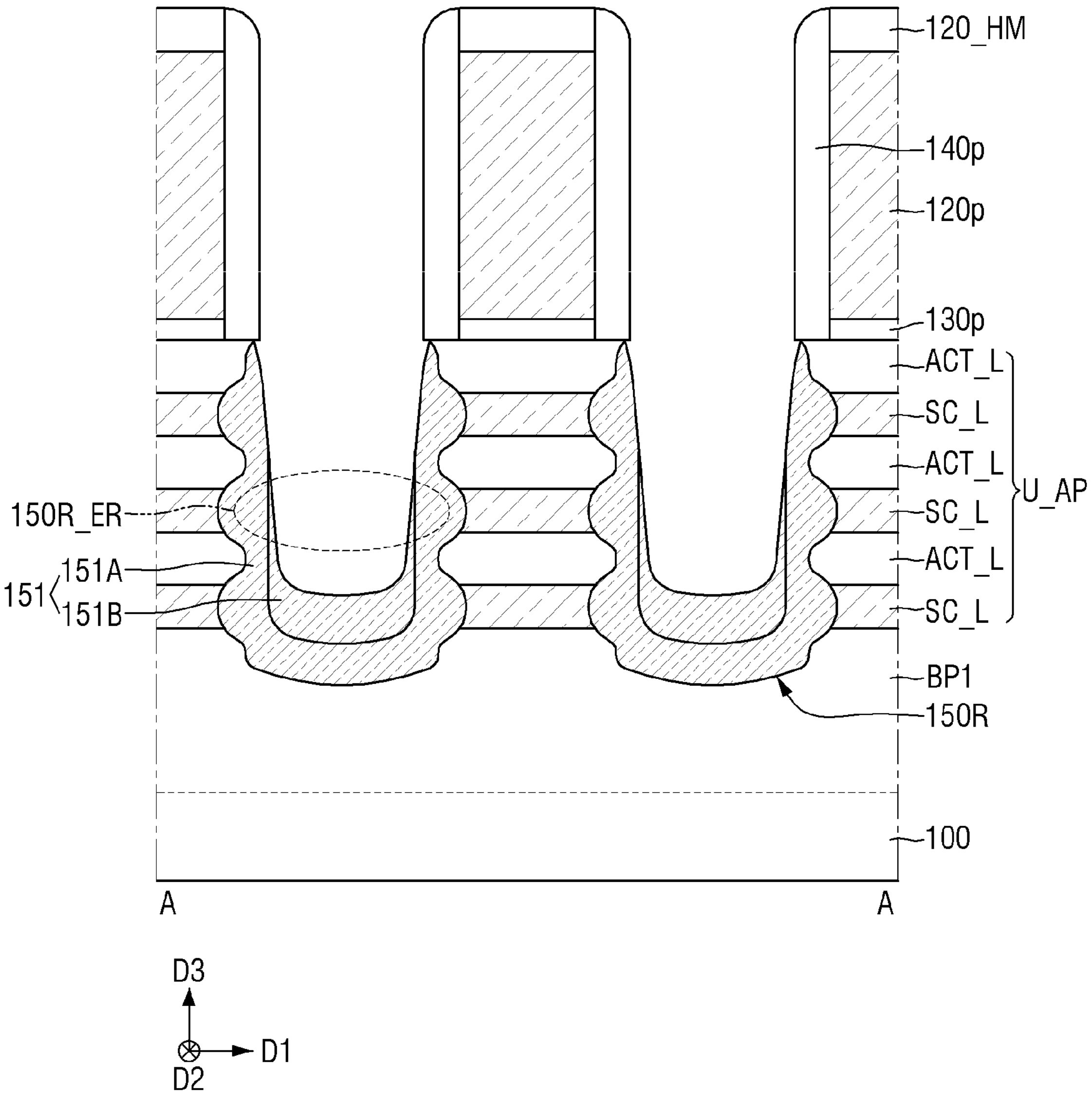

Referring to FIGS. 45 and 46, the first semiconductor blocking film 151 may be formed continuously along the first source/drain recess 150R. The first semiconductor blocking film 151 may include silicon-germanium.

Subsequently, silicon atoms and germanium atoms included in the first semiconductor blocking film 151 may be moved, through a heat treatment process. The first lower semiconductor blocking film 151A and the first upper semiconductor blocking film 151B may be formed accordingly.

The first upper semiconductor blocking film 151B is a film formed by moving the silicon atoms and germanium atoms included in the first semiconductor blocking film 151 of FIG. 45.

Figure 47:
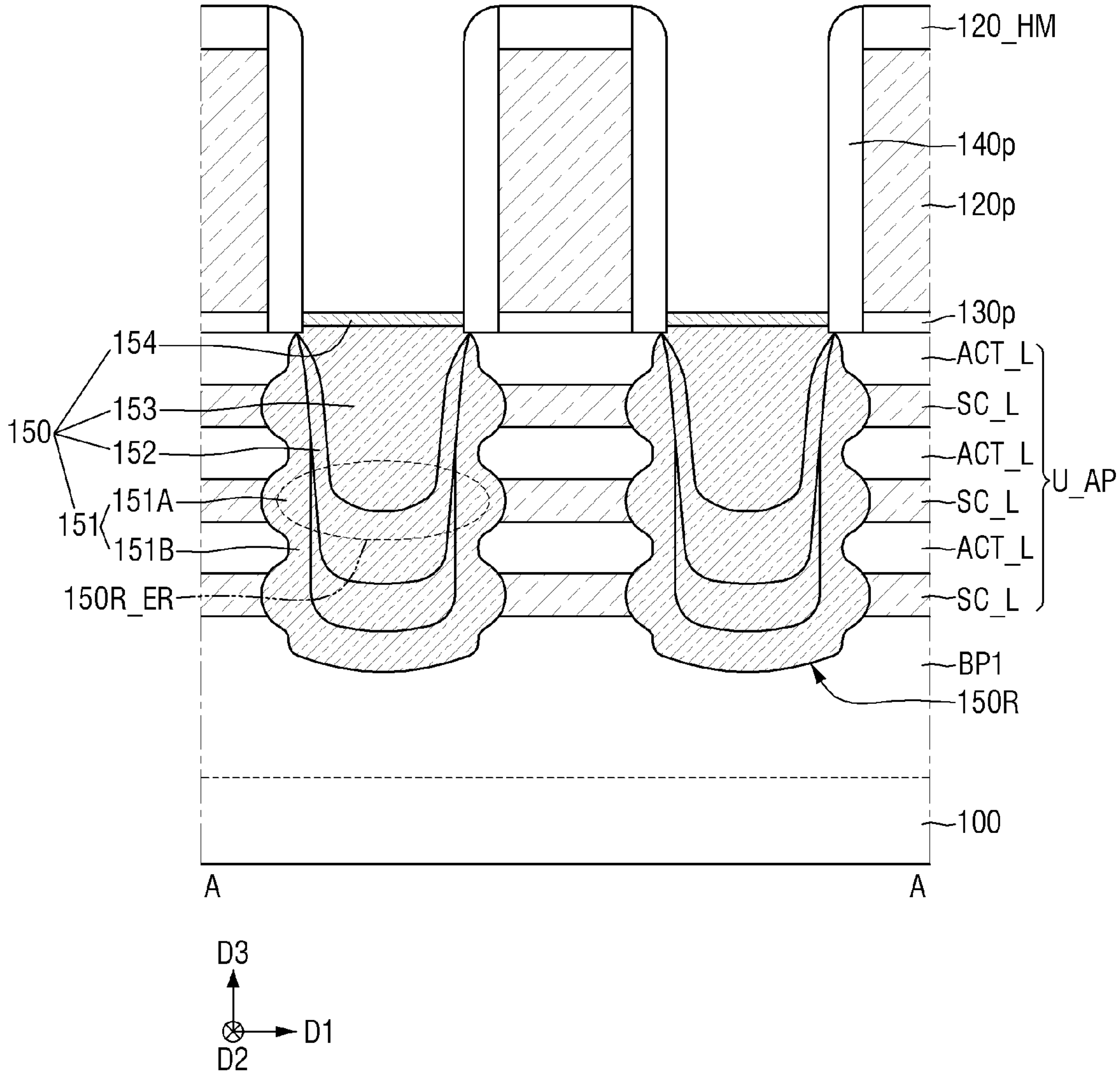

Referring to FIG. 47, the first lower semiconductor filling film 152 and the first upper semiconductor filling film 153 may be sequentially formed on the first upper semiconductor blocking film 151B. Subsequently, the first semiconductor capping film 154 may be formed on the first upper semiconductor filling film 153.

Unlike that described above, in some embodiments, after the first semiconductor blocking film 151 of FIG. 45 is formed, the first semiconductor filling films 152 and 153 and the first semiconductor capping film 154 described in FIG. 47 may be formed.

Figure 48:
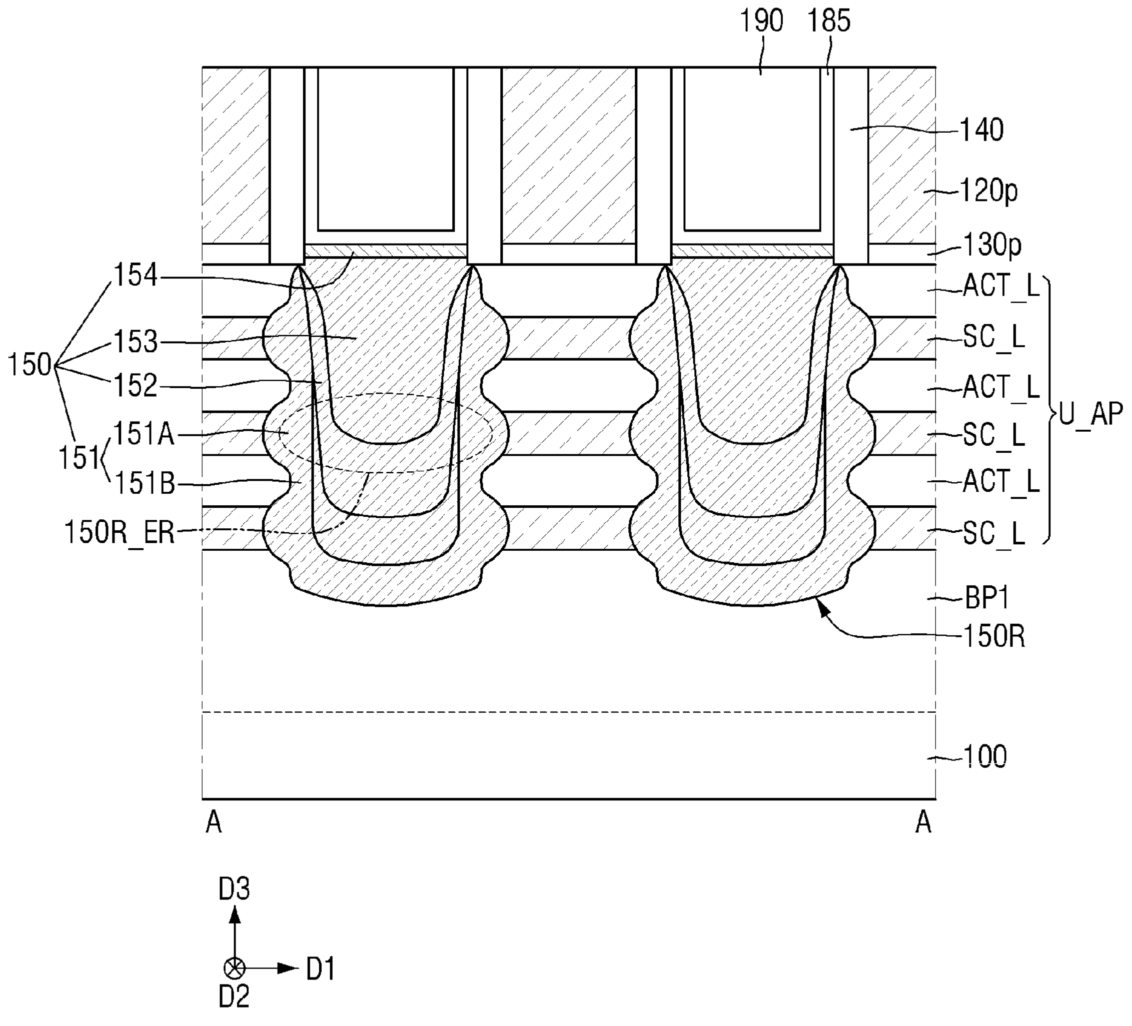

Referring to FIG. 48, the etching stop film 185 and the interlayer insulating film 190 are sequentially formed on the first source/drain pattern 150. Subsequently, a part of the interlayer insulating film 190, a part of the etching stop film 185, and the dummy gate capping film 120_HM are removed to expose the upper surface of the dummy gate electrode 120*p*. The first gate spacer 140 may be formed, while the upper surface of the dummy gate electrode 120*p* is being exposed.

Figure 49:
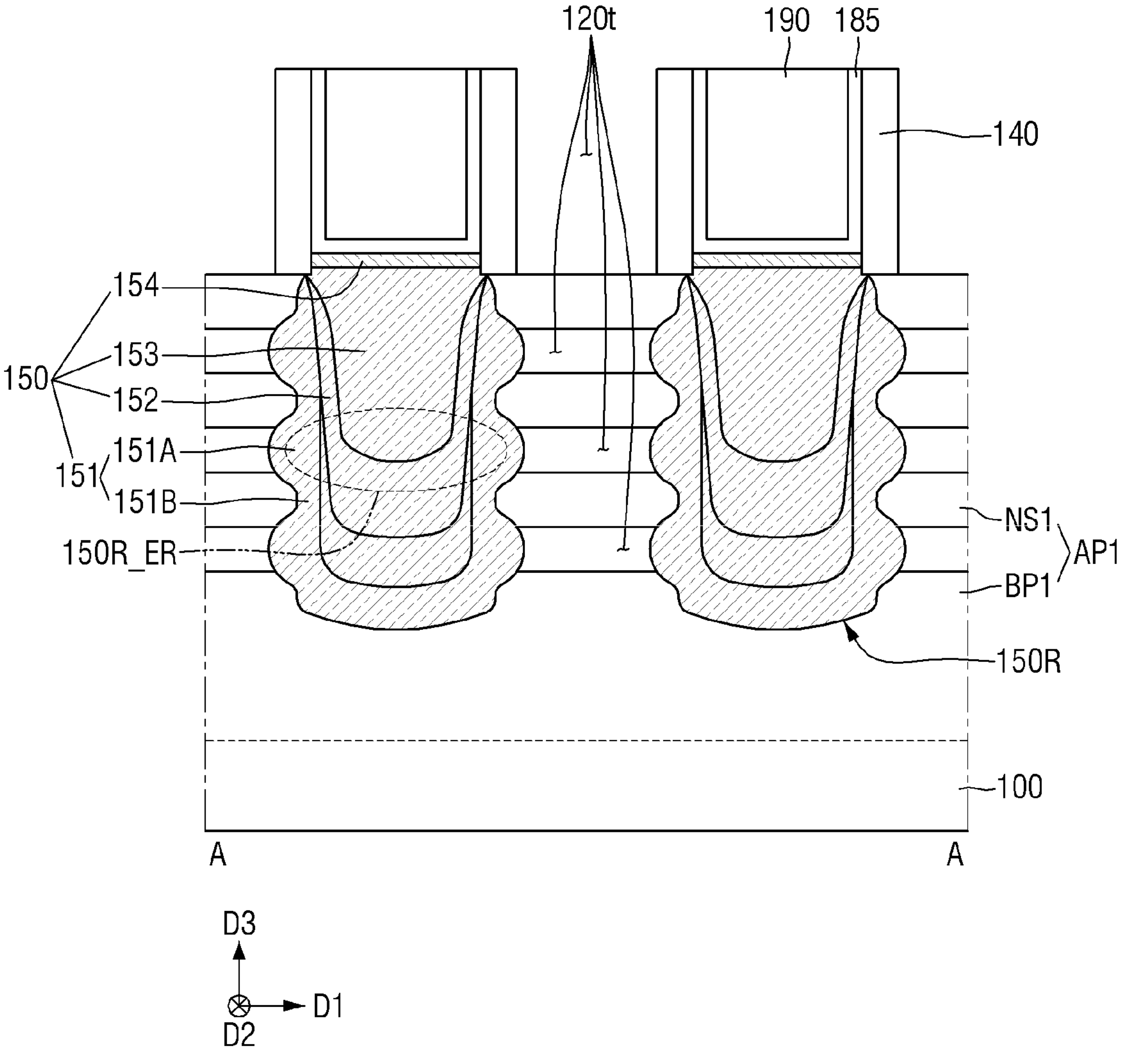

Referring to FIG. 49, the dummy gate insulating film 130*p* and the dummy gate electrode 120*p* are removed to expose the upper pattern structure U_AP between the first gate spacers 140. Subsequently, the sacrificial pattern SC_L may be removed to form the first sheet pattern NS1. The first gate trench 120*t* is formed between the first gate spacers 140 accordingly. Further, the first active pattern AP1 including the first lower pattern BP1 and the first sheet pattern NS1 is formed.

Subsequently, referring to FIG. 2, the first gate insulating film 130 and the first gate electrode 120 may be formed inside the first gate trench 120*t*. Moreover, the first gate capping pattern 145 may be formed.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device comprising:

an active pattern including a lower pattern extending in a first direction, and a plurality of sheet patterns spaced apart from the lower pattern in a second direction perpendicular to the first direction;

a plurality of gate structures disposed on the lower pattern to be spaced apart from each other in the first direction and including a gate electrode and a gate insulating film, the gate electrode and the gate insulating film wrapping the plurality of sheet patterns;

a source/drain recess defined between adjacent gate structures of the plurality of gate structures; and a source/drain pattern disposed inside the source/drain recess, and including a semiconductor blocking film which is in contact with the gate insulating film, the lower pattern, and the plurality of sheet patterns and a semiconductor filling film which fills a liner recess defined by the semiconductor blocking film, wherein the semiconductor blocking film includes a lower semiconductor blocking film which is in contact with the sheet patterns and formed continuously along the source/drain recess, and an upper semiconductor blocking film formed on the lower semiconductor blocking film, wherein the semiconductor blocking film and the semiconductor filling film are formed of silicon-germanium, wherein each of the plurality of gate structures includes an inter-gate structure including the gate electrode and the gate insulating film disposed between the lower pattern and the plurality of sheet patterns, and between adjacent sheet patterns of the plurality of sheet patterns, and wherein each of the plurality of sheet patterns protrudes in the first direction from a side wall of the inter-gate structure adjacent in the second direction.

2. The semiconductor device of claim 1, wherein a fraction of germanium of the silicon-germanium forming the lower semiconductor blocking film is greater than a fraction of germanium of the silicon-germanium forming the upper semiconductor blocking film.

3. The semiconductor device of claim 1, wherein a fraction of germanium of the silicon-germanium forming the semiconductor blocking film is smaller than a fraction of germanium of the silicon-germanium forming the semiconductor filling film.

4. The semiconductor device of claim 1, wherein the semiconductor blocking film formed along a side wall of the source/drain recess includes a pinning region, and wherein in the pinning region, a thickness of the semiconductor blocking film decreases and then increases, as the semiconductor blocking film extends away from the lower pattern.

5. The semiconductor device of claim 1, wherein the semiconductor blocking film includes a liner portion extending along a side wall of the source/drain recess and a bottom surface of the source/drain recess, and a protruding portion protruding from the liner portion in the first direction.

6. The semiconductor device of claim 5, wherein the protruding portion of the semiconductor blocking film protrudes in the first direction toward the inter-gate structure.

7. A semiconductor device comprising:

an active pattern including a lower pattern extending in a first direction, and a plurality of sheet patterns spaced apart from the lower pattern in a second direction perpendicular to the first direction;

a plurality of gate structures disposed on the lower pattern to be spaced apart from each other in the first direction and including a gate electrode and a gate insulating film, the gate electrode and the gate insulating film wrapping the plurality of sheet patterns;

a source/drain recess defined between gate structures adjacent to each other of the plurality of gate structures; and a source/drain pattern disposed inside the source/drain recess, and including a semiconductor blocking film formed continuously along the source/drain recess and a semiconductor filling film which fills a liner recess defined by the semiconductor blocking film, wherein the semiconductor blocking film includes a lower semiconductor blocking film which is in contact with the sheet patterns and formed continuously along the source/drain recess, and an upper semiconductor blocking film formed on the lower semiconductor blocking film, wherein the semiconductor blocking film and the semiconductor filling film are formed of silicon-germanium, wherein the source/drain recess includes a plurality of width extension regions, wherein a width of each of the width extension regions in the first direction increases and then decreases as the width extension regions extend away from an upper surface of the lower pattern, and wherein a fraction of germanium of the silicon-germanium forming the lower semiconductor blocking film is greater than a fraction of germanium of the silicon-germanium forming the upper semiconductor blocking film.

8. The semiconductor device of claim 7, wherein regions in which the widths of the width extension regions in the first direction are maximum are located between the lower pattern and the sheet patterns and between the sheet patterns adjacent to each other in the second direction.

9. The semiconductor device of claim 7, wherein the fraction of germanium of the silicon-germanium forming the lower semiconductor blocking film is smaller than a fraction of germanium of the silicon-germanium forming the semiconductor filling film, and wherein the fraction of germanium of the silicon-germanium forming the upper semiconductor blocking film is smaller than the fraction of germanium of the silicon-germanium forming the semiconductor filling film.

10. The semiconductor device of claim 7, wherein the semiconductor blocking film further includes a lower insertion semiconductor blocking film and an upper insertion semiconductor blocking film sequentially formed on the upper semiconductor blocking film, and wherein a fraction of germanium of the lower insertion semiconductor blocking film is greater than a fraction of germanium of the upper insertion semiconductor blocking film.

11. The semiconductor device of claim 7, wherein the semiconductor blocking film is in contact with the gate insulating film, and wherein in a cross-sectional view taken along the lower pattern, an outer side wall of the semiconductor blocking film which forms a boundary with the gate insulating film is convex toward the gate electrode.

12. The semiconductor device of claim 7, further comprising:

a semiconductor residue pattern disposed between the gate insulating film and adjacent sheet patterns of the plurality of sheet patterns, and between the gate insulating film and the semiconductor blocking film, wherein a fraction of germanium of the semiconductor residue pattern is greater than a fraction of germanium of the semiconductor blocking film.

13. The semiconductor device of claim 7, further comprising:

an air gap disposed between the semiconductor blocking film and the gate insulating film between adjacent sheet patterns of the plurality of sheet patterns.

14. The semiconductor device of claim 7, wherein a width of the gate electrode disposed between the lower pattern and the sheet patterns in the first direction is the same as a width of the gate electrode disposed between adjacent sheet patterns of the plurality of sheet patterns in the first direction.

15. The semiconductor device of claim 7, wherein a width of the gate electrode disposed between the lower pattern and the sheet patterns in the first direction is greater than a width of the gate electrode disposed between adjacent sheet patterns of the plurality of sheet patterns in the first direction.

16. The semiconductor device of claim 7, wherein the semiconductor blocking film formed along a side wall of the source/drain recess includes a pinning region, and wherein in the pinning region, a thickness of the semiconductor blocking film decreases and then increases, as the semiconductor blocking film extends away from the lower pattern.

* * * * *